United States Patent [19]
Nakae et al.

[11] Patent Number: 5,816,527
[45] Date of Patent: Oct. 6, 1998

[54] TAPE WINDING APPARATUS AND TAPE WINDING METHOD

[75] Inventors: Shun Nakae, Tokyo; Hideo Kajiyama, Kuki-shi, both of Japan

[73] Assignee: Lintec Corporation, Tokyo, Japan

[21] Appl. No.: 855,932

[22] Filed: May 14, 1997

Related U.S. Application Data

[60] Continuation of Ser. No. 519,747, Aug. 28, 1995, abandoned, which is a division of Ser. No. 301,273, Sep. 6, 1994, abandoned.

[30] Foreign Application Priority Data

| Sep. 7, 1993 | [JP] | Japan | 5-222430 |
| Dec. 28, 1993 | [JP] | Japan | 5-338294 |

[51] Int. Cl.$^6$ .......................... B65H 35/08; B65H 35/04; B26D 7/28; B26D 7/20
[52] U.S. Cl. ................. 242/527; 242/527.4; 83/639.1; 83/658
[58] Field of Search ................ 242/527, 527.4, 242/547, 535, 527.7; 83/639.1, 658, 563, 697

[56] References Cited

U.S. PATENT DOCUMENTS

| 3,163,066 | 12/1964 | Beaulieu et al. | 242/527.2 |
| 4,116,398 | 9/1978 | Roberts | 242/527.7 |
| 4,747,553 | 5/1988 | Ogawa | 242/527 X |

FOREIGN PATENT DOCUMENTS

| 0 484 323A2 | 5/1992 | European Pat. Off. . |
| 63-123746 | 5/1988 | Japan . |
| 63-200993 | 8/1988 | Japan . |
| 4-58599 | 2/1992 | Japan . |
| 4-239416 | 8/1992 | Japan . |
| 4-239417 | 8/1992 | Japan . |
| 4-239418 | 8/1992 | Japan . |
| 486653 | 6/1938 | United Kingdom . |
| 1494998 | 12/1977 | United Kingdom . |
| 1504109 | 3/1978 | United Kingdom . |
| 2137175 | 10/1984 | United Kingdom . |
| 2191170 | 12/1987 | United Kingdom . |

*Primary Examiner*—John Q. Nguyen
*Attorney, Agent, or Firm*—Finnegan, Henderson, Farabow, Garrett & Dunner, L.L.P.

[57] ABSTRACT

To assure that a tape-shaped package is automatically wound around a reel, a tape winding apparatus includes as essential components a reel driving shaft having a reel fitted thereonto, a tape-shaped package guiding slider for guiding the movement of a tape-shaped package from a pair of pinch rollers to the reel driving shaft, slider driving means for displacing the tape-shaped package guiding slider to each of the tape-shaped package receiving position for receiving the foremost end of the tape-shaped package delivered from the pinch rollers, the tape-shaped package delivering position for delivering the foremost end of the tape-shaped package toward the reel, and the tape-shaped package guiding position located between both the foregoing positions for guiding the movement of the tape-shaped package during a winding operation performed for the tape-shaped package by rotating the reel driving shaft, and tape-shaped package foremost end seizing means disposed on the tape-shaped package guiding slider for enabling the foremost end of the tape-shaped package to be seized therewith.

8 Claims, 38 Drawing Sheets

TAPE WINDING APPARATUS AND TAPE WINDING METHOD

This application is a continuation of application Ser. No. 08/519,747, filed Aug. 28, 1995, now abandoned, which is a divisional of application Ser. No. 08/301,273, filed Sep. 6, 1994, abandoned.

BACKGROUND OF THE INVENTION

1. Field of the Invention

The present invention relates to a tape winding apparatus for winding a tape-shaped package around a reel. Further, the present invention relates to a tape winding method to be practiced in association with the foregoing type of tape winding apparatus.

2. Description of the Related Art

In the case that chip-like electronic components such as chip resistors, chip-like miniature mold transistors, chip-like miniature diodes or the like are practically installed on a semiconductor substrate, a hitherto known measure is usually taken such that these chip-like electronic components are taken one by one from a tape-shaped package having them received therein in the equally spaced relationship as seen in the longitudinal direction by actuating a manipulator, and subsequently, they are automatically mounted on the semiconductor substrate at predetermined positions.

Generally, the tape-shaped package is composed of a plurality of pocket portions each having an electronic component received therein as a work, a carrier tape having one or two rows of perforations holes formed thereon in parallel to each other in the equally spaced relationship as seen in the longitudinal direction of the tape-shaped package, and a cover tape thermally fused to the carrier tape for peelably covering the pocket portions therewith. A film molded of a synthetic resin and having a plurality of pocket portions embossed thereon and a cardboard having a plurality of pocket portions punched therefrom are usually used as a carrier tape.

A tape-shaped package is continuously produced by operating a taping machine, and subsequently, it is wound around a reel disposed in a tape winding apparatus after it is cut to assume a predetermined length. The foremost end of the tape-shaped package is inserted into a tape insert slot formed through a hub core of the reel on the inner peripheral side of the tape-shaped package. The carrier tape on the outer peripheral side of the tape-shaped package is cut to have a length shorter than that of the cover tape by a quantity of, e.g., about 200 mm. A part of the cover tape having a length more than that of the carrier tape is used as a leader portion when the tape-shaped package is applied to a mounting machine on a production line. In addition, a measure is taken such that an end tape or an end seal having excellent adhesiveness is firmly connected to the terminal end part of the cover tape to serve as a leader portion in order to prevent the tape-shaped package from being disconnected from the reel in the unwounded state.

For example, a tape-shaped assembly winding method as disclosed in Japanese Patent Application Laying-Open No. 63-123746, a mechanism for forming a leader portion for a taping tape corresponding to the tape-shaped package in the present invention, as disclosed in Japanese Patent Application Laying-Open No. 63-200993, and an automatic chip-type component packaging tape (corresponding to the tape-shaped package in the present invention) winding apparatus as disclosed in Japanese Patent Application Laying-Open No. 4-239418 are hitherto known by experts in the art in association with the tape winding apparatus for winding a tape-shaped package around a reel as mentioned above.

The tape-shaped assembly winding method as disclosed in Japanese Patent Application Laying-Open No. 63-123746 is practiced such that the fore end side of a sleeve-shaped product guide located in a reel, the base end part of the product guide is expanded in the form of a trumpet, a guide portion is interposed between a trumpet-like opening portion of the product guide and a tape cutter, and the fore end part of the tape-shaped assembly cut by a tape cutter is fed into the trumpet-like opening portion of the product guide from a guide portion.

The mechanism for forming a leader portion for a taping tape as disclosed in Japanese Patent Application Laying-Open No. 63-200993 is constructed such that a second cutter section for cutting a carrier tape is disposed downstream of a first cutter section for cutting a tape-shaped package so that a part of the carrier tape downwardly bent after completion of the cutting operation performed for tape-shaped package by the first cutter section is cut by the second cutter section for forming a leader portion composed of a cover tape therewith.

Next, the automatic chip-type component packaging tape winding apparatus as disclosed in Japanese Patent Application Laying-Open No. 4-239418 is constructed such that the foremost end of a movable type guide shoe is displaced in the radial direction of a reel corresponding to a quantity of winding of a chip-type component packaging tape around the reel, a tape guiding portion is interposed between the movable guide shoe and a cutter, and the foremost end of the chip-type component packaging tape is delivered to the base end part of the movable type guide shoe from the tape guide portion.

As is generally known, a tape-shaped package fed from a taping machine has problems that a carrier tape constituting the tape-shaped package is roll set, and moreover, the tape-shaped package itself is undesirably warped due to the thermal strain arising therein after a cover tape is thermally fused to the carrier tape.

In the case that the tape-shaped assembly winding method as disclosed in Japanese Patent Application Laying-Open No. 63-123746 is applied to a tape winding operation, when the foremost end of the tape-shaped assembly is conveyed to the reel side, there is a possibility that the foremost end of the tape-shaped assembly is undesirably disconnected from the guide portion in the course of the conveying operation, resulting in the foremost end of the tape-shaped assembly failing to be introduced into the trumpet-like opening portion of the product guide. Similarly, in the case that the automatic chip-type component packaging tape winding apparatus as disclosed in Japanese Patent Application Laying-Open No. 4-239418 is likewise applied to a tape winding operation, a thrusting roller and a turnable pawl portion are additionally attached to the tape guiding portion in order to prevent the chip-type component packaging tape from falling down from the tape guiding portion. However, once the chip-type component packaging tape is roll set, and moreover, the tip tape is thermally warped due to the inner strain arising therein at the time of a thermal fusing operation, it becomes difficult to reliably deliver the foremost end of the chip-type component packaging tape to the base end part of the movable guide shoe.

As far as the conventional tape winding apparatus as mentioned above is concerned, there often arises an occasion that the position assumed by each of tape insert slots formed through a hub core of the reel largely varies from reel maker to reel maker or the foregoing position slightly varies from reel maker to reel maker. For this reason, an inserting operation for inserting the foremost end of the tape-shaped package into one of tape insert slots should be achieved with an operator's hand. Consequently, an automatic tape winding operation can not continuously be performed with the conventional tape winding operation.

On the other hand, with respect to the mechanism for forming a leader portion for a taping tape as disclosed in Japanese Patent Application Laying-Open No. 63-200993, only the leader portion having a length corresponding to a distance between a pair of cutter portions disposed in the direction of conveyance of the taping tape while extending in parallel with each other can be formed. Thus, when the foregoing mechanism is applied to an actual machine which requires a leader portion having a comparatively long length, there arises a necessity for enlarging the distance between the pair of cutter portions, resulting in the whole structure of the tape winding apparatus being unavoidably designed with large dimensions. Such a malfunction as mentioned above likewise occurs with the automatic chip-type component packaging tape winding apparatus as disclosed in Japanese Patent Application Laying-Open No. 4-239418.

To assure that the leader portion is wound around the reel after it is formed, a measure is taken such that an end seal having excellent adhesiveness is adhesively secured to the terminal end of the leader portion in order to prevent the tape-shaped package from being unwound from the reel. With respect to the conventional automatic chip component packaging tape winding apparatus as mentioned above, since the terminal end of the leader portion is not restrictively held, there is a possibility that when an end seal is adhesively secured to the terminal end of the leader portion, the terminal end of the leader portion is vibratively displaced, causing the end seal to adhere to one of flange portions of the reel.

SUMMARY OF THE INVENTION

The present invention has been made in consideration of the aforementioned background.

A primary object of the present invention is to provide a tape winding apparatus which assures that the foremost end of a tape-shaped package having any roll set or thermal warpage arising in the tape-shaped package during a winding operation performed for the tape-shaped package can reliably be delivered to the interior of a reel, and moreover, assures that the foremost end of the tape-shaped package can automatically be inserted into one of tape insert slots formed through a hub core of each reel molded in conformity with a different dimensional standard.

A secondary object of the present invention is to provide a tape winding apparatus which is simple in structure, and moreover, assures that a leader portion having an arbitrary length can be formed with a tape-shaped package of the foregoing type.

A thirdly object of the present invention is to provide a tape winding method which assures that a leader portion having an arbitrary length can be formed with a tape-shaped package of the foregoing type.

A fourthly object of the present invention is to provide a tape winding apparatus which assures that the terminal end of a leader portion can exactly be wound around a reel together with an end seal usable for a tape-shaped package of the foregoing type.

According to a first aspect of the present invention, there is provided a tape winding apparatus for winding a tape-shaped package around a reel, the tape-shaped package being composed of a carrier tape having a plurality of pocket portions for receiving works therein formed in the equally spaced relationship as seen in the longitudinal direction of the tape-shaped package and a cover tape connected to the carrier tape in the face-to-face relationship for covering the pocket portions therewith, wherein the tape winding apparatus comprises a reel driving shaft having a reel for winding the tape-shaped package therearound detachably fitted thereonto; a pair of pinch rollers for delivering the tape-shaped package toward the reel driving shaft; a tape-shaped package guiding slider for guiding the movement of the tape-shaped package from the pinch roller side to the reel driving shaft side, the tape-shaped package guiding slider being capable of reciprocably moving between the pair of pinch rollers and an empty reel fitted onto the reel driving shaft; slider driving means for driving the tape-shaped package guiding slider to a predetermined stop position; and a tape-shape package foremost end seizing means disposed on the tape-shaped package guiding slider for seizing the foremost end of the tape-shaped package therewith; whereby the predetermined stop position to be assumed by the tape-shaped package guiding slider is one of a tape-shaped package receiving stop position located in the vicinity of the pair of pinch rollers for receiving the foremost end of the tape-shaped package delivered from the pair of pinch rollers, a tape-shaped package delivering stop position located in the vicinity of the reel driving shaft for delivering the foremost end of the tape-shaped package to the empty reel fitted onto the reel driving shaft, and a tape-shaped package guiding stop position located between the tape-shaped package receiving stop position and the tape-shaped package delivering stop position for guiding the movement of the tape-shaped package from the pair of pinch rollers to the reel driving shaft side during a winding operation performed for winding the tape-shaped package around the empty reel by rotating the reel driving shaft.

In the case that the tape winding apparatus is constructed according to the first aspect of the present invention, it is preferable that the tape winding apparatus further includes tape insert slot detecting means for detecting one of tape insert slots formed through a hub core of the reel fitted onto the reel driving shaft so as to allow the foremost end of the tape-shaped package to be inserted thereinto and reel driving shaft controlling means for properly controlling the position where the rotation of the reel driving shaft is to be stopped, so as to allow the tape insert slot to be indexed to a predetermined rotational position on the hub core in response to a detection signal outputted from the tape insert slot detecting means.

According to the first aspect of the present invention, an empty reel is first fitted onto the reel driving shaft, and subsequently, one of the tape insert slots formed through the hub core of the reel is indexed to a predetermined rotational position on the hub core of the reel by activating the reel driving shaft controlling means in response to a detection signal outputted from the insert slot detecting means. On the other hand, as the slider driving means is actuated, the tape-shaped package guiding slider is displaced to the tape-shaped package receiving stop position from which the foremost end of the tape-shaped package is delivered toward the tape-shaped package guiding slider side by the pair of pinch rollers. At this time, the foremost end of the tape-shaped package is seized on the tape-shaped package guiding slider by actuating tape-shaped package foremost end seizing means.

While the foremost end of the tape-shaped package is seized by the tape-shaped package foremost end seizing means, the tape-shaped package guiding slider is displaced to the tape-shaped package delivering stop position by actuating the slider driving means. Subsequently, after the foremost end of the tape-shaped package is released from the seized state attained by the tape-shaped package foremost end seizing means, the foremost end of the tape-shaped package is inserted into one of the tape insert slots formed through the hub core of the reel held in the standby state. In addition, the reel driving shaft is rotated together with the reel in synchronization with the rotation of the pinch rollers at a low speed by several revolutions with the aid of the reel driving shaft controlling means, causing the foremost end of the tape-shaped package to be wound around the reel by several turns. Thereafter, the tape-shaped package guiding slider is escapably displaced to the tape-shaped guiding slider stop position by actuating the slider driving means.

Subsequently, the reel is rotated together with the reel driving shaft at a high speed by activating the reel driving shaft controlling means so that the tape-shaped package is wound around the reel while the movement of the tape-shaped package is properly guided by the tape-shaped package guiding slider.

Therefore, the foremost end of the tape-shaped package can be delivered to the interior of the reel regardless of any roll set or thermal warpage arising on the tape-shaped package during a winding operation performed for the latter. In addition, the foremost end of the tape-shaped package can automatically be inserted into one of the tape insert slots formed through the hub core of each reel molded in conformity of a different dimensional standard.

According to a second aspect of the present invention, there is provided a tape winding apparatus for winding a tape-shaped package around a reel, the tape-shaped package being composed of a carrier tape having a plurality of pocket portions for receiving works therein formed in the equally spaced relationship as seen in the longitudinal direction of the tape-shaped package and a cover tape connected to the carrier tape in the face-to-face relationship for covering the pocket portions therewith, wherein the tape winding apparatus comprises a reel driving shaft having a reel for winding the tape-shaped package therearound detachably fitted thereonto; a pair of pinch rollers for delivering the tape-shaped package toward the reel driving shaft; cover tape sucking means disposed between the pair of pinch rollers and the reel driving shaft for holding the cover tape in the sucked state; a carrier tape cutter disposed on the opposite side relative to the cover tape sucking means with the tape-shaped package interposed therebetween, the carrier tape cutter being reciprocably displaced in the direction toward and away from the tape-shaped package; a tape-shaped package cutter disposed opposite to the carrier tape cutter with the tape-shaped package interposed therebetween, the tape-shaped package cutter being reciprocably displaced in the direction toward and away from the carrier tape cutter; a tape thrusting cylinder disposed sideward of the carrier tape cutter for thrusting the carrier tape toward the tape-shaped package cutter side; and a cutter receiver adapted to be inserted between the carrier tape of the tape-shaped package and the cover tape of the same for cutting the carrier tape by actuating the carrier tape cutter, and moreover, cutting the tape-shaped package by actuating the tape-shaped package cutter.

With the tape winding apparatus constructed according to the second aspect of the present invention, when the tape-shaped package is wound around the reel fitted onto the reel driving shaft by a predetermined length, the rotational speed of the pinch rollers is increased to assume a value higher than that of the reel driving shaft, whereby a part of the tape-shaped package is held in the loosened state between the pinch rollers and the reel fitted onto the reel driving shaft. When the cover tape is sucked by actuating the cover tape sucking means, a gap is formed between the cover tape and the carrier tape. Subsequently, the cutter receiver is inserted into this gap so that the carrier tape interposed between the cutter receiver and the carrier tape cutter is cut by actuating the carrier tape cutter. At this time, since the reel driving shaft is continuously rotated, a part of the cover tape which should serve as a leader portion is wound around the reel.

When the leader portion having a predetermined length is formed with the tape-shaped package, the cutter receiver is escapably retracted, and thereafter, the carrier tape is thrusted toward the tape-shaped package cutter by actuating a tape thrusting cylinder. While the foregoing state is maintained, the cutter receiver is projected so that the cutter receiver and the tape-shaped package cutter face each other with the carrier tape between, and thereafter, the cover tape and the carrier tape located between the tape-shaped package cutter and the cutter receiver are cut by actuating the tape-shaped cutter, resulting in the terminal end of the leader portion to be wound around the reel being formed.

According to a third aspect of the present invention, there is provided a tape winding apparatus for winding a tape-shaped package around a reel, the tape-shaped package being composed of a carrier tape having a plurality of pocket portions for receiving works therein formed in the equally spaced relationship as seen in the longitudinal direction of the tape-shaped package and a cover tape connected to the carrier tape in the face-to-face relationship for covering the pocket portions therewith, wherein the tape winding apparatus comprises a reel driving shaft having a reel for winding the tape-shaped package therearound detachably fitted thereonto; a pair of pinch rollers for delivering the tape-shaped package toward the reel driving shaft; cover tape sucking means disposed between the pair of pinch rollers and the reel driving shaft, the cover tape sucking means being capable of holding the cover tape in the sucked state; a carrier tape cutter disposed on the opposite side relative to the cover tape sucking means with the tape-shaped package interposed therebetween, the carrier tape cutter being reciprocably displaced in the direction toward and away from the tape-shaped package; a cover tape cutter disposed opposite to the carrier tape cutter with the tape-shaped package interposed therebetween, the cover tape cutter being reciprocably displaced in the direction toward and away from the carrier tape cutter; and a cutter receiver adapted to be inserted between the carrier tape of the tape-shaped package and the cover tape of the same for cutting the carrier tape by actuating the carrier tape cutter, and moreover, cutting the cover tape by actuating the cover tape cutter.

In addition, according to a fourth aspect of the present invention, there is provided a tape winding method of winding a tape-shaped package around a reel, the tape-shaped package being composed of a carrier tape having a plurality of pocket portions for receiving works therein formed in the equally spaced relationship as seen in the longitudinal direction of the tape-shaped package and a cover tape connected to the carrier tape in the face-to-face relationship for covering the pocket portions therewith wherein a leader portion composed merely of the cover tape is formed at the terminal end of the tape-shaped package when the latter is wound around the reel, wherein the tape winding method comprises a step of setting a speed of delivering the tape-shaped package to the reel to be higher than a speed of winding the tape-shaped package around the reel; a step of forming a gap between the cover tape and the carrier tape by sucking the cover tape; a step of inserting a cutter receiver into the gap between the cover tape and the carrier tape; a step of cutting the carrier tape by utilizing the cutter receiver; a step of winding the cover tape around the reel by a predetermined length so as to allow a part of the cover tape to serve as a leader portion; and a step of cutting the cover tape together with the carrier tape by utilizing the cutter receiver interposed therebetween.

According to the third aspect and the fourth aspect of the present invention, when a leader portion having a predetermined length is to be formed with a part of the tape-shaped package, the carrier tape cutter and the cover tape cutter are actuated, causing the cover tape and the carrier tape located between these cutters and the cutter receiver to be cut, resulting in the terminal end of the leader portion to be wound around the reel being formed with the tape-shaped package.

Further, according to a fifth aspect of the present invention, there is provided a tape winding apparatus for winding a tape-shaped package and a leader portion around a reel, the tape-shaped package being composed of a carrier tape having a plurality of pocket portions for receiving works therein formed therein in the equally spaced relationship as seen in the longitudinal direction of the tape-shaped package for covering the pocket portions therewith, and the leader portion being connected to the terminal end of the tape-shaped package, wherein the tape winding apparatus comprises a reel driving shaft having a reel for winding the tape-shaped package and the leader portion therearound detachably fitted thereonto; means for connecting an end seal to the terminal end of the leader portion; a turn arm located on the upper side of the reel having the reel driving shaft fitted thereinto, the base end of the turn arm being turnably fitted onto a pivotal shaft extending in parallel with the reel driving shaft; a retaining roller rotatably fitted to the foremost end of the turn arm, the retaining roller coming in rolling contact with the tape-shaped package, the leader portion and the end seal; and sucking means for sucking the leader portion and the end seal, the sucking means being kept open on the reel side of the turn arm.

With the tape winding apparatus constructed according to the fifth aspect of the present invention, the retaining roller is normally biased toward the reel driving shaft side by the dead weight of the turn arm and the retaining roller in such a manner as to turn about the pivotal shaft fitted to the base end of the turn arm, causing the leader portion to be thrusted toward the inside of the reel. At this time, the sucking means is actuated to firmly hold the leader portion by the air suction force without any vibrative movement of the leader portion. Since the end seal adheres to the terminal end of the leader portion with the aid of end seal connecting means while the foregoing state is maintained, the end seal can reliably adhesively be connected to the leader portion or the tape-shaped package wound around the reel.

Additionally, according to the second aspect to the fifth aspect of the present invention, a leader portion having an arbitrary length can be formed with the tape winding apparatus constructed in the above-described manner. Since the tape-shaped package cutter or the cover tape cutter is disposed opposite to the carrier tape cutter with the cutter receiver interposed therebetween, there does not arise a necessity for elongating a conveyance path for the tape-shaped package regardless of the length of the leader portion, resulting in the whole structure of the tape winding apparatus being designed with small dimensions. Further, since the sucking means for sucking the leader portion and the end seal is disposed on the lower surface side of the turn arm adapted to hold the tape retaining roller, causing the leader portion wound around the reel to be retained by the tape retaining roller, the terminal end of the leader portion and the end seal can reliably be wound around the reel.

The above and other objects, features and advantages of the present invention will become apparent from reading of the following description which has been made in conjunction with the accompanying drawings.

BRIEF DESCRIPTION OF THE DRAWINGS

The present invention is illustrated in the following drawings in which.

DETAILED DESCRIPTION OF THE PREFERRED EMBODIMENTS

The present invention will now be described in detail hereinafter with reference to the accompanying drawings which illustrate preferred embodiments thereof.

First, a tape winding apparatus constructed in accordance with an embodiment of the present invention based on a first aspect of the latter will be described in detail below with reference to FIG. 1 to FIG. 26 wherein a tape-shaped package having a plurality of semiconductor chip components received therein is used for the tape winding apparatus.

Figure 1:
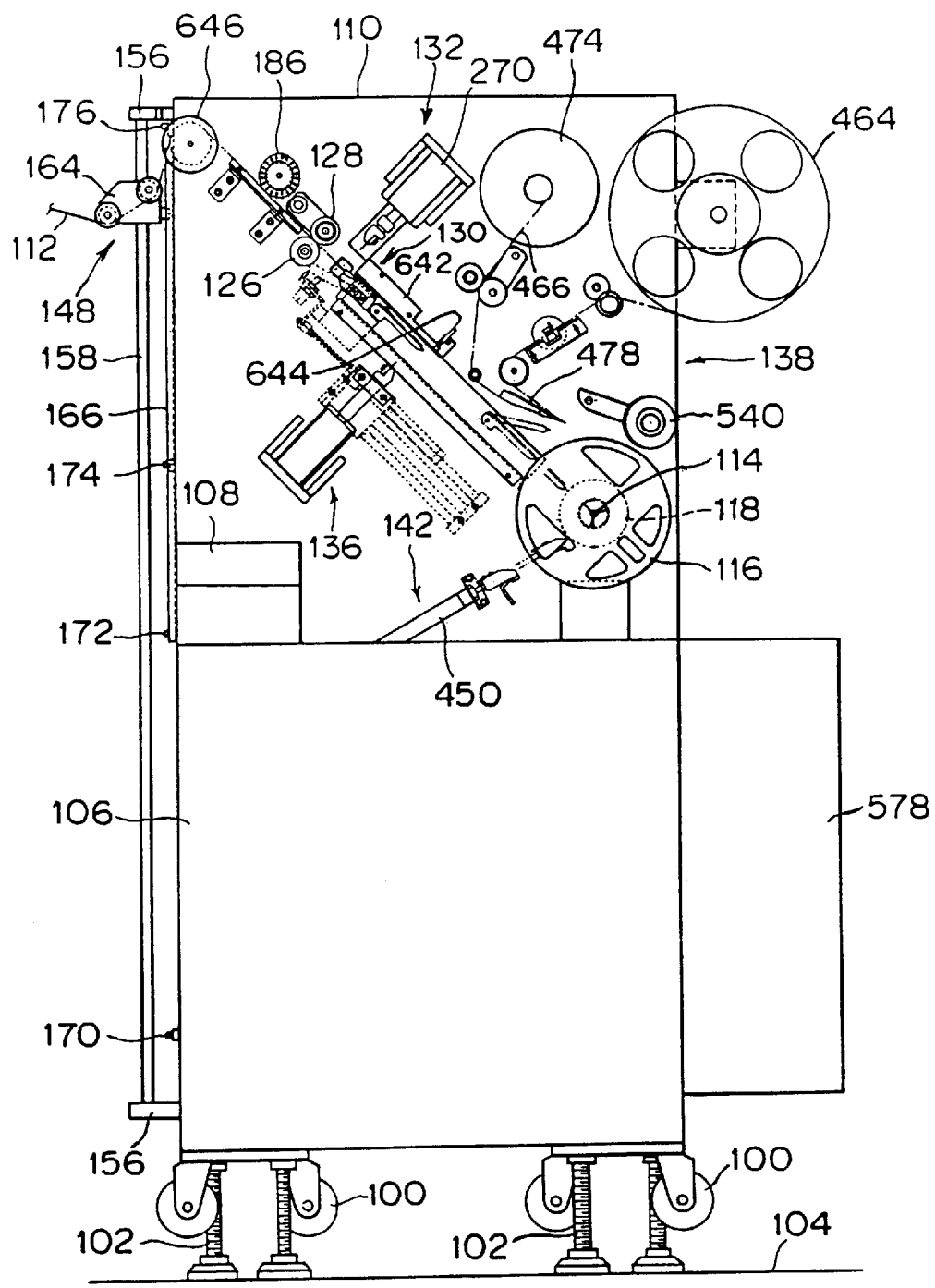
FIG. 1 is a front view of a tape winding apparatus constructed in accordance with an embodiment of the present invention based on a first aspect of the latter.
Figure 2:
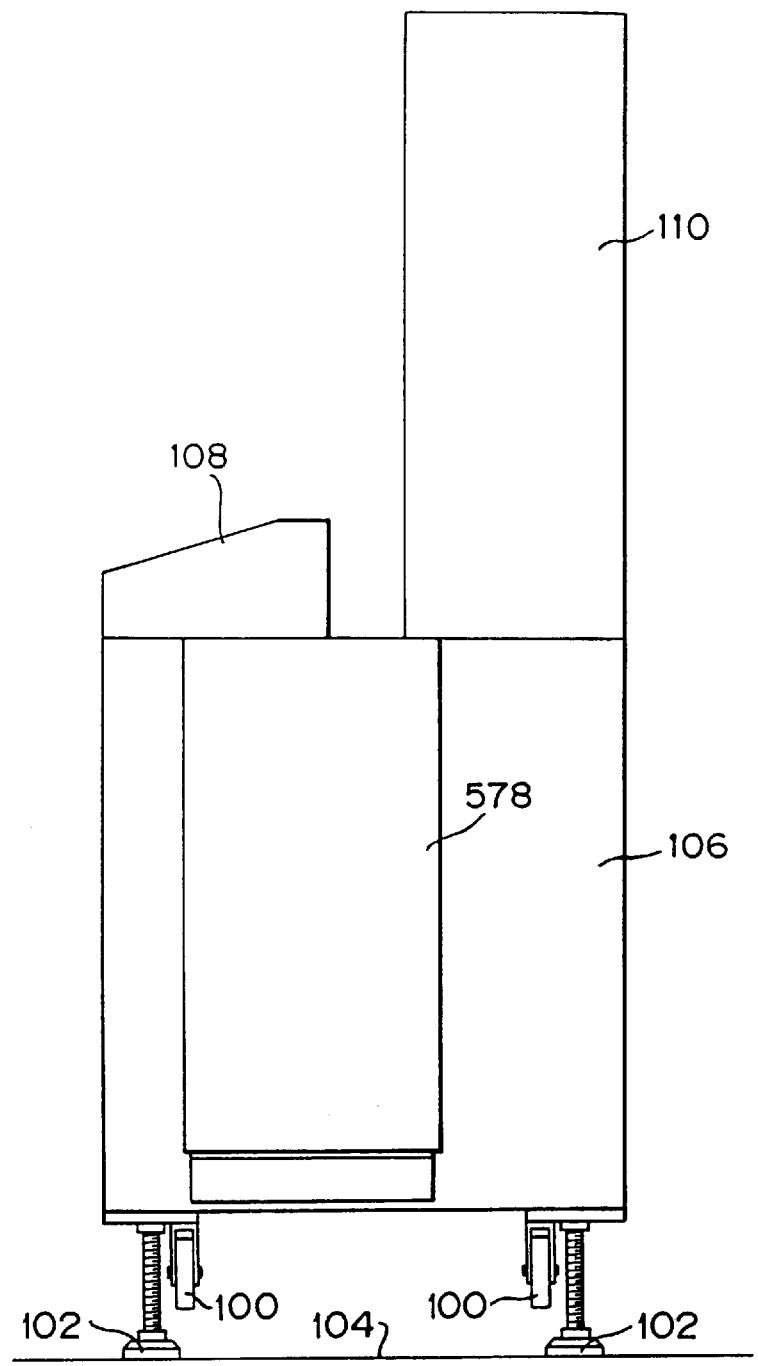
FIG. 2 is a side view of the tape winding apparatus shown in FIG. 1 as seen from the right-hand side of the latter.

As is apparent from FIG. 1 which shows by way of front view the contour of the whole structure of the tape winding apparatus and FIG. 2 which shows by way of side view the contour of the tape winding apparatus as seen from the right-hand side in FIG. 1, the tape winding apparatus includes a lower casing 106 which is mounted on a floor surface 104 with the aid of four expansible/contractible feet 102 each having a caster 100 attached thereto, and a control panel 108 and an upper casing 110 are arranged on the lower casing 106. A start switch, a stop switch, various kinds of alarm lamps, a display unit and a counter (each of which is not shown in the drawings) are arranged on the control panel 108 for properly operating the tape winding apparatus. With this construction, the tape winding apparatus can automatically be operated by actuating these switches with an operator's hand in order to assure that a tape-shaped package 112 fed from a taping machine (not shown) is successively wound around an empty reel 116 fitted onto a reel driving shaft 114.

First, the empty reel 116 is fitted onto the reel driving shaft 114 and one of tape insert slots 120 (see FIG. 18) formed through a hub core 118 of the empty reel 116 is then Indexed to a predetermined position. Subsequently, the foremost end of the tape-shaped package 112 is inserted into the tape insert slot 120 formed through the hub core 118 of the empty reel 116, and the tape-shaped package 112 is then wound around the reel 116 by a predetermined length by rotationally driving the reel driving shaft 114. On completion of the winding operation, a leader portion 122 (see FIG. 3) is formed on the terminal end of the tape-shaped package 112, and after an end seal 124 is adhesively connected to the terminal end of the leader portion 122, the reel 116 is detached from the reel driving shaft 114, and thereafter, a next winding operation is performed again from the beginning.

In this embodiment, to assure that a series of operations as mentioned above are automatically repeated, a pair of pinch rollers 126 and 128 for feeding the foremost end of the tape-shaped package 112 toward the reel driving shaft 114, a tape-shaped package foremost end guiding unit 130 for conducting the tape-shaped package 112 discharged from the pair of pinch rollers 126 and 128 to the empty reel 116 fitted onto the reel driving shaft 114 while seizing the foremost end of the tape-shaped package 112 therewith, a tape-shaped package cutting unit 132 located between the pair of pinch rollers 126 and 128 and the tape-shaped package foremost end guiding unit 130 to cut the tape-shaped package 112 therewith, a carrier tape cutting unit 136 for cutting only a carrier tape 134 of the tape-shaped package 112 to form a leader portion 122 with the cut part of the carrier tape 134, an end seal feeding unit 138 for connecting an end seal 124 to the terminal end of the leader portion 122, a reel attaching/detaching unit 140 for attaching the reel 116 to the reel driving shaft 114 and detaching the former from the latter (see FIG. 17), and a reel chip components unit 142 for indexing one of the tape insert slots 120 formed through the hub core 118 of the reel 116 to a predetermined position are arranged in the upper casing 110. In addition, a reel receiving/delivering unit 144 for delivering an empty reel 116 to the reel driving shaft 114 and receiving the reel 116 having a tape-shaped package 112 wound therearound from the reel driving shaft 114 (see FIG. 23) and a reel delivering/discharging unit 146 for delivering an empty reel 116 to the reel receiving/delivering unit 144 and receiving the reel 116 having a tape-shaped package 112 wound therearound from the reel receiving/delivering unit 144 (see FIG. 24) are firmly arranged in the lower casing 106. Additionally, a dancer unit 148 for temporarily storably holding the fore end side of the tape-shaped package 112 delivered from the taping machine is arranged within the range extending between the upper casing 110 and the lower casing 106.

Figure 3:
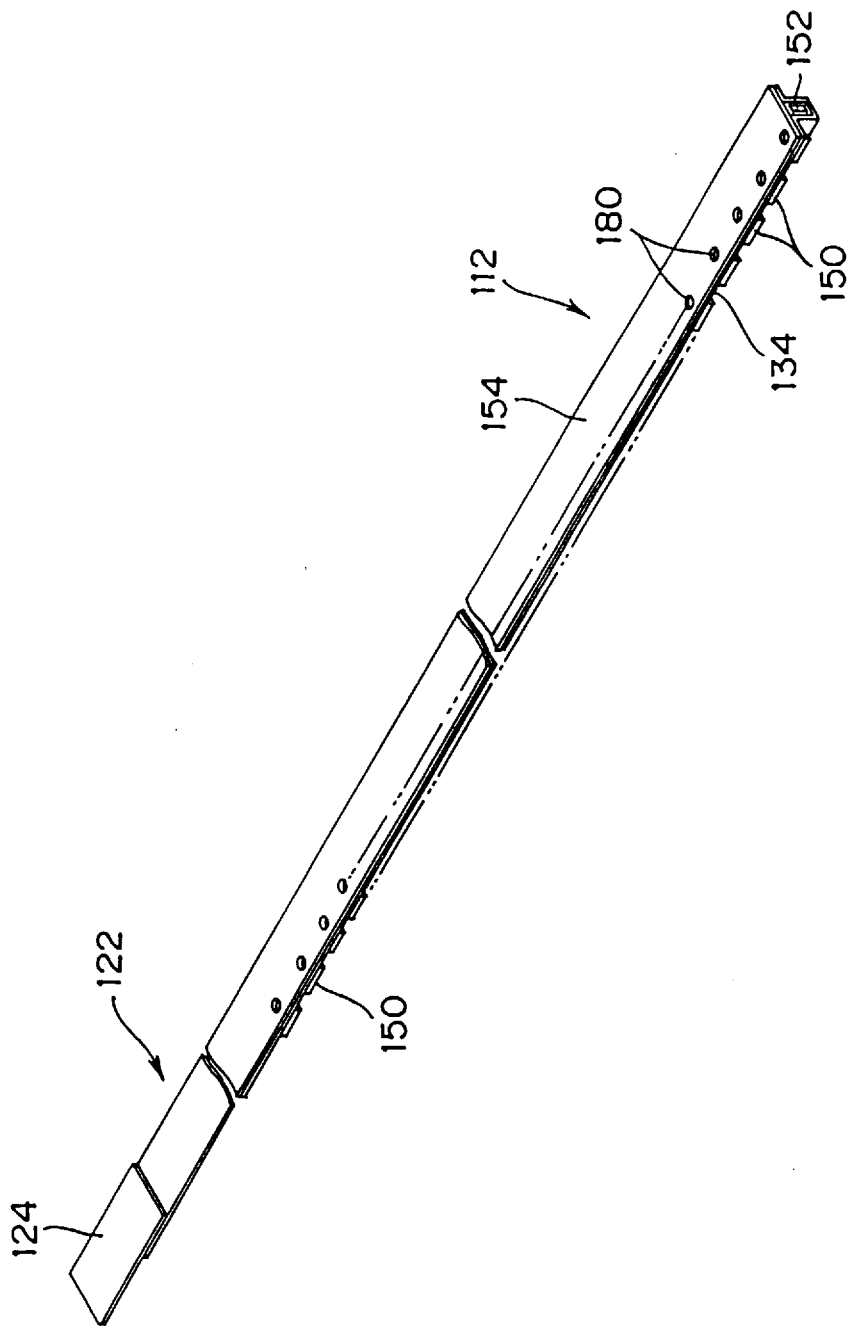
FIG. 3 is a perspective view which schematically shows the contour of a tape-shaped package employable for the tape winding apparatus.

The taping machine installed for producing a tape-shaped package 112 is equipped with a chip component inserting mechanism (not shown) for successively receiving semiconductor chip components 152 in a series of pocket portions 150 formed on a carrier tape 134 one by one and a tape connecting mechanism (not shown) for thermally housing a cover tape 154 to the carrier tape 134 having the semiconductor chip components 152 received in the pocket portions 150 thereof as shown in FIG. 3 which schematically illustrates the structure of the tape-shaped package 112. The chip component inserting mechanism is constructed such that semiconductor chip components 152 are received in the pocket portions 150 on the carrier tape 134, and after a predetermined number of semiconductor chip components 152 are successively received in the pocket portions 150, a predetermined number of empty pocket portions 150 having no semiconductor chip components received therein are formed on the carrier tape 134. In addition, the tape connecting mechanism is constructed such that the cover tape 154 is thermally fused to a part of the carrier tape 134 having semiconductor chip components 152 received in the pocket portions 150 thereof and a part of the cover tape 154 is used as a leader portion 122 by forming a non-fusing part on the cover tape 154 without any thermal fusion of the latter to the empty pocket portions 150.

Figure 4:
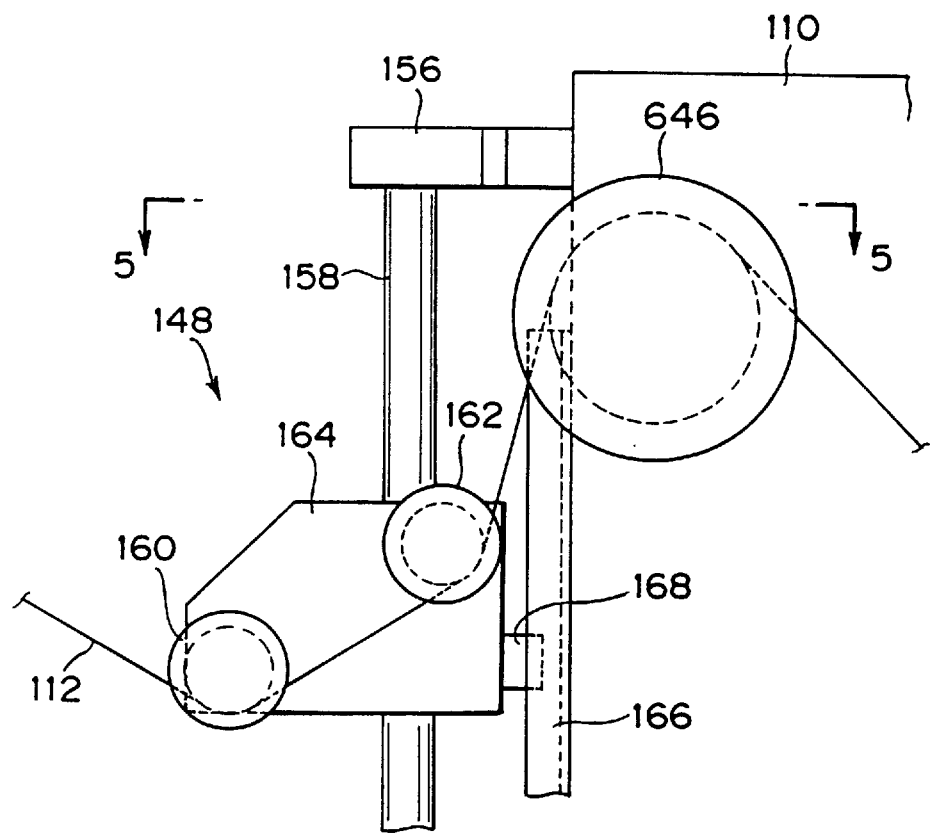
FIG. 4 is a fragmentary enlarged front view of a dancer unit arranged for the tape winding apparatus.
Figure 5:
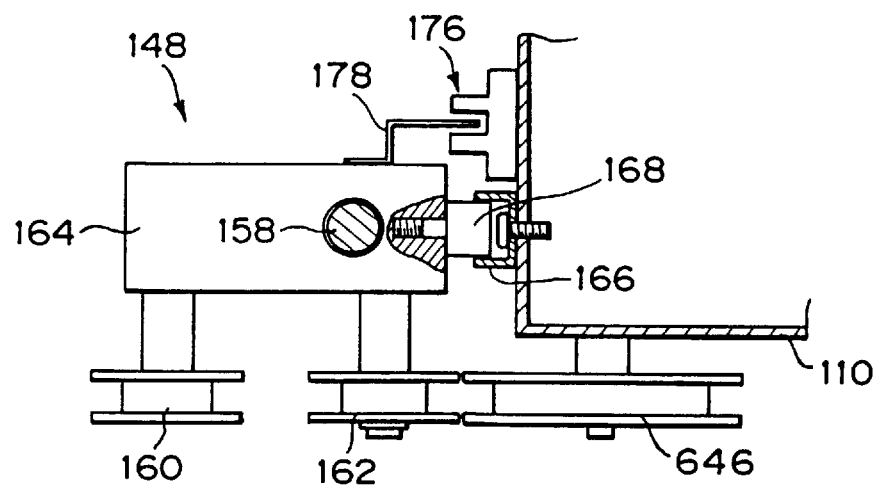
FIG. 5 is a sectional view of the dancer unit taken along line 5—5 in FIG. 4.

As shown in FIG. 1, FIG. 4 that is a fragmentary enlarged front view of the dancer unit 148 and FIG. 5 that is a sectional view of the dancer unit 148 taken along line 5—5 in FIG. 4, a slider 164 having two tape guide rollers 160 and 162 rotatably held thereon to rotate about their horizontal shafts is slidably fitted onto a guide rod 158 supported by a pair of upper and lower rod holders 156 fixedly secured to the side wall portion of the upper casing 110 at the upper end of the latter as well as the side wall portion of the lower casing 106 at the lower end of the latter in such a manner as to allow the slider 164 to be slidably raised up and lowered along the guide rod 158 in the upward/downward direction. To prevent the slider 164 from being turned in the horizontal direction, a slide turning movement preventive pin 168 threadably fixed to the slider 164 is slidably received in the substantially U-shaped groove of a slider turning movement preventive member 166 firmly secured to the upper casing 110 and the lower casing 106 while extending in parallel with the guide rod 158 in the spaced relationship.

In addition, as shown in FIG. 1, four slider position detecting sensors 170, 172, 174 and 176 located in the order as seen from below are disposed sideward of the slider turning movement preventive member 166 corresponding to a highest winding speed, a high winding speed, a low winding speed and a lowest winding speed, and the base end of a dog plate 178 adapted to cooperate with the slider position detecting sensors 170, 172, 174 and 176 is fixedly secured to the slider 164. In response to a detection signal outputted from each of the slider position detecting sensors 170, 172, 174 and 176, the winding speed of the tape-shaped package 112 set by the reel driving shaft 114 is automatically changed by controlling unit (not shown).

Specifically, in the case that the slider position detecting sensor 170 detects the position of the slider 164 corresponding to a highest winding speed, the winding speed of the tape-shaped package 112 is increased to reach a preliminarily determined highest speed, causing the position of the slider 164 to be quickly raised up. In addition, in the case that the slider position detecting sensor 172 detects the position of the slider 164 corresponding to a high winding speed, the winding speed of the tape-shaped package 112 is increased to reach a preliminarily determined high speed, causing the position of the slider 164 to be correspondingly raised up. Additionally, in the case that the slider position detecting sensor 174 detects the position of the slider 164 corresponding to a low winding speed, the winding speed of the tape-shaped package 112 is reduced to assume a preliminarily determined low speed, causing the position of the slider 164 to be correspondingly lowered. Further, in the case that the slider position detecting sensor 176 detects the position of the slider 164 corresponding to a lowest winding speed, the winding speed of the tape-shaped package 112 is reduced to assume a preliminarily determined lowest speed, causing the position of the slider 164 to be quickly lowered.

Figure 6:
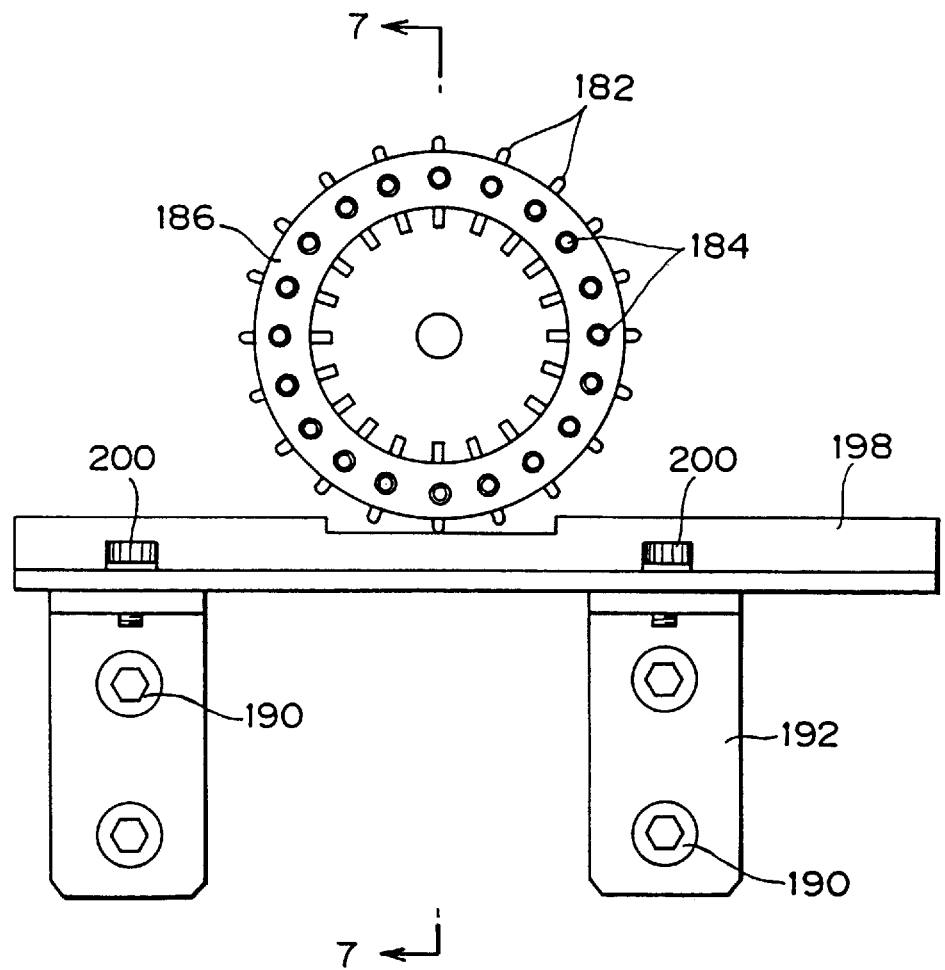
FIG. 6 is an enlarged front view of a pin roller section arranged for the tape winding apparatus.
Figure 7:
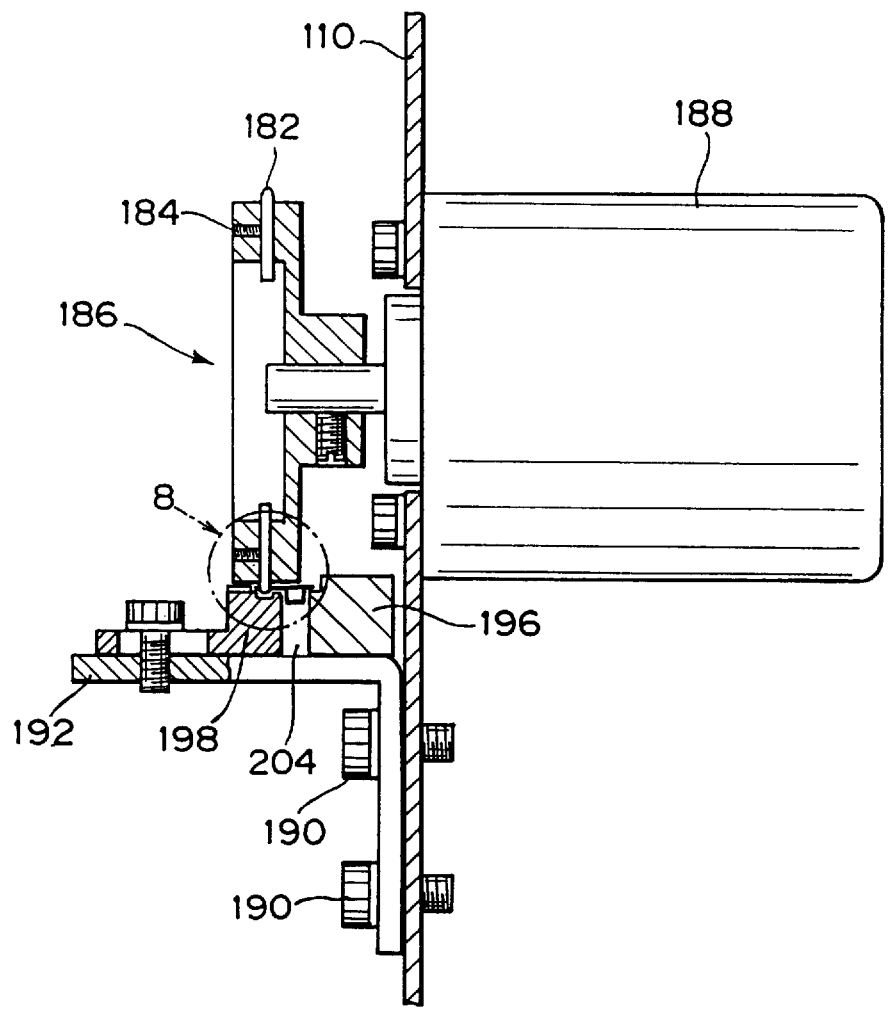
FIG. 7 is a sectional view of the pin roller section taken along line 7—7 in FIG. 6.
Figure 8:
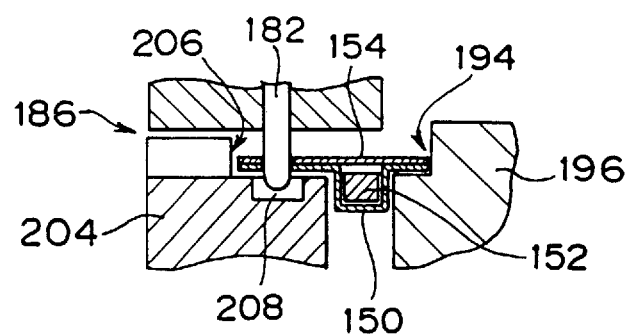
FIG. 8 is a fragmentary enlarged sectional view of the pin roller section represented by an arrow-shaped mark of 8 in FIG. 7.

As shown in FIG. 1, FIG. 4, FIG. 5, FIG. 6 that is an enlarged front view of a pin roller 186 arranged at the left upper end part of the upper casing 110, FIG. 7 that is an enlarged sectional view of the pin roller 186 taken along line 7—7 in FIG. 6 and FIG. 8 that is an enlarged sectional view of a section represented by an arrow-shaped mark of 8 in FIG. 7, the pin roller 186 is disposed slantwise downward of a tape-shaped package introduction pulley 646 which is rotatably disposed at the left uppermost end of the upper casing 110, and a number of pins 182 arranged in the equally spaced relationship as seen in the circumferential direction of the pin roller 186 so as to be brought in meshing engagement with a plurality of perforation holes 180 formed through the tape-shaped package 112 (see FIG. 3) are radially protected from the pin roller 186 with the aid of a plurality of set screws 184. In addition, a rotary encoder 188 is disposed integral with the pin roller 186 in the coaxial relationship relative to the latter in order to detect the length of passage of the tape-shaped package 112 past the pin roller 182, i.e., the length of the tape-shaped package 112 wound around the reel 116.

In this embodiment, the pins 186 on the pin roller 186 are brought in meshing engagement with the perforation holes 180 formed through the tape-shaped package 112 in the equally spaced relationship in order to detect the length of passage of the tape-shaped package 112 by utilizing the followable rotary movement of the pin roller 186 caused as the tape-shaped package 112 moves in the forward direction. Alternatively, a pair of light permeation type optical sensors having the perforation holes 180 interposed therebetween may be substituted for the pin roller 186. In this case, the length of passage of the tape-shaped package 112 is detected by counting a series of pulse-like detection signals each outputted every time the optical sensors detect one perforation hole 180 without any necessity for coming in contact with the perforation hole 180.

To assure that the tape-shaped package 112 is properly conducted from the package introduction pulley 646 to a pair of pinch rollers 126 and 128 to be described later, a stationary guide member 196 having a guide portion 194 formed thereon to slidably hold the right-hand end of the tape-shaped package 112 therewith and a movable guide member 98 capable of moving toward or away from the stationary guide member 196 (i.e., in the rightward/leftward direction as seen in FIG. 7) corresponding to the width of the tape-shaped package 112 are mounted on an inverted L-shaped bracket 192 fixedly secured to the upper casing 110 by using bolts 190.

Figure 9:
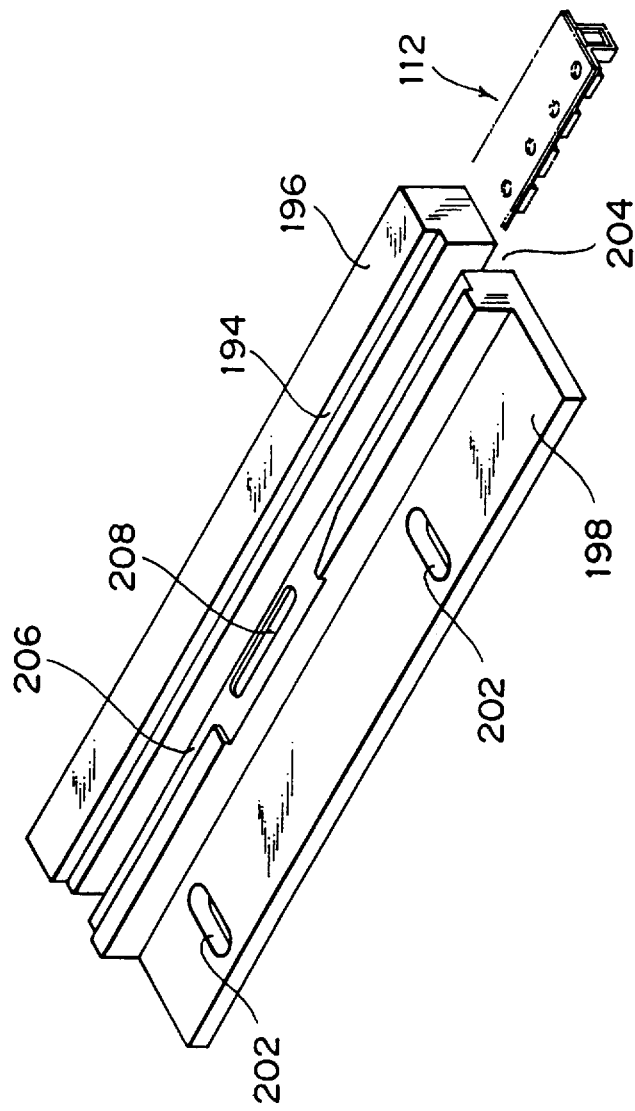
FIG. 9 is a perspective view of a guide member arranged for the tape winding apparatus.

As is apparent from FIG. 9 which shows by way of perspective view the appearance of both the guide members 196 and 198, to assure that the movable guide member 198 can be displaced toward or away from the stationary guide member 196 with the aid of two bolts 200 threadably fitted to the bracket 192, a pair of elongated holes 202 are formed through the movable guide member 198 so as to allow a series of pocket portions 150 on the tape-shaped package 112 to move past a gap 204 formed between the stationary guide member 196 and the movable guide member 198. A relief groove 208 is formed at the central part of a guide portion 206 of the movable guide member 198 usable for slidably holding the left-hand end of the tape-shaped package 112 in order to allow the pins 182 on the pin roller 186 to be successively received in the relief groove 208. With this construction, when the tape-shaped package 112 moves between the pin roller 186 and both the guide members 196 and 198, the fore end part of each pin 182 on the pin roller 186 is fitted into one perforation hole 180 formed through the tape-shaped package 112, whereby as the tape-shaped package 112 moves in the forward direction, the pin roller 186 is followably rotated so as to enable a quantity of movement of the tape-shaped package 112 to be detected by the rotary encoder 188.

Figure 10:
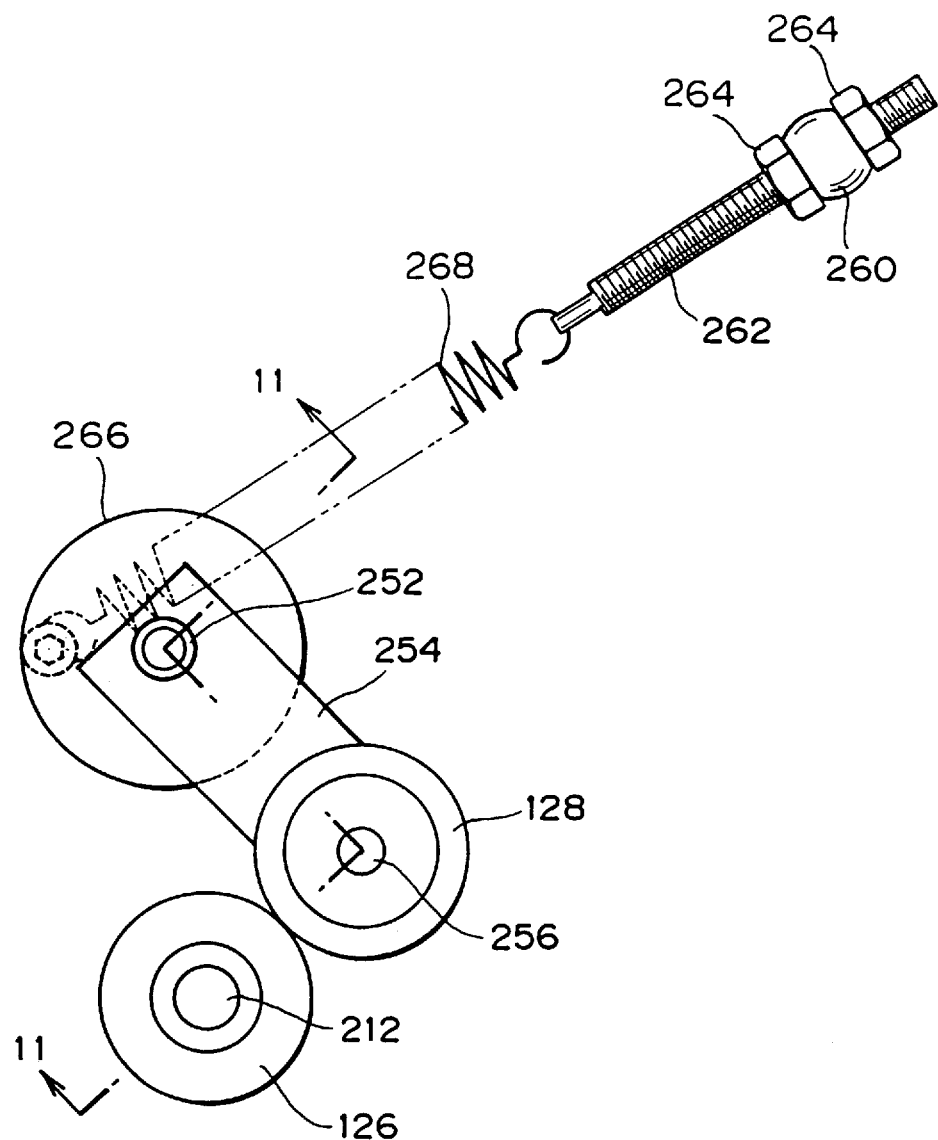
FIG. 10 is an enlarged front view of a pinch roller section arranged for the tape winding apparatus.
Figure 11:
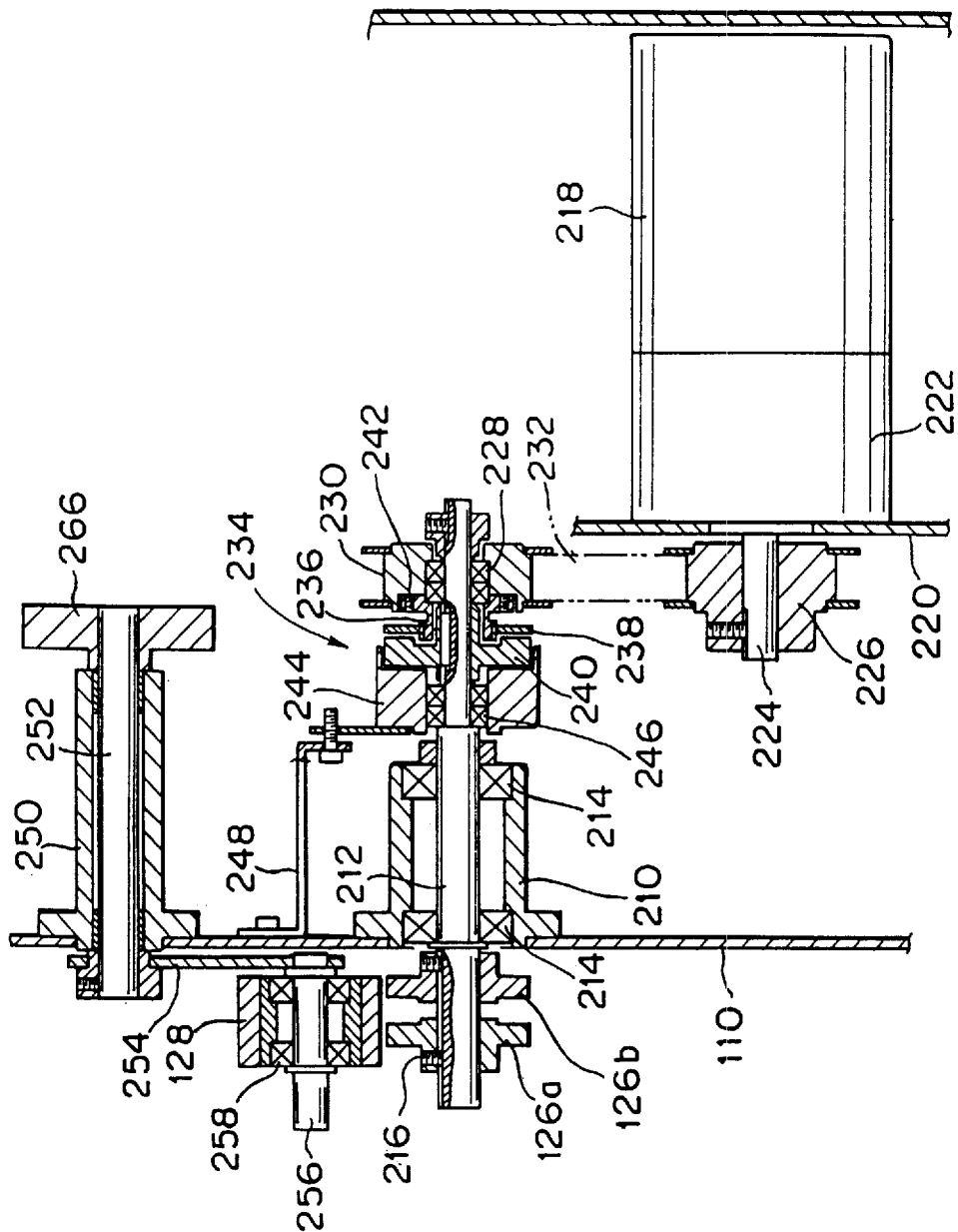
FIG. 11 is a sectional view of the pinch roller section taken along line 11—11 in FIG. 10.

As is apparent from FIG. 10 that is an enlarged front view of a pair of pinch rollers 126 and 128 and FIG. 11 that is a sectional view of the pinch rollers 126 and 128 taken along line 11—11 in FIG. 10, a pinch roller driving shaft 212, of which fore end part is projected outside of the upper casing 110, is rotatably supported by a pair of bearings 214 in a cylindrical holder 210 fixedly secured to the rear surface of the upper casing 110. A pair of driving pinch rollers 126a and 126b adapted to hold the opposite sides of the tape-shaped package 112 with the pocket portion 150 on the tape-shaped package 112 interposed therebetween are fitted onto the fore end part of the pinch roller driving shaft 212, and the driving pinch roller 126a located outside of the driving pinch roller 126b can immovably be held on the pinch roller driving shaft 212 at an arbitrary position determined corresponding to the width of the tape-shaped package 112 as seen in the longitudinal direction of the pinch roller driving shaft 212 by tightening a set screw 216. A pinch roller driving motor 218 for rotationally driving the pinch roller driving shaft 212 is attached to a frame 220 in the upper casing 110 via a speed reducing unit 222, and an endless toothed belt 232 is bridged between a driving gear 226 integrated with an output shaft 224 of the speed reducing unit 222 and an idling gear 230 rotatably fitted onto the pinch roller driving shaft 212 via bearings 228 while extending around the driving gear 226 and the idling gear 230.

An electromagnet clutch 234 is interposed between the idling gear 230 and the upper casing 110. In this embodiment, the electromagnetic clutch 234 is substantially composed of a spline sleeve 236 integrated with the idling gear 230, an armature 238 slidably fitted onto the spline sleeve 236 to slidably move on the latter, a frictional plate 240 integrally fitted onto the pinch roller shaft 212, a compression coil spring 242 interposed between the spline sleeve 236 and the armature 238 for normally biasing the armature 238 toward the frictional plate 240, and a coil block 244 for magnetizing the frictional plate 240 for biasing the armature 238 toward the idling gear 230 by the magnetic force against the resilient force of the compression coil spring 242. The coil block 244 having the pinch roller driving shaft 212 surrounded thereby with bearings 246 interposed therebetween is held by a coil holder 248 fixedly secured to the upper casing 110 at the left-hand end thereof.

Thus, when the coil block 244 is turned off, the armature 238 is thrusted against the frictional plate 240 by the resilient force of the compression coil spring 242 so that the rotational force of the pinch roller driving motor 218 is transmitted from the frictional plate 240 to the pinch roller driving shaft 212 by the frictional force arising between the armature 238 and the frictional plate 240, via the endless toothed belt 232, the spline sleeve 236 integrated with the idling gear 230 and the armature 238. On the contrary, when the coil block 244 is turned on, the armature 238 is parted away from the frictional plate 240 by the magnetic force generated by the coil block 244 against the resilient force of the compression coil spring 242. Thus, the rotational force of the pinch roller driving motor 218 is transmitted only to the spline sleeve 236 integrated with the idling gear 230 and the armature 238 via the endless toothed belt 232, resulting in the spline sleeve 236 and the armature 238 being idly rotated relative to the pinch roller driving shaft 212.

The electromagnetic clutch 234 is held in the inoperative state that it is turned off until the foremost end of the tape-shaped package 112 is seized by the tape-shaped package foremost end guiding unit 130 located at the position where the receipt of the package to be described later is stopped. In addition, the electromagnetic clutch 234 is held also in the inoperative state that it is turned off when the reel driving shaft 114 is rotated at a low speed so as to allow the fore end part of the tape-shaped package 112 to be wound around the hub core 118 of the reel 116 while the package foremost end guiding unit 130 is located at the position where the delivery of the tape-shaped package is stopped. While the foregoing state is maintained, the rotational force of the pinch roller driving motor 218 is transmitted to the pinch roller 126a. However, the electromagnetic clutch 234 is held in the operative state that it is turned on for a period of time other than the aforementioned one.

On the other hand, a turn shaft holding sleeve 250 is fixedly secured to the upper casing 110 in the vicinity of a bearing holder 210 so that a turn shaft 252 extending through the upper casing 110 in parallel with the pinch roller driving shaft 212 is rotatably supported in the turn shaft holding sleeve 250. The upper end part of a turn arm 254 is firmly fitted onto the turn shaft 252 at the left-hand end of the latter as seen in FIG. 11, and a roller holding shaft 256 is projected from the lower end part of the turn arm 254 in parallel with the pinch roller driving shaft 212. An idling pinch roller 128 is rotatably supported on the roller holding shaft 256 while facing to the pair of driving pinch rollers 126a and 126b with the tape-shaped package 112 interposed therebetween in the clamped state. A tension pin 260 is projected from the rear surface of the upper casing 110 at the position above the turn shaft 252, and an adjustment screw shaft 262 is threadably inserted through the tension pin 260 with a pair of lock nuts 264 located on the opposite sides of the tension pin 260. As the lock nuts 264 are threadably tightened from the opposite sides of the tension pin 260, the tension pin 260 is immovably held on the adjustment screw shaft 262 while building an integral structure with the adjustment screw shaft 262. A tension coil spring 268 is bridged between the left-hand end of the adjustment screw shaft 262 and a circular disc-shaped tension ring 266 immovably fitted onto the turn shaft 252 at the left-hand end of the latter in order to normally bias the idling pinch roller 128 toward the driving pinch rollers 126a and 126b.

With this construction, the idling pinch roller 128 is normally biased toward the driving pinch rollers 126a and 126b by the resilient force of the tension coil spring 268, whereby as the driving pinch rollers 126a and 126b are rotationally driven, the tape-shaped package 112 held between both the driving pinch rollers 126a and 126b in the clamped state is slantwise downward conveyed in the rightward direction as seen in FIG. 1. It is obvious that the resilient force of the tension coil spring 268 can arbitrarily be changed by adequately adjusting the position where the lock nuts 264 are threadably fitted onto the adjustment screw shaft 262.

Figure 12:
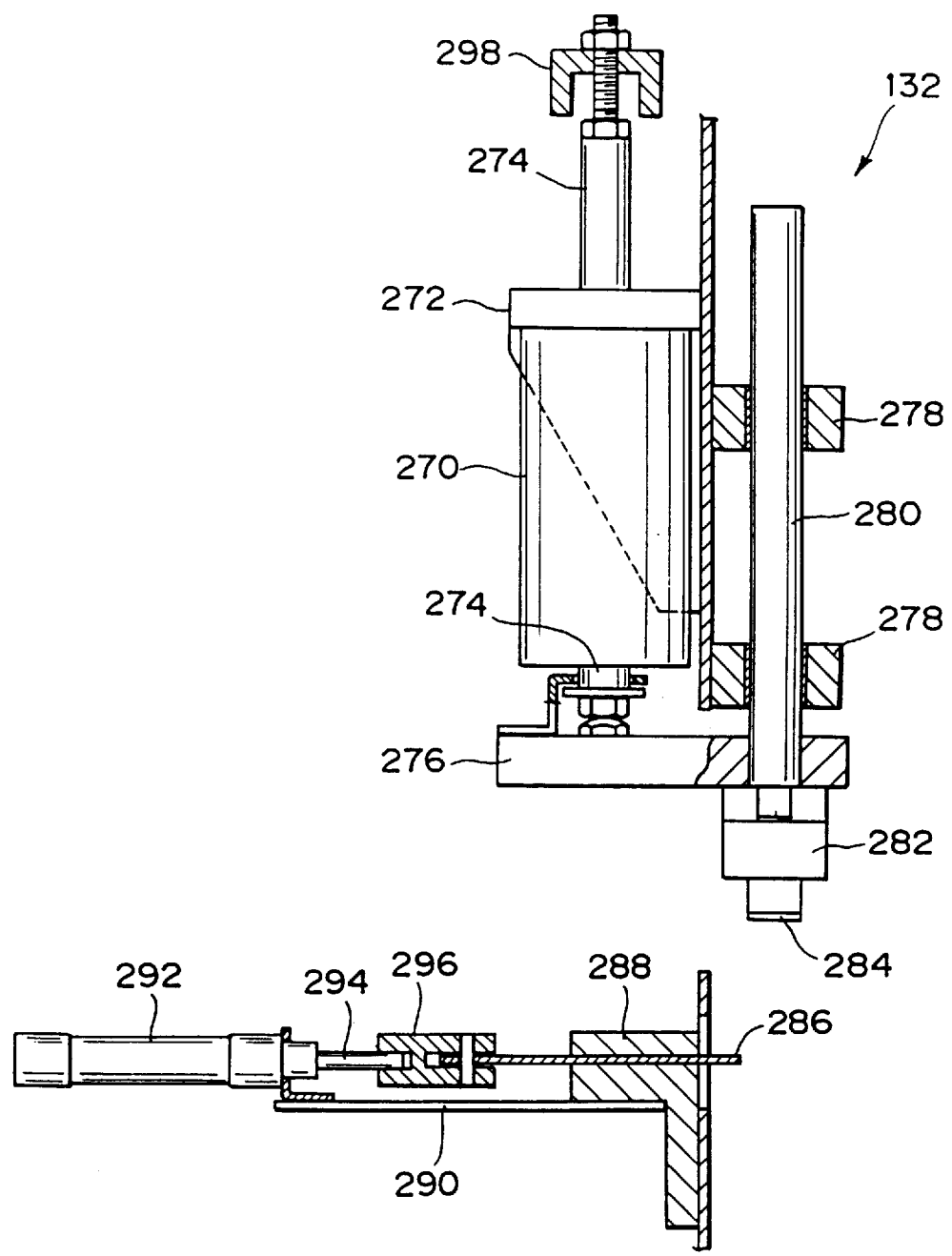
FIG. 12 is an enlarged sectional view of a tape-shaped package cutting unit arranged for the tape winding apparatus.

A tape-shaped package cutting unit 132 is arranged at the position slantwise downward of the pair of pinch rollers 126 and 128. FIG. 12 shows by way of an enlarged sectional view the structure of the package cutting unit 132.

Figure 13:
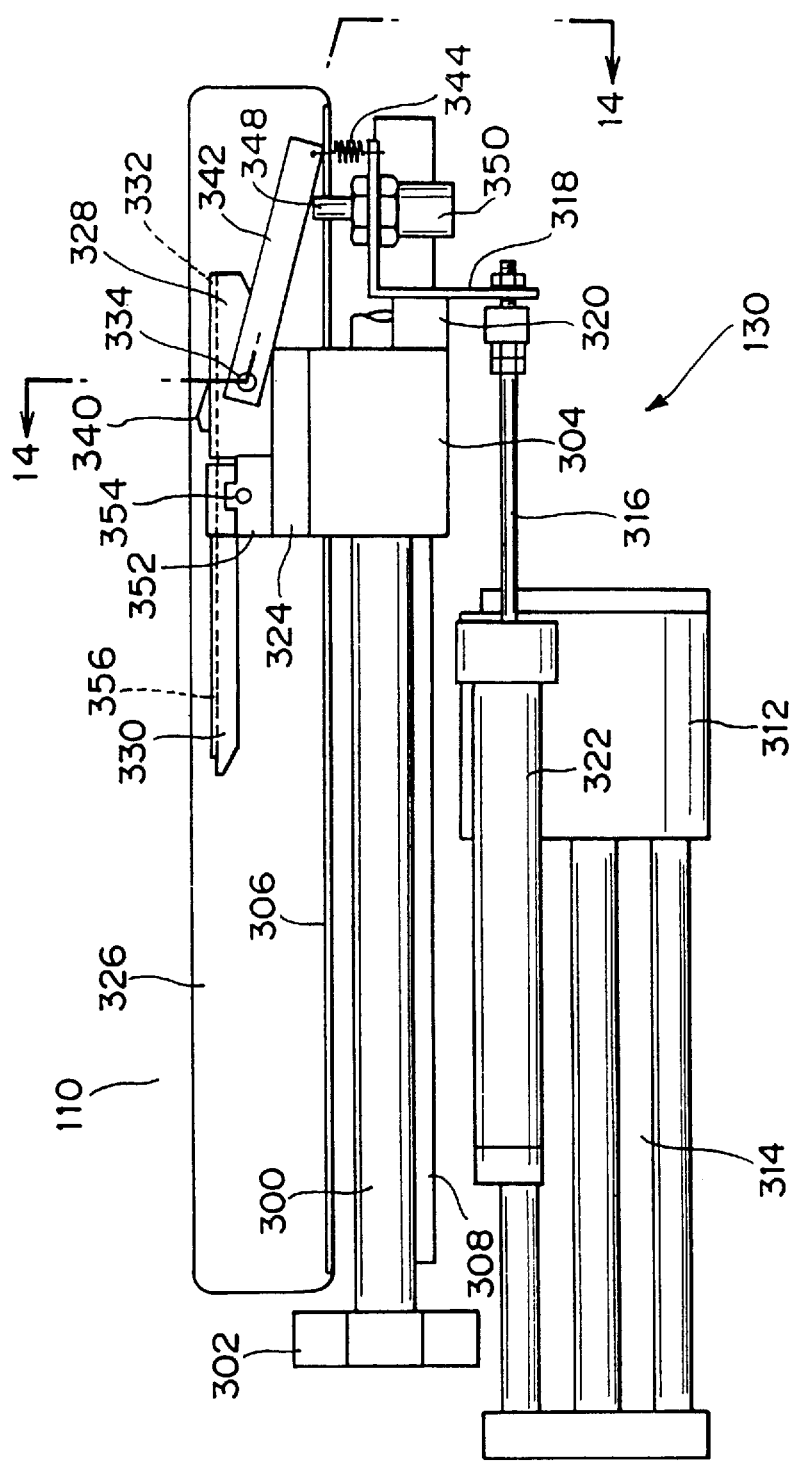
FIG. 13 is an enlarged rear view of a tape-shaped package foremost end guiding unit arranged for the tape winding apparatus as seen from the inside of an upper casing of the tape winding apparatus.

Specifically, a knife driving air cylinder 270 is arranged on the rear surface of the upper casing 110 via a bracket 272 fastened to the latter with a downward attitude, and the left-hand end part of a rod holder 276 extending through the upper casing 110 is connected to the lower end of a piston rod 274 extending through the knife driving air cylinder 270. In addition, the lower end of a cutter rod 280 slidably held by a pair of guide bushes 278 fastened to the front surface of the upper casing 110 is firmly connected to the right-hand end part of the rod holder 276. A cutter holder 282 is secured to the lower end of the cutter rod 280, and a cutter knife 284 is firmly attached to the cutter holder 282 in order to cut the tape-shaped package 112 therewith. A plate-shaped knife receiver 286 adapted to be projected from the rear side of the upper casing 110 is slidably held relative to a knife receiver holder 288 fastened to the rear surface of the upper casing 110 directly below the cutter knife 284 in such a manner as to slidably move in the normal direction relative to the upper casing 110 (i.e., in the rightward/leftward direction as seen in FIG. 13). The foremost end of a piston rod 294 projected from the holder driving cylinder 292 fixedly secured to the rear surface of the upper casing 110 via a bracket 290 is connected to the left-hand end of the knife receiver holder 288 via a connecting member 296. In operation, before the piston rod 274 of the knife driving air cylinder 270 is lowered, the piston rod 294 of the holder driving cylinder 292 is displaced in the forward direction, causing the fore end part of the knife receiver holder 288 to be projected directly below the carrier tape 134 of the tape-shaped package 112 in order to receive the thrusting force of the cutter knife 284.

On the other hand, to damp the shock caused when the tape-shaped package 112 is cut by the cutter knife 284, a damper ring 298 having a substantially U-shaped sectional shape is attached to the upper end of the piston rod 274 of the knife driving air cylinder 270. In this connection, the lower end part of the damper ring 298 adapted to collide against the upper surface of the bracket 272 is molded of an elastic material such as a rubber or the like. The tape-shaped package cutting unit 132 is actuated when it is detected by the rotary encoder 188 that the tape-shaped package 112 is wound around the reel 116 by a predetermined length. At this time, the reel driving shaft 114 is held in the temporarily stopped state.

It should be noted that any hitherto known structure other than that described above may be employed for the package cutting unit 132.

Figure 14:
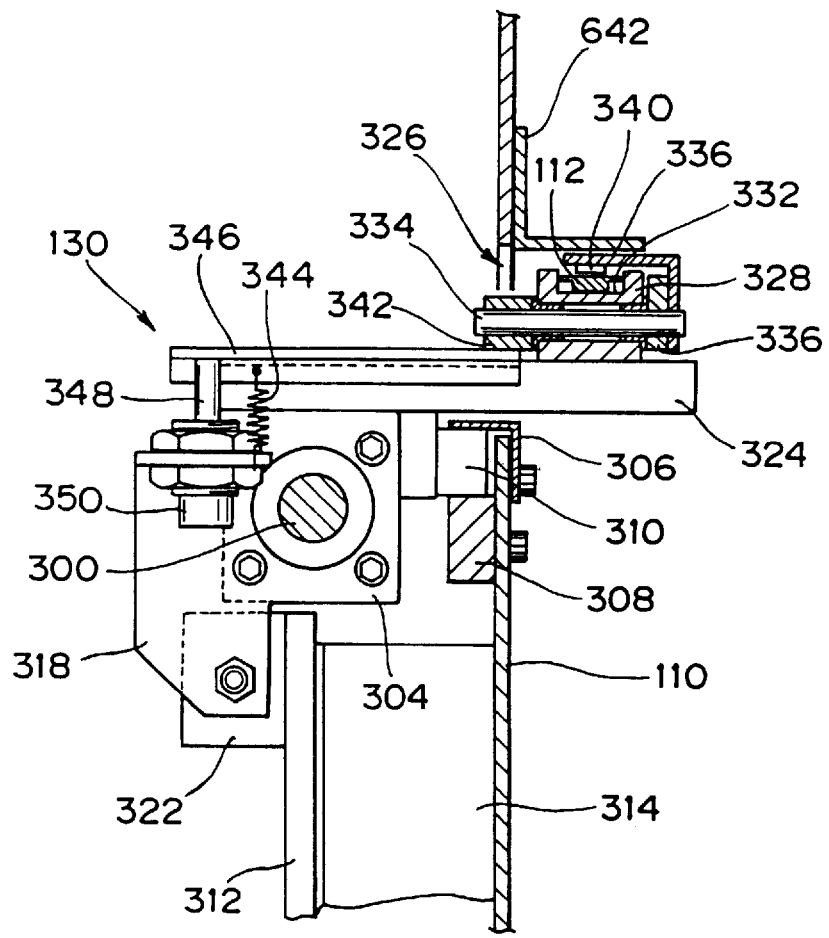
FIG. 14 is a sectional view of the tape-shaped package foremost end guiding unit taken along line 14—14 in FIG. 13.
Figure 15:
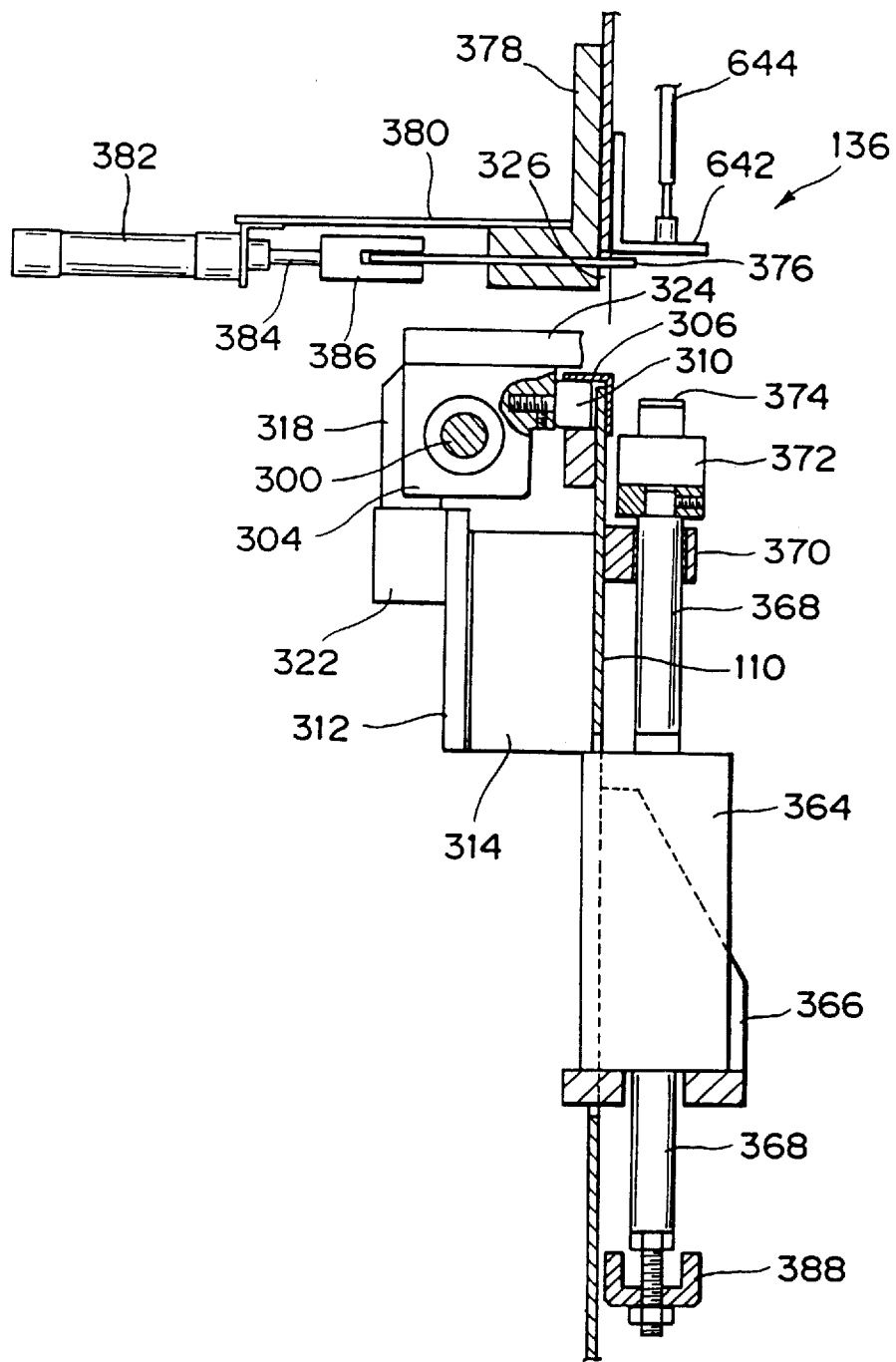
FIG. 15 is an enlarged sectional view of a carrier tape cutting unit arranged for the tape winding apparatus.

FIG. 13 schematically shows by way of rear view the structure of a tape-shaped package foremost end guiding unit 130 for conducting the tape-shaped package 112 discharged from the pair of pinch rollers 126 and 128 to the empty reel 116 fitted onto the reel driving shaft 114 while the foremost end of the tape-shaped package 112 is seized by the guiding unit 130, FIG. 14 shows by way of sectional view the structure of the tape-shaped package foremost end guiding unit 130 taken along line 14—14 in FIG. 13, and FIG. 15 shows by way of sectional view the structure of a carrier tape cutting unit 136.

The opposite ends of a slider guide shaft 300 extending in the direction in parallel with a line segment between the pair of pinch rollers 126 and 128 and the reel driving shaft 114 are held on the upper casing 110 within the range between the pair of pinch rollers 126 and 128 and the reel driving shaft 114 with the aid of a bracket 302, and a slidable pin 310 slidably received between a guide block 308 and an upper guide member 306 having an inverted L-shaped sectional contour and fixedly secured to the upper casing 110 in parallel with the slider guide shaft 300 is firmly secured to a slider base 304 slidably fitted onto the slider guide shaft 300 to slidably move along the latter by tightening screws.

An air cylinder 322 includes a piston rod 316 of which foremost end is operatively connected to the slider base 304 via a bracket 318 and a connecting member 320. To assure that a slide member 312 of a rodless cylinder 314 fixedly secured to the upper casing 110 can reciprocably move in the direction in parallel with the slide guide shaft 300, the air cylinder 322 is firmly secured to the sliding member 312. Three stop positions, i.e., a tape-shaped package receiving stop position located in the vicinity of the pinch rollers 126 and 128 to receive the fore end part of the tape-shaped package 112 delivered from the pinch rollers 126 and 128, a tape-shaped package delivering stop position located in the vicinity of the reel driving shaft 114 to deliver the fore end part of the tape-shaped package 112 to the reel 116 fitted onto the reel driving shaft 114, and a tape-shaped package guiding stop position located between the tape-shaped package receiving stop position and the tape-shaped package delivering stop position for guiding the movement of the tape-shaped package 112 from the pair of pinch rollers 126 and 128 to the reel driving shaft 114 in the course of a winding operation for winding the tape-shaped package 112 around the reel 116 are determined by combining the opposite end positions of reciprocable movement of the sliding member 312 of the rodless cylinder 314 with the opposite end positions of reciprocable movement of the piston rod 316 of the air cylinder 322.

A slider 324 having the slider base 304 firmly secured to the lower surface thereof is projected outside of an opening portion 326 formed through the upper casing 110 in parallel with the slider guide shaft 300 so that a tape-shaped package introduction block 328 and a tape-shaped package guide arm 330 are mounted on the fore end part of the slider 324.

The tape-shaped package introduction block 328 having a tape-shaped package guide groove 332 formed so as to slidably receive the tape-shaped package 112 therein is exchangeably secured to the slider 324 by tightening screws. A block holder 336 is firmly fitted onto a rotary clamp shaft 334 rotatably inserted through the central part of the tape-shaped package introduction block 328 in the horizontal direction at a right angle relative to the direction of conveyance of the tape-shaped package 112, and a clamp block 338 having an inverted L-shaped sectional contour is firmly secured to the block holder 336 by tightening set screws. In addition, a clamp pawl 340 adapted to thrust the fore end part of the tape-shaped package 112 received in the tape-shaped package guide groove 332 of the tape-shaped package introduction block 328 against the tape-shaped package guide groove 332 is integrally secured to the clamp block 338. In addition, a clamp lever 342 of which left-hand end part is integrally fitted onto the rotary clamp shaft 334 is connected to a lever extension member 346 while a tension coil spring 344 is spanned between the right-hand end part of the clamp lever 342 and the right-hand end part of the bracket 318. To turn the clamp lever 342 about the rotary clamp shaft 334 together with the lever extension member 346 in the anticlockwise direction as seen in FIG. 13 against the resilient force of the tension coil spring 344, an air cylinder 350 including a piston rod 348 is firmly mounted on the bracket 318.

Specifically, while the tape-shaped package 112 is wound around the reel 116, the piston rod 348 of the air cylinder 350 is retracted in the downward direction as shown in FIG. 13, and the clamp lever 342 is turnably biased by the resilient force of the tension coil spring 344 in such a manner as to allow the tape-shaped package guide groove 332 of the tape-shaped package introduction block 328 to be parted away from the clamp pawl 340. As a result, a gap wide enough to allow the tape-shaped package 112 to pass between the clamp pawl 340 and the tape-shaped package guide groove 332 is formed therebetween. On the contrary, in the case that the fore end part of the tape-shaped package 112 is delivered to the reel 116, the piston rod 348 of the air cylinder 350 is expanded from the state shown in FIG. 13 in the upward direction, causing the clamp lever 342 to be turnably biased so as to allow the tape-shaped package guide groove 332 of the tape-shaped package introduction block 328 to come in contact with the clamp pawl 340, whereby the fore end part of the tape-shaped package 112 received in the tape-shaped package introduction block 328 is thrusted against the tape-shaped package guide groove 332, resulting in the fore end part of the tape-shaped package 112 being firmly seized by the clamp pawl 340 in the tape-shaped package introduction block 328.

Figure 16:
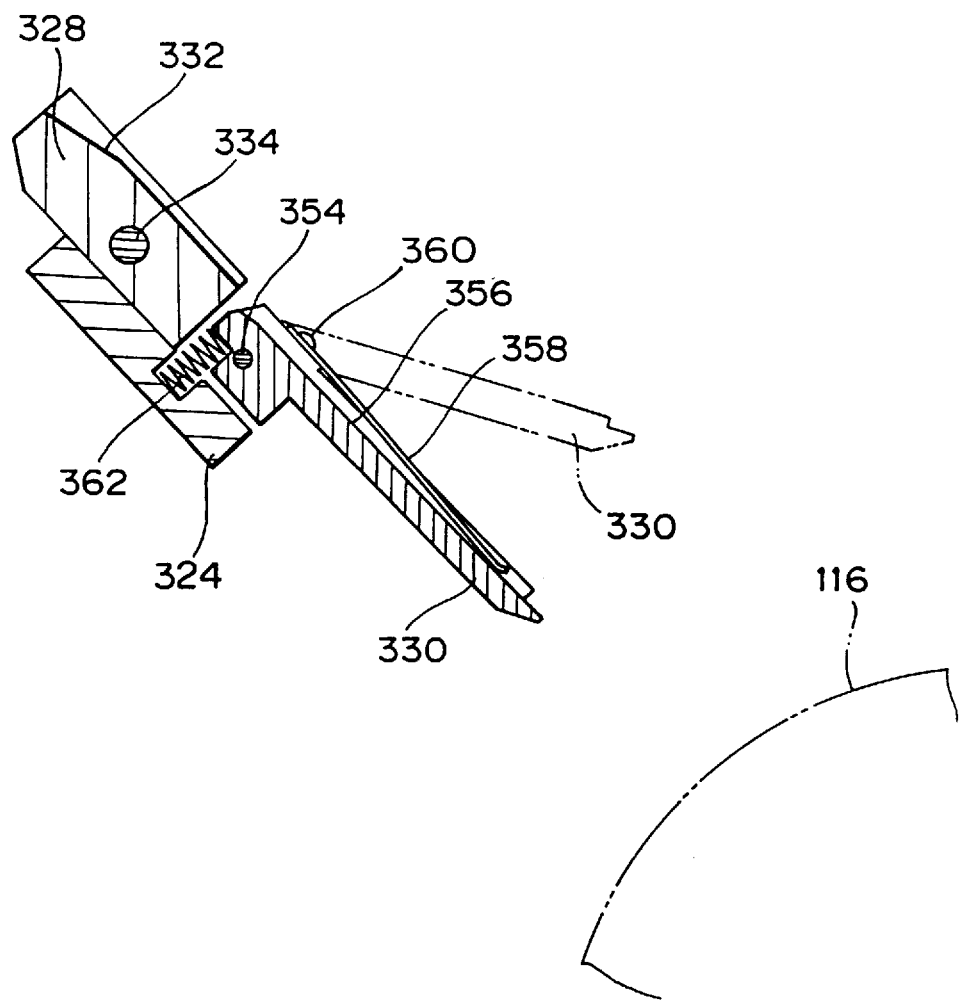
FIG. 16 is an enlarged sectional view of a tape-shaped package guiding arm section arranged for the tape-shaped package foremost end guiding unit shown in FIG. 13.

On the other hand, as is apparent from FIG. 13 and FIG. 16 which shows by way of enlarged sectional view structure of the tape-shaped package guide arm 330, the tape-shaped package guide arm 330 is turnably supported to turn about a pivotal pin 354 which is inserted through an arm support plate 352 integrated with the slider 324. To assure that the tape-shaped package 112 is reliably brought in contact with the tape-shaped package guide groove 356 as the former slidably moves along the latter, a leaf spring 358 is fastened to the upper surface of the tape-shaped package guide arm 330 by tightening a screw 360 in order to apply a certain intensity of resilient force of the leaf spring 358 to the tape-shaped package 112 from above. In addition, a compression coil spring 362 is disposed between the tape-shaped package guide arm 330 and the slider 324 to normally bias the package guide arm 330 in such a manner as to allow the latter to turn about the pivotal pin 354 in the clockwise direction as seen in FIG. 13.

The fundamental structure of a carrier tape cutting unit 136 located between the tape-shaped package cutting unit 132 and the reel driving shaft 114 to form a leader portion 122 by cutting only the carrier tape 134 of the tape-shaped package 112 is substantially coincident with that of the tape-shaped package cutting unit 132, and the carrier tape cutting unit 136 is operated directly after the tape-shaped package cutting unit 132 is operated.

Specifically, as shown in FIG. 15, a knife driving air cylinder 364 is attached to the front surface of the upper casing 110 with the aid of a bracket 366 with an upward attitude, and the upper end of a piston rod 368 extending through the knife driving air cylinder 364 is slidably held by a rod guide 370 secured to the upper casing 110 while extending through the rod guide 370. A cutter holder 372 is secured to the upper end of the piston rod 368, and a cutter knife 374 is firmly attached to the cutter holder 372 in order to cut the carrier tape 134 of the tape-shaped package 112 therewith. A plate-shaped knife receiver 376 projected outside of the upper casing 110 from the rear side of the latter is located directly above the cutter knife 374, and it is slidably held by a knife receiver holder 378 fastened to rear surface of the upper casing 110 to slidably move in the normal direction relative to the upper casing 110 (i.e., in the rightward/leftward direction as seen in FIG. 15). A holder driving cylinder 382 is secured to the knife receiver holder 378 via a bracket 380, and the foremost end of a piston rod 384 of the holder driving cylinder 382 is operatively connected to the left-hand end of the knife receiver holder 378 via a connecting member 386. The piston rod 368 of the holder driving air cylinder 364 is expanded before the piston rod 368 of the knife driving air cylinder 364 is raised up, causing the fore end part of the knife receiver 376 to be projected between the carrier tape 134 and the cover tape 154 both of which are not still fused to each other, in order to receive the thrusting force of the cutter knife 374 therewith.

On the other hand, a tape sucking plate 642 having a L-shaped sectional contour is fastened to the upper casing 110 by tightening screws in order to take up the cover tape 154 after the latter is cut by actuating the tape-shaped package cutting unit 132, and a suction tube 644 is disposed on the rear surface of the tape sucking plate 642 facing to the cover tape 154 of the tape-shaped package 112 while making communication with a suction pump (not shown). Thus, when the suction pump is driven before the tape-shaped package cutting unit 132 is actuated, the cover tape 154 is sucked up to reach the lower surface of the tape sucking plate 642, causing only the carrier tape 134 to be downwardly suspended from the tape sucking plate 642 due to its own dead weight. As a result, the carrier tape 134 is separated from the cover tape 154, whereby only the carrier tape 134 can reliably be cut by the cutter knife 374 after the knife receiver 376 is inserted between the carrier tape 134 and the cover tape 154. The suction pump is continuously driven directly before the leader portion 122 of the tape-shaped package 112 is completely wound around the reel 116.

To damp the shock caused when the carrier 134 is cut by the cutter knife 374, a damper ring 388 having a U-shaped sectional contour and molded of an elastic material such as a rubber or the like is attached to the lower end of the piston rod 368 of the knife driving air cylinder 364 to collide against the lower surface of the bracket 366. The carrier tape cutting unit 136 is actuated subsequent to the cutting operation achieved for the tape-shaped package 112 by actuating the tape-shaped package cutting unit 132. For this reason, the reel driving shaft 114 should temporarily be held in the stopped state between the time when the tape-shaped package cutting unit 132 starts to be actuated and the time when the carrier tape cutting unit 136 concludes to be actuated.

The structure of the carrier tape cutting unit 136 should not be limited only to that employed in this embodiment but any other type of hitherto known structure may be employed for the carrier tape cutting unit 136.

Figure 17:
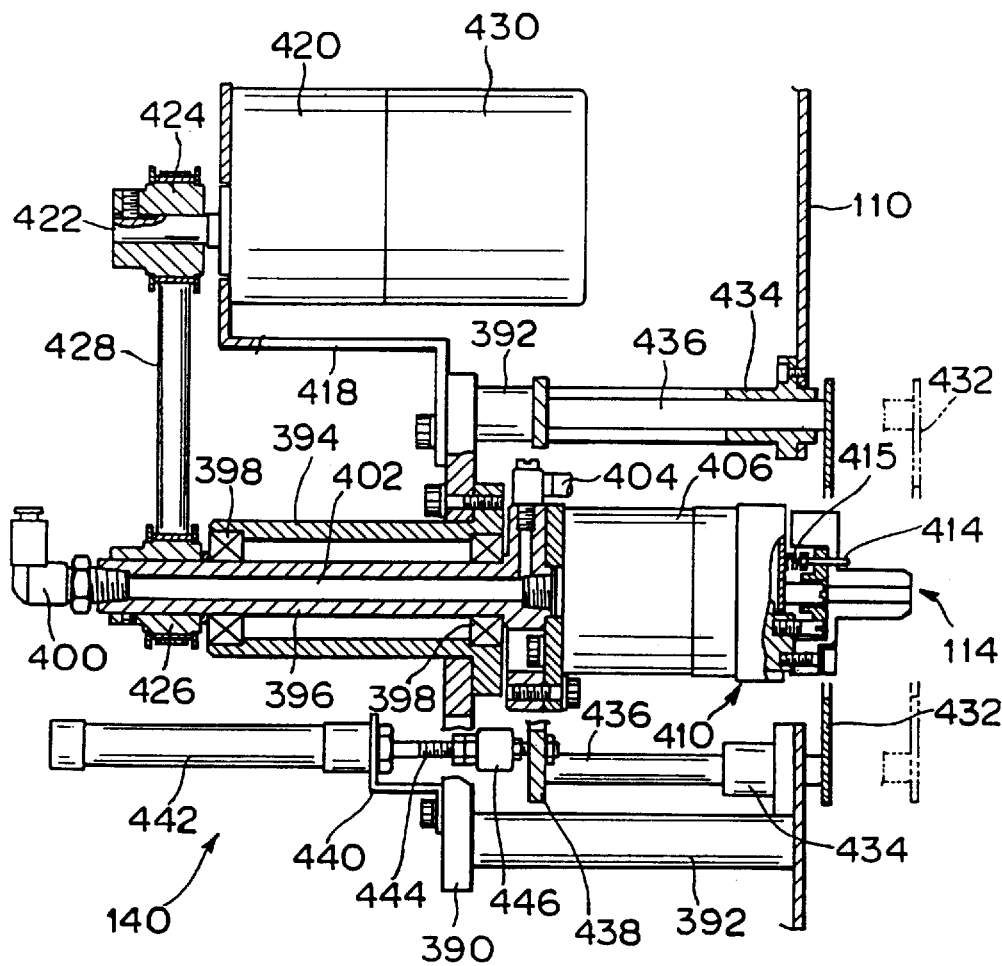
FIG. 17 is an enlarged sectional view of a reel driving shaft section arranged for the tape winding apparatus.

FIG. 17 shows by way of sectional view the structure of a reel attaching/detaching unit 140 constructed in accordance with this embodiment.

Specifically, a subframe 390 having a heavy thickness is immovably held inside of the upper casing 110 with the aid of a plurality of support columns 392 while extending in parallel with the upper casing 110. A cylindrical driving shaft holder 394 is immovably secured to the central part of the subframe 390, and a hollow shaft 396 extending through the driving shaft holder 394 is rotatably held in the driving shaft holder 394 with the aid of a pair of bearings 398. A compressed air supply source (not shown) is communicated with the left-hand end of the hollow shaft 396 via a rotary joint 400, and a reel chuck shift valve 406 communicated with a compressed air supply path 402 in the hollow shaft 396 via an air piping 404 as well as a reel driving shaft expanding/contracting unit 410 including a reel driving shaft 114 adapted to fitted into a reel hole 408 formed through the central part of the hub core 118 of the reel 116 are connected to the right-hand end of the hollow shaft 396.

In this embodiment, the reel driving shaft expanding/contracting unit 410 includes a reel driving shaft 114 having a split structure composed of three split segments so as to allow the outer diameter thereof to be reduced by the resilient force of spring means (not shown) and a plurality of engagement pins 414 adapted to be engaged with a plurality of engagement grooves 412 radially formed outward of the outer periphery of the reel hole 408. As compressed air is fed from the reel chuck shifting valve 406, the three split segments of the reel driving shaft 114 are radially displaced in such a manner that the outer diameter of the reel driving shaft 114 is enlarged against the resilient force of spring means. When the enlarged outer diameter of the reel driving shaft 114 collides with the inner peripheral surface of the reel hole 408, the reel 116 is firmly held on the reel driving shaft 114 while building an integral structure with the latter. On the contrary, when the compressed air in the reel driving shaft expanding/contracting unit 410 is exhausted to the outside by actuating the reel chuck shifting valve 406, the three split segments of the reel driving shaft 114 are equally radially displaced in the inward direction until the outer diameter of the reel driving shaft 114 is reduced to such an extent that the reel 116 can be detached from the reel driving shaft 114. Each of the engagement pins 414 is normally biased by the resilient force of a compression coil spring 415 received therein in such a manner as not to allow it to be projected from the outer end surface of the reel driving shaft 114. With such construction, when the position of each engagement pin 414 does not coincide with that of each engagement groove 412 in the reel hole 408, the foremost end of each engagement pin 414 is retracted inside of the reel driving shaft 114 (i.e., in the leftward direction as seen in FIG. 17) by the resilient force of the compression coil spring 415.

In this embodiment, the reel chuck shifting valve 406 is actuated to stop the feeding of compressed air to the reel driving shaft expanding/contracting unit 410 only when the reel 116 is displaced between the reel driving shaft 114 and a reel receiving/delivering shaft 416 to be described later (see FIG. 23) so that it is received from and delivered to the reel receiving/delivering shaft 416. Otherwise, the reel chuck shifting valve 406 is actuated to feed compressed air to the reel driving shaft expanding/contracting unit 410. As will be described later, since the reel receiving/delivering shaft 416 is dimensioned to have an outer diameter substantially equal to that of the reel driving shaft 114 in the contracted state, when the reel driving shaft 114 is correctly located opposite to the reel receiving/delivering shaft 416 as seen in the axial direction, receiving of the reel 116 from the reel receiving/delivering shaft 416 and delivering of the former from the latter can be achieved between the reel driving shaft 114 and the reel receiving/delivering shaft 416 without an occurrence of any particular problem irrespective of some downward positional offset of the center axis of the reel hole 408 of the reel 116 relative to the center axis of the reel driving shaft 114 and the reel receiving/delivering shaft 416.

A speed reducing unit 420 is mounted on the subframe 390 via a bracket 418. A driving gear 424 is firmly fitted onto an output shaft 422 of the speed reducing unit 420 and a follower gear 426 is firmly fitted onto the left-hand end part of the hollow shaft 396 so that an endless toothed belt 428 is spanned between both the gears 424 and 426 while extending around them. Thus, as a reel driving stepping motor 430 assembled with the speed reducing unit 420 is rotationally driven, the hollow shaft 396 is rotated at a reduced speed together with the reel chuck shifting valve 406 and the reel driving shaft expanding/contracting unit 410 via the speed reducing unit 420 and the endless toothed belt 428.

In response to detection signals outputted from the slider position detecting sensors 170, 172, 174 and 176, the rotary encoder 188 and an insert slot detecting sensor 452 to be described later, the rotational speed of the reel driving shaft 114 can arbitrarily be changed in conformity with a command issued from a controlling unit (not shown). Basically, the reel driving shaft 114 is rotated at a low speed not only when the tape-shaped package 112 starts to be wound around the reel 116 but also directly before completion of the winding operation, and it is rotated at a high speed for a period of time other than the foregoing ones, but rotation of the reel driving shaft 114 is stopped at the time of exchanging the reel 116 with another one.

To assure that the reel 116 is detached from the reel driving shaft 114 after the tape-shaped package 112 is completely wound around the reel 116, an annular reel thrusting plate 432 is arranged in such a manner as to surround the reel driving shaft 114 therewith, and the foremost ends of a plurality of guide rods 436 slidably inserted through rod guide bushes 434 attached to the upper casing 110 are fixedly secured to the rear surface of the annular reel thrusting plate 432. The left-hand ends of the guide rods 436 are fixedly secured to an annular connection plate 438 which surrounds the right-hand end part of the hollow shaft 396 therewith, and a piston rod 444 of a reel discharging air cylinder 442 mounted on the subframe 390 via a bracket 440 is operatively connected to the annular connection plate 438 via a flexible joint 446.

When the piston rod 444 of the reel discharging air cylinder 442 is expanded, the reel thrusting plate 432 located at the retracted position shown in FIG. 17 is displaced in the forward direction to reach a position represented by phantom lines shown in the drawing, whereby the reel 116 fitted onto the reel driving shaft 114 is thrusted toward the reel receiving/delivering shaft 416 which is located opposite to the reel driving shaft 114 as seen in the axial direction.

It should be noted that the structure of the reel attaching/detaching unit 140 should not be limited only to that in the aforementioned embodiment but any other type of hitherto known structure may be employed for the reel attaching/detaching unit 140.

Figure 18:
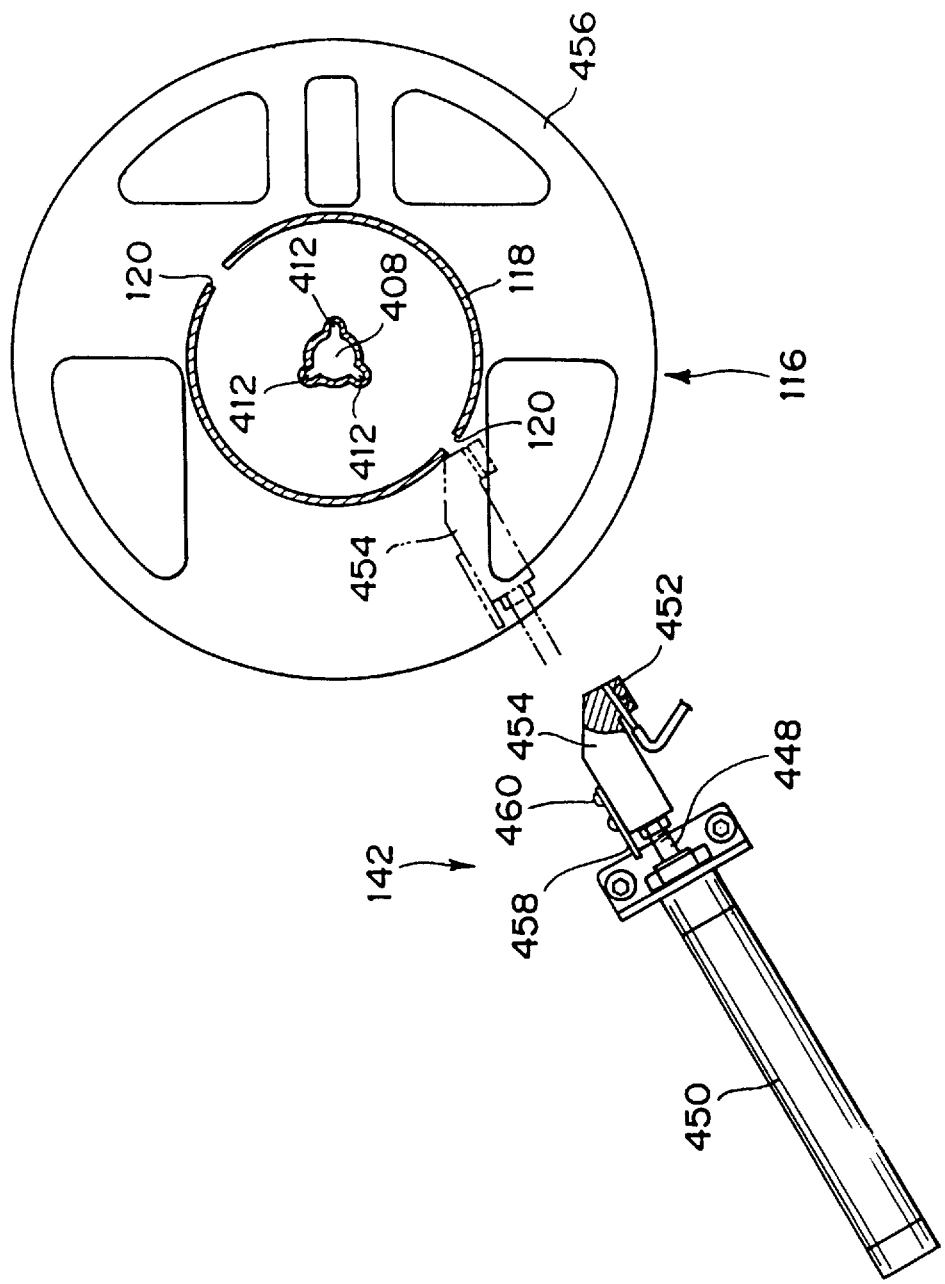
FIG. 18 is an enlarged front view of a reel indexing unit arranged for the tape winding apparatus.

To assure that the foremost end of the tape-shaped package 112 delivered from the tape-shaped package foremost end guiding unit 130 is automatically engaged with a tape insert slot 120 formed through a hub core 118 of an empty reel 116 fitted onto the reel driving shaft 114, a reel indexing unit 142 serves to stop the tape insert slot 120 at a predetermined position at all times. FIG. 1 and FIG. 18 show the structure of the foregoing reel indexing unit 142, respectively.

Figure 19:
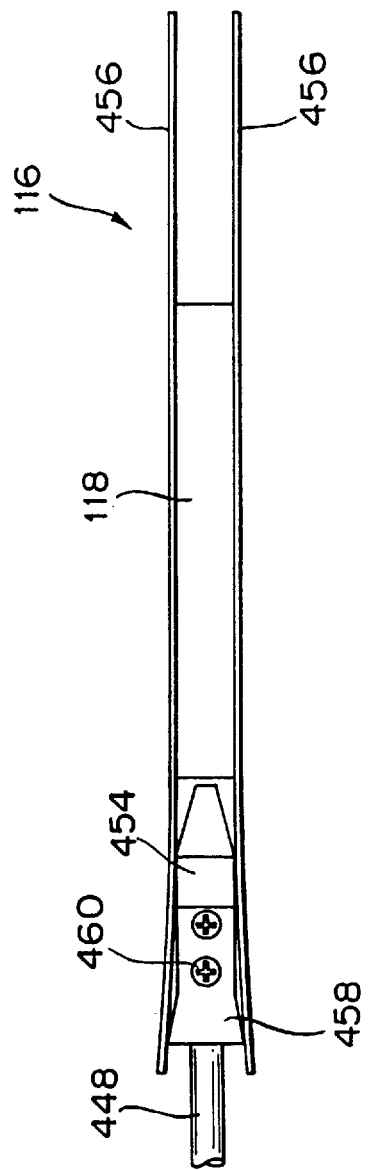
FIG. 19 is a plan view of the reel indexing unit shown in FIG. 18.

Specifically, an expansible/contractible air cylinder 450 including a piston rod 448 adapted to expand toward and contract away from the hub core 118 is arranged at the lower end part of the upper casing 110. A reflection type insert slot detecting sensor 452 is disposed at the foremost end of the piston rod 448 of the air cylinder 450 via a sensor bracket 454 in order to detect one of the tape insert slots 120 formed through the hub core 118 of the reel 116 by using an optical fiber. To assure that the sensor bracket 454 is smoothly displaced in the reel 116 in the forward direction to reach a detecting position represented by phantom lines in FIG. 18 while it is not adversely affected by any warpage of both the flange portions 456 of the reel 116, the sensor bracket 454 is tapered as shown in FIG. 19 that is a plan view of the sensor bracket 454. In addition, to assure that the tape-shaped package 112 is reliably brought in the interior of the reel 116 by forcibly expanding both the flange portions 456 of the reel 116 in the outward direction, an enlarged portion 458 having an increased width is fastened to the rear end part of the sensor bracket 454 (on the left-hand side as seen in FIG. 19).

When one of the tape insert slots 120 is indexed to a predetermined position on the hub core 118 of the reel 116 fitted onto the reel driving shaft 114, the piston rod 448 of the air cylinder 450 is expanded from the standby position as shown in FIG. 18, causing the sensor bracket 454 to be displaced in the space defined between both the flange portions 456 of the reel 116 in the forward direction to reach a detecting position located opposite to the hub core 118 of the reel 116. At this time, the reel 116 is immovably held without any rotation thereof. Subsequently, the reel driving stepping motor 430 is rotationally driven at a low speed. When the insert slot detecting sensor 452 detects one of tape insert slots 120 formed through the hub core 118 of the reel 116 while the foregoing state is maintained, a detection signal is outputted to a controlling unit (not shown) for the reel driving stepping motor 430. In response to the detection signal, the reel driving shaft 114 is rotated by a predetermined angle with the aid of the controlling unit, and thereafter, the rotation of the reel driving shaft 114 is stopped, whereby the tape insert slot 120 on the hub core 118 is located at the position facing to the foremost end of the tape-shaped package 112 conveyed from the tape-shaped package foremost end guiding unit 130.

In this embodiment, the insert slot detecting sensor 452 is employed for the reel indexing unit 142 as means for detecting the position of each tape insert slot 120 formed through the hub core 118 of the reel 116. It of course is obvious that any other type of hitherto known sensor such as a supersonic sensor, a contact sensor or the like may be substituted for the insert slot detecting sensor 452.

Figure 20:
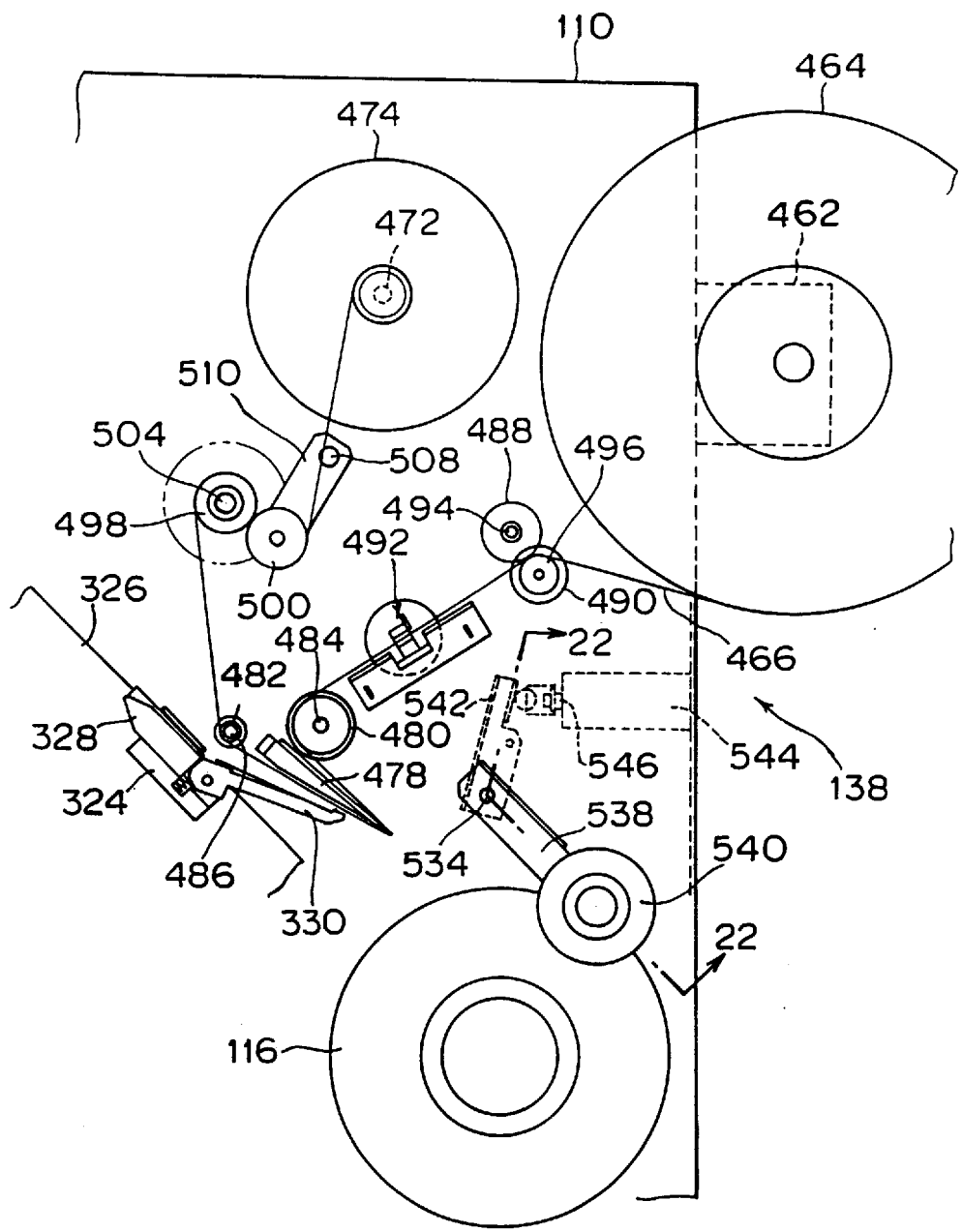
FIG. 20 is an enlarged front view of an end seal feeding unit arranged for the tape winding apparatus.
Figure 21:
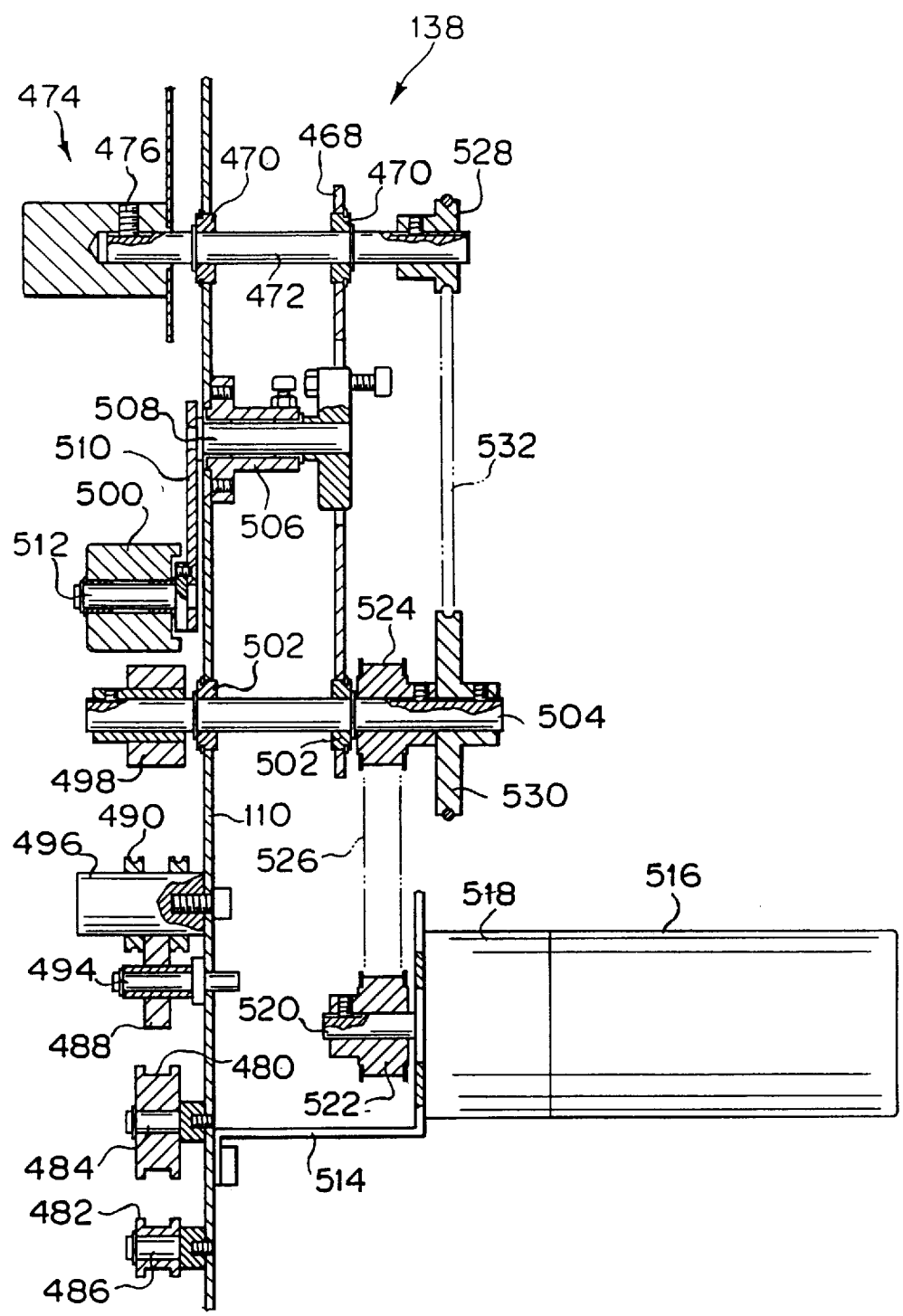
FIG. 21 is a sectional view of a driving mechanism for the end seal feeding unit shown in FIG. 20, showing the developed state of the driving mechanism.

FIG. 20 schematically shows by way of illustrative view the structure of an end seal feeding unit 138 for connecting an end seal 124 to the terminal end of the leader portion 122, and FIG. 21 shows by way of sectional view the structure of the end seal feeding unit 138 in the developed state.

Specifically, an end seal feeding reel 464 is detachably and rotatably mounted on a reel mounting bracket 462 projected outside of the right-hand side surface of the upper casing 110, and a release liner 466 having a plurality of ribbon-shaped end seals 124 adhesively attached thereto in the equally spaced relationship as seen in the longitudinal direction of the release liner 466 is wound around the end seal feeding reel 464. A release liner winding shaft 472 is rotatably supported by the upper casing 110 and an inner frame 468 arranged inside of the upper casing 110 with the aid of a pair of bearing bushes 470 while extending through the upper casing 110 and the inner frame 468, and a release liner winding reel 474 having a single flange structure is detachably fitted onto the fore end part of the release liner winding shaft 472 by tightening a screw 476.

A wedge-shaped peeling plate 478 is firmly secured to the upper casing 110 at the position above the tape-shaped package guiding arm 330 disposed at the tape-shaped package guiding stop position of the tape-shaped package foremost end guiding unit 130 in order to peel the fore end part of an end seal 124 from the release liner 466, and a pair of retaining rollers 480 and 482 are rotatably fitted onto roller shafts 484 and 486 projected outside of the upper casing 110 on the left-hand side of the peeling plate 478. As the release liner tape 466 is unwound from the end seal feeding reel 464, it is delivered to the release liner winding reel 474 via the first retaining roller 480, the peeling plate 478 and the second retaining roller 482. At this time, one of end seals 124 is peeled off from the release liner 466 due to a large magnitude of direction change induced by the peeling plate 478, resulting in the end seal 124 being projected away from the foremost end of the peeling plate 478.

A pair of tape seizing rollers 488 and 490 for holding the release liner 466 in the clamped state and an end seal sensor 492 for detecting whether an end seal 124 is adhesively attached to the release liner 466 or not are disposed between the end seal feeding reel 464 and the first retaining roller 480 at the positions located in the order as seen from the end seal feeding reel 464 side, and the tape seizing rollers 488 and 490 are rotatably fitted onto roller shafts 494 and 496 projected outside of the upper casing 110. In addition, a pair of pinch rollers 498 and 500 for holding the release liner 466 in the clamped state are disposed between the second retaining roller 482 and the release liner winding shaft 472. One of the pair of pinch rollers 498 and 500, i.e., the driving pinch roller 498 is firmly fitted onto the fore end part of a pinch roller driving shaft 504 rotatably supported by the upper casing 110 and the inner frame 468 with the aid of a pair of bearing bushes 502, while the other one of the pair of pinch rollers 498 and 500, i.e., the idling pinch roller 500 is rotatably fitted onto a roller supporting shaft 512 firmly secured to the outer end part of a turn lever 510 which is turnably supported by a turn shaft 508 which in turn is turnably held in a bearing bush 506 fixedly secured to the upper casing 110. Additionally, spring means (not shown) is disposed on the turn shaft 508 for the purpose of normally biasing the idling pinch roller 500 toward the driving pinch roller 498 side by the resilient force of the spring means.

A release liner driving motor 516 including a speed reducing unit 518 is mounted on a bracket 514 fastened to the upper casing 110 by tightening screws. An endless tooted belt 526 is spanned between a driving gear 522 firmly fitted onto an output shaft 520 of the speed reducing unit 518 and a follower gear 524 firmly fitted onto the pinch roller driving shaft 504 while extending around both the gears 522 and 524, and moreover, an endless power transmitting belt 532 is spanned between a pulley 528 firmly fitted onto the rear end part of the release liner winding shaft 472 and a pulley 530 firmly fitted onto the rear end part of the pinch roller driving shaft 504 while extending around both the pulleys 528 and 530.

The release liner driving motor 516 is intermittently rotated every time a leader portion 122 is formed by actuating the carrier tape cutting unit 136. Specifically, the release liner driving motor 516 starts to be rotated at a low speed in synchronization with the rotation of the reel driving stepping motor 430 directly after completion of the cutting operation performed for cutting the carrier tape 134 by actuating the carrier tape cutting unit 136, in order to convey the release liner 466 at a speed corresponding to the conveying speed of the leader portion 122, whereby the foremost end of the end seal 124 is adhesively connected to the rear end part of the leader portion 122 by utilizing the adhesive power of the end seal 124. When it is detected that the release liner 466 is wound around the release liner winding reel 474 by a predetermined length, the release liner driving motor 516 stops its rotation.

Figure 22:
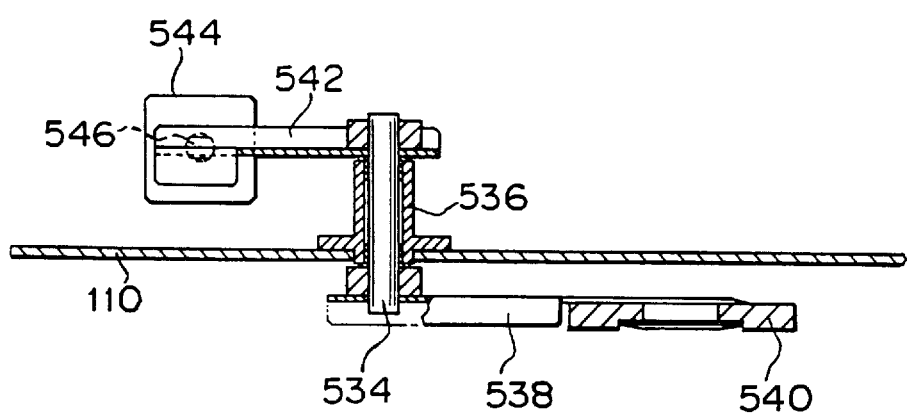
FIG. 22 is a sectional view of a tape retaining roller section for the end seal feeding unit shown in FIG. 20.

As shown in FIG. 20, FIG. 21 and FIG. 22 that is a sectional view of an end seal retaining roller 540 taken along line 22—22 in FIG. 20, a bearing bush 536 is fastened to the upper casing 110 at the position above the reel driving shaft 114 by tightening screws in order to rotatably support a tape retainer shaft 534 which extends through the upper casing 110 and the bearing bush 536, and the tape retaining roller 540 adapted to be brought in the hollow space defined between both the flange portions 456 of the reel 116 firmly fitted onto the reel driving shaft 114 is rotatably held at the foremost end of a turn lever 538 of which base end part is fitted onto the foremost end of the tape retaining shaft 534. The tape retaining roller 540 is turned about the tape retaining shaft 534 by its own dead weight in the clockwise direction as seen in FIG. 20. With this construction, as the tape-shaped package 112 is wound around the reel 116, the outer periphery of the tape-shaped package 112 is depressed toward the hub core 118 side by the dead weight of the tape retaining roller 540 in order to assure that there does not arise a malfunction that the end seal 124 is incorrectly connected to the tape-shaped package 112. A relief lever 542 is firmly fitted onto the innermost end of the tape retaining shaft 534, and a retaining roller relief cylinder 544 is immovably held inside of the upper casing 110 while facing to the upper end of the relief lever 542. As a piston rod 546 of the retaining roller relief cylinder 544 is expanded, the foremost end of the piston rod 546 thrusts the relief lever 542. As a result, the tape retaining roller 540 is turnably displaced together with the turn lever 538 adapted to turn about the tape retainer shaft 534. In such manner, the reel 116 an be attached to or detached from the reel driving shaft 114.

It should be noted that the structure of the end seal feeding unit 138 should not be limited only to the aforementioned one but any other type of hitherto known structure may be employed for the end seal feeding unit 138.

Figure 23:
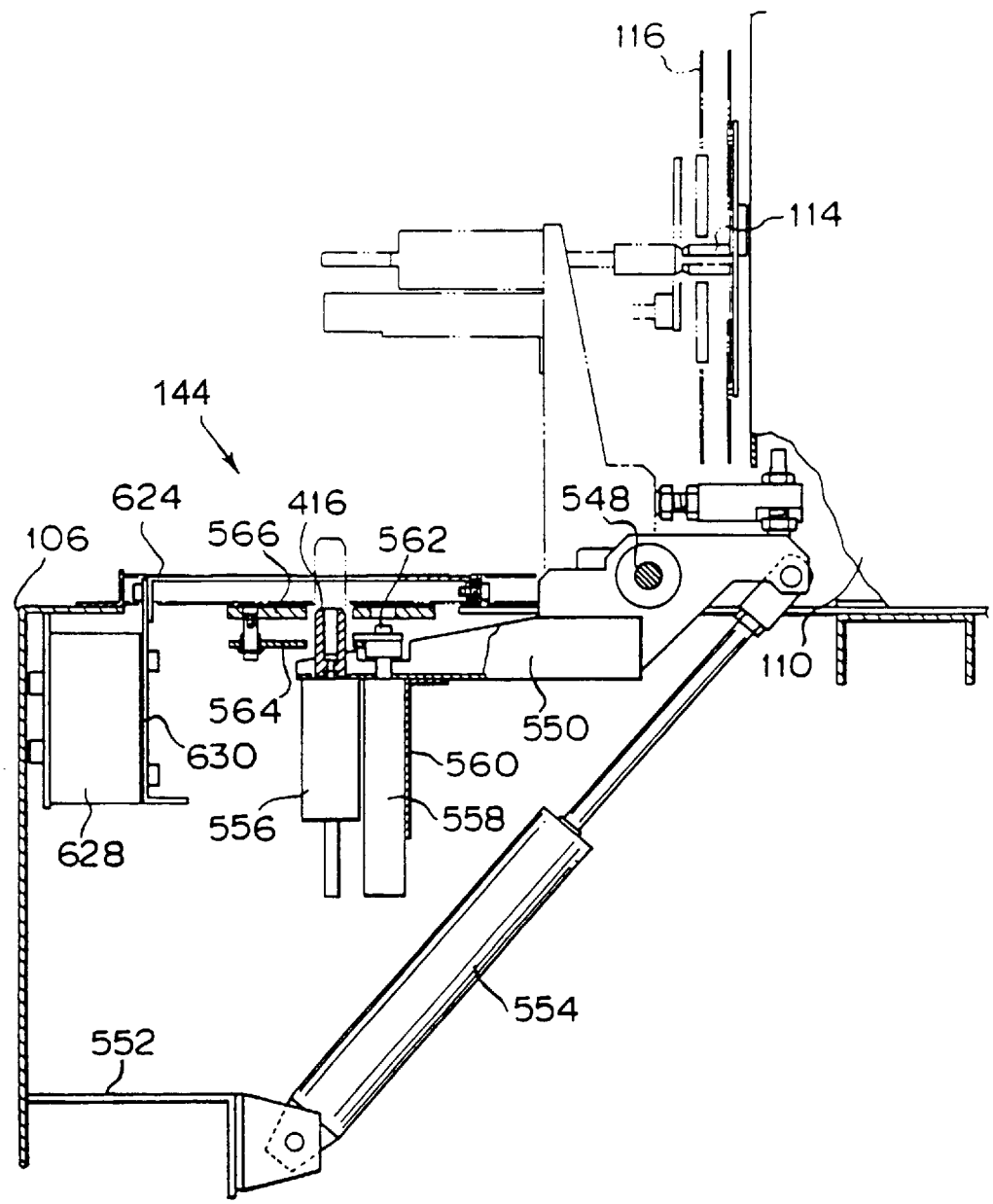
FIG. 23 is an enlarged sectional view of a reel attaching/detaching unit arranged for the tape winding apparatus.

FIG. 23 shows by way of sectional view the structure of a reel receiving/delivering unit 144 which serves to feed an empty reel 116 to the reel driving shaft 114, and moreover, receives the reel 116 having the tape-shaped package 112 wound therearound from the reel driving shaft 114.

Specifically, a swing arm 550 is turnably mounted on a horizontally extending pivotal shaft 548 at a right angle relative to the reel driving shaft 114, and the pivotal shaft 548 is located above the upper end surface of the lower casing 106. The upper end of an arm turning air cylinder 554 is pivotally connected to the right-hand end of the swing arm 550, while the lower end of the same is pivotally connected to a bracket 552 fastened to the inner wall surface of the lower casing 106 at the upper end part of the latter. When the arm turning air cylinder 554 is actuated, the swing arm 550 selectively assumes a standby position, i.e., a horizontal attitude as represented by solid lines in FIG. 23. Otherwise, it assume a vertical attitude, i.e., a reel receiving/delivering position as represented by phantom lines in the drawing.

A fitting shaft driving air cylinder 556 including a reel receiving/delivering shaft 416 adapted to be fitted into a reel hole 408 formed through the central part of the reel 116 is fixedly secured to the left-hand end part of the swing arm 550 with an upward attitude, and the reel receiving/ delivering shaft 416 is dimensioned to have an outer diameter substantially equal to that of the reel driving shaft 114 which is held in the state that no compressed air is fed to the reel driving shaft enlarging/contracting unit 410. In addition, a receiving ring driving air cylinder 558 is firmly disposed rightward of the fitting shaft driving air cylinder 558 with an upward attitude while extending in parallel with the fitting shaft driving air cylinder 556. While the swing arm 550 is held in the standby state, a reel receiving ring 566 of which upper end surface is held in the horizontal state with the aid of a receiving ring bracket 564 is firmly connected to a piston rod 562 of the receiving ring driving air cylinder 558. While the fitting shaft driving air cylinder 556 is held in the expanded state, the fore end part of the reel receiving/ delivering shaft 416 is projected outside of the central part of the reel receiving ring 566 as represented by phantom lines in FIG. 23 so that it extends through the reel hole 408. On the contrary, while the fitting shaft driving air cylinder 556 is held in the retracted, the reel receiving/delivering shaft 416 is lowered below the reel receiving ring 566 as shown in the drawing. When the piston rod 562 of the receiving ring driving air cylinder 558 is expanded from the state that the reel driving shaft 114 is linearly aligned with the reel receiving/delivering shaft 416, the reel 116 held on the reel receiving/delivering shaft 416 is drawn out of the latter, and thereafter, it is thrusted toward reel driving shaft 114 side.

In this embodiment, the pivotal shaft 548 for the swing arm 550 of the reel receiving/delivering unit 144 is laid with a horizontal attitude so that the swing arm 550 is caused to turn about the pivotal shaft 548 by an angle of ninety degrees. However, the present invention should not be limited only to this embodiment. It of course is obvious that other type of structure rather than the foregoing one and any type of driving means for turnably driving the swing arm 550 may be employed for the reel receiving/delivering unit 144 depending on the layout of a reel feeding/discharging unit 146 to be described later.

In this embodiment, the pass line of the tape-shaped package 112 is downwardly inclined at a certain angle relative to the horizontal plane in order to reduce a floor area required for mounting the tape winding apparatus, and moreover, a measure is taken such that the taping machine can continuously be operated without any reduction of an operation rate thereof by determining a raising/lowering stroke of the slider 164 of the dancer unit 148 to assume a large value.

Figure 24:
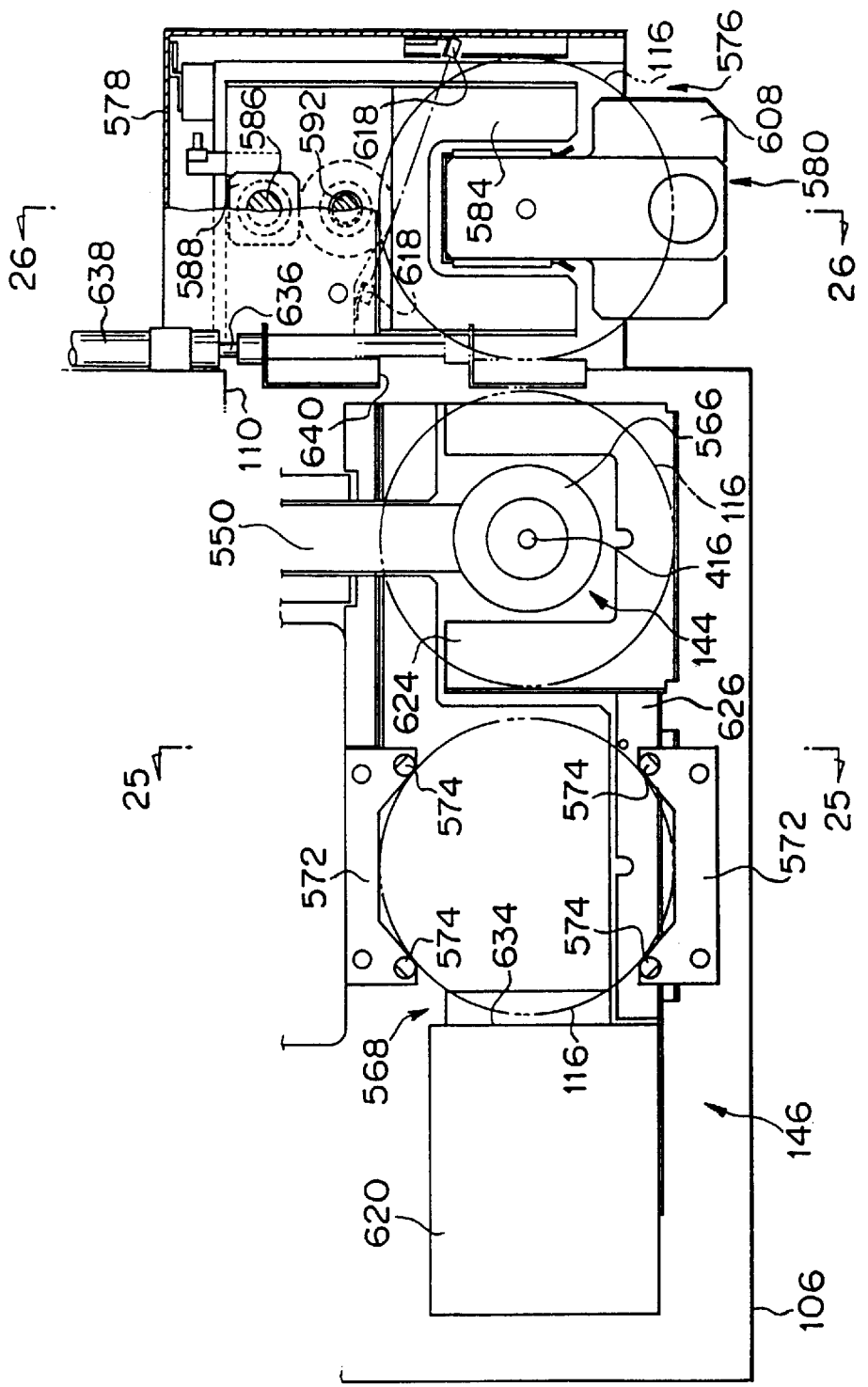
FIG. 24 is an exploded plan view of a reel feeding/discharging unit arranged for the tape winding apparatus.
Figure 25:
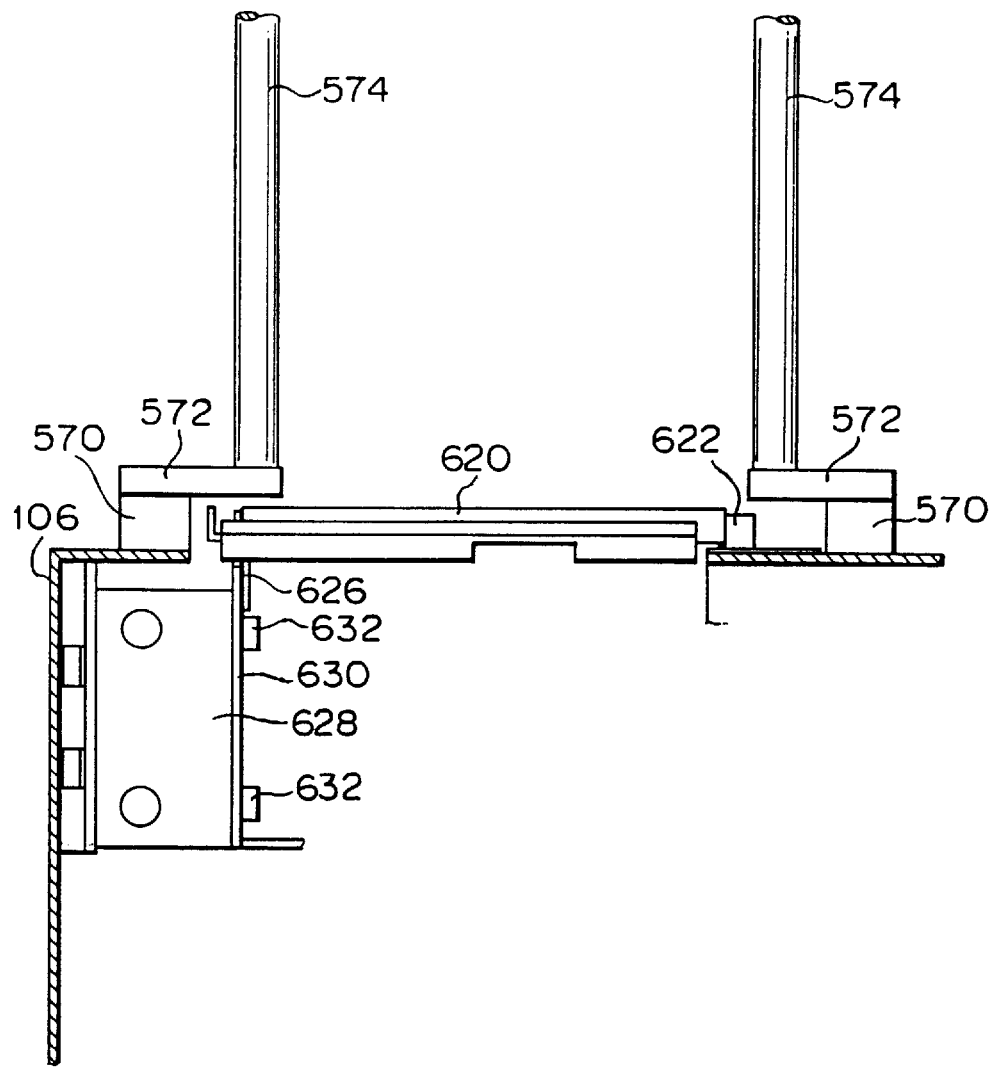
FIG. 25 is a sectional view of the reel feeding/discharging unit taken along line 25—25 in FIG. 24.
Figure 26:
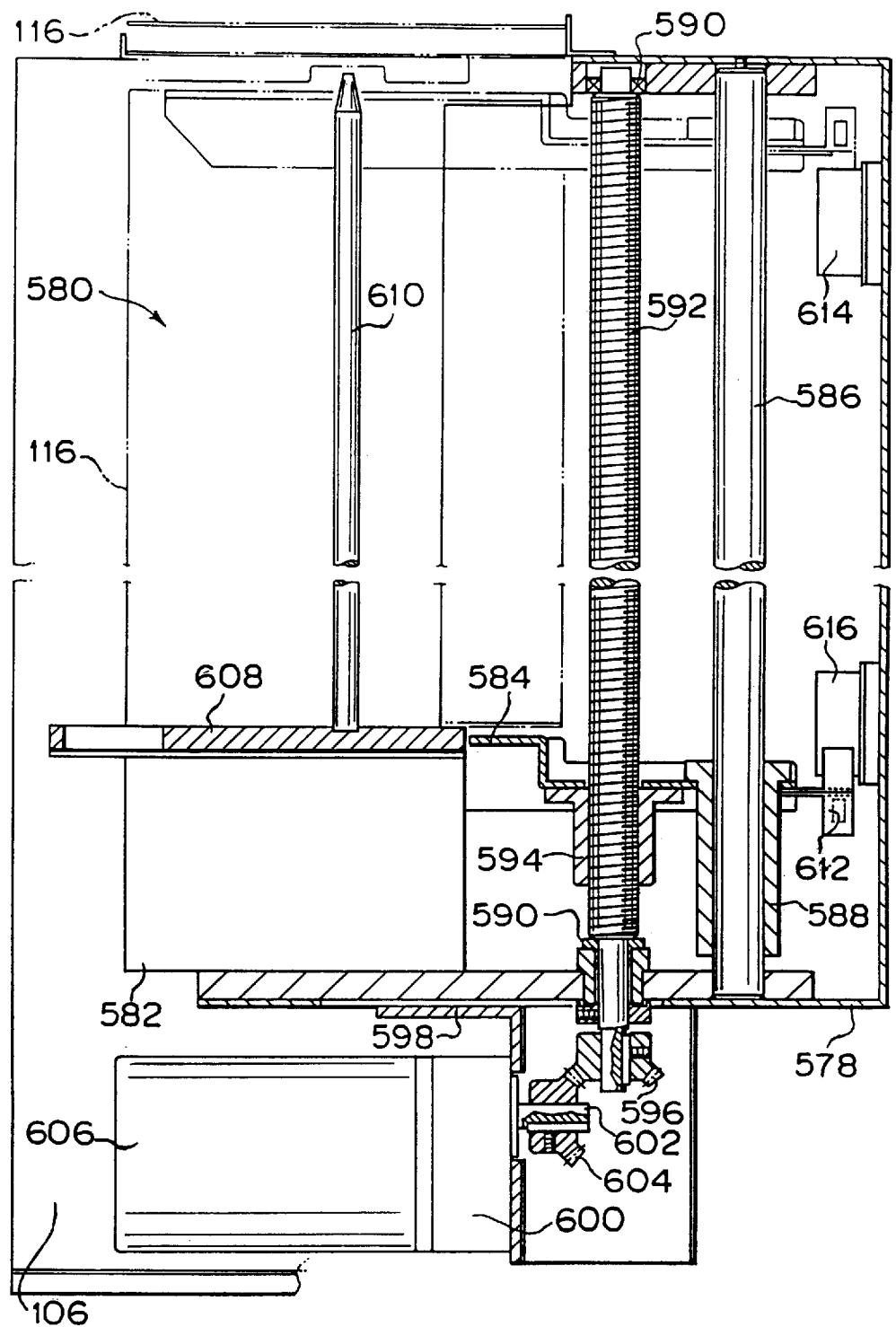
FIG. 26 is a sectional view of the reel feeding/discharging unit taken along line 26—26 in FIG. 24.

Next, FIG. 24 shows by way of plan view the structure of a reel feeding/discharging unit 146 which serves to feed an empty reel 116 to the reel receiving/delivering unit 144, and moreover, receive a reel 116 having a tape-shaped package 112 wound therearound from the reel receiving/delivering unit 144, FIG. 25 shows by way of sectional view the structure of the reel feeding/discharging unit 146 taken along line 25—25 in FIG. 24, and FIG. 26 likewise shows by way of sectional view the structure the reel feeding/ discharging unit 146 taken along line 26—26 in FIG. 24.

Specifically, an empty reel storage station 568 is arranged on the lower casing 106 on the left-hand side of the reel receiving/delivering unit 144 held in the standby state in order to storably hold a plurality of empty reels 116 in the overlapped state, and spacers 570 fastened to the lower casing 106 by tightening screws while projecting upward of the lower casing 106 and two fore and rear support columns 574 each standing upright from the corresponding spacer 570 via a bracket 572 are mounted on the empty reel storage station 568. A plurality of empty reels 116 are placed one above another in the overlapped state in the hollow space defined by the four support columns 574, and one of the empty reels 116, i.e., the lowermost reel 116 is placed on the upper surface of the lower casing 106.

In addition, a recovered reel storage station 576 is arranged rightward of the lower casing 106 on the opposite side to the empty reel storage station 568 while the reel receiving/delivering unit 144 located in the standby position is interposed therebetween. A stocker housing 578 is integrated with the lower casing 106 while surrounding the recovered reel storage station 576 therewith, and a magazine base 582 is placed on the bottom wall of the stocker housing 578 in order to detachably place a reel magazine 580 on the magazine base 582 in the correctly located state. The magazine base 582 is surrounded by a frame-shaped lifter 584 of which right-hand end part is integrated with a guide bush 588 adapted to be slidably displaced along an upright standing guide rod 586 in the stocker housing 578. In addition, a raising/lowering screw shaft 592 is rotatably supported by upper and lower bearings 590 in the stocker housing 578 while upright standing in parallel with the guide rod 586, and a feed nut 594 fastened to the lifter 584 is threadably engaged with the raising/lowering screw 592. A follower bevel gear 596 is firmly fitted onto the lower end of the raising/lowering screw shaft 592 so as to mesh with a driving bevel gear 604 firmly fitted onto an output shaft 602 of a speed reducing unit 600 which is secured to the lower surface of the stocker housing 578 via a bracket 598. As a lifter raising/lowering motor 606 integrated with the speed reducing unit 600 is rotationally driven in the normal/reverse direction, the raising/lowering screw shaft 592 is rotated in the normal/reverse direction with the result that the lifter 584 integrated with the feed nut 594 threadably engaged with the raising/lowering shaft 592 is raised up and lowered along the guide rod 586.

In this embodiment, the reel magazine 580 is substantially composed of a bottom plate 608 placed on the magazine base 582 in the correctly located state and a core rod 610 standing upright from the bottom plate 608 to extend through the reel hole 408 of the reel 116. When a predetermined number of reels 116 are placed one above another on the base plate 608 in the overlapped state while the core rod 610 extends through the respective reels 116, the reel magazine 580 can be exchanged with a new empty reel magazine 580 with an operator's hand. A dog 612 is integrated with the lifter 584 at the right-hand end of the latter while projecting from the lifter 584 in order to detect the position of the lifter 584 in the stock housing 578. An upper position detecting sensor 614 serves to detect the upper end of the dog 612, while a lower position detecting sensor 616 serves to detect the lower end of the dog 612, and both the position detecting sensors 614 and 616 are fastened to the stocker housing 578 on the right-hand side of the latter by tightening screws. To assure that the lifter 584 is lowered by a distance equal to the width of a reel 116 every time the reel 116 having a tape-shaped package 112 wound therearound is conveyed onto the reel storage station 576 so that the upper end surface of the uppermost reel 116 is always flush with the upper surface of the lower casing 106, a pair of upper end position detecting sensors 618 are disposed at the opposing positions with flange portions 456 of the uppermost end reel 116 interposed therebetween, in order to detect the position of the uppermost end reel 116 among a plurality of reels 116 placed on the recovered reel storage station 576 in the overlapped state. In this embodiment, to cope with the problem that the width of a reel 116 varies corresponding to variation of the width of a tape-shaped package 112, a measure is taken such that the positions of the upper end position detecting sensors 618 can correctively be changed in the vertical direction.

With this construction, when no reel is placed in the reel magazine 680, in response to a detection signal outputted from the upper end position sensor 614, the lifter raising/lowering motor 606 is rotationally driven in the normal direction until the lifter 584 is raised up to reach the position where the upper surface of the lifter 584 is flush with the upper surface of the lower housing 106. When a reel 116 is conveyed to the recovered reel storage station 576 while the foregoing state is maintained, in response to a detection signal outputted from the upper end position detecting sensor 618, the lifter raising/lowering motor 606 is rotationally driven in the reverse direction so that the lifter 584 is lowered by a distance equal to the width of the reel 116, causing the core rod 610 of the reel magazine 580 to be relatively inserted through the reel hole 408 of the reel 116. Thus, a plurality of reels 116 are placed one above another in the reel magazine 580 in the overlapped state by repeating the aforementioned steps of operations. When a predetermined number of reels 116 are placed one above another in the reel magazine 580 in the overlapped state, the lower position detecting sensor 616 is turned on, causing alarming means (not shown) to be activated so as to promote an operator to exchange the reel magazine 580 with an empty one.

As is apparent from FIG. 24, the empty reel storage station 568, the reel receiving/delivering unit 144 held at the standby position and the recovered reel storage station 576 are arranged side by side in the equally spaced relationship. To assure that a lowermost reel 116 among a plurality of reels 116 placed on the empty reel storage station 568 in the overlapped state is thrusted to the position directly above the reel receiving/delivering unit 144 held in the standby position, a plate-shaped empty reel feeding member 620 is reciprocably displaced between the reel receiving/delivering unit 144 held at the standby position and the empty reel storage position 568 represented by solid lines in FIG. 24. The empty reel feeding member 620 includes two opposing pairs of rollers 622 each of which can roll on the upper surface of the lower casing 106. In addition, to assure that a reel 116 having a tape-shaped package 112 wound therearound and placed on the reel receiving/delivering unit 144 held at the standby position is conveyed to the recovered reel storage station 576, a substantially U-shaped conveying table 624 is reciprocably displaced between the recovered reel storage station 576 and the reel receiving/delivering unit 144 held at the standby position to surround the reel receiving ring 566 therewith. The recovered reel conveying table 624 includes a pair of rollers (not shown) each of which can roll on the upper surface of the lower casing 106. The empty reel feeding member 620 and the recovered reel conveying table 624 are operatively connected to each other via a joint bracket 626 bridged therebetween, and a sliding member 630 of a rodless cylinder 628 fastened to the upper part of the lower casing 106 is operatively connected to the joint bracket 626 via a plurality of bolts 632.

In the case that the sliding member 628 of the rodless cylinder 628 is held at one of stroke ends thereof, the empty reel feeding member 620 and the recovered reel conveying table 624 are located at their standby positions represented by solid lines in FIG. 24. In the case that the sliding member 630 of the rodless cylinder 628 is held at the other stroke end thereof, the position of the empty reel feeding member 620 is shifted to the empty reel storage station 568, and moreover, the position of the recovered reel conveying table 624 is shifted to the recovered reel storage station 576. Concretely, the empty reel feeding member 620 held in the standby state is displaced to the reel receiving/delivering unit 144 side, a side end surface 634 of the empty reel feeding member 620 collides against the outer peripheral edge of a lowermost reel 116 held on the empty reel receiving storage station 568, causing the lowermost reel 116 to be thrusted to the reel receiving/delivering unit 144 side. At the same time, the recovered reel conveying table 624 is displaced to the recovered reel storage station 576 together with the reel 116 placed on the recovered reel conveying table 624 and having a tape-shaped package 112 wound therearound.

A reel retaining cylinder 638 including a piston rod 636 adapted to be projected in the forward direction is disposed on the side end of the upper casing 110 located directly above the stocker housing 578, and a reel retainer 640 interposed between the standby position of the reel receiving/delivering unit 144 and the recovered reel storage station 576 and adapted to collide against the outer periphery of the flange portions 456 of the reel 116 on the recovered reel conveying table 624 located on the recovered reel storage station 576 is firmly fitted onto the fore end part of the piston rod 636. To assure that the reel 116 placed on the recovered reel conveying table 624 and having a tape-shaped package 112 wound therearound is immovably retained on the recovered reel storage station 576 when the recovered reel conveying table 624 returns to its standby position from the recovered reel storage station 576, the reel retainer 640 is projected in the hollow space between the standby position of the reel receiving/delivering unit 144 and the recovered reel storage station 576, whereby the reel 116 on the recovered reel conveying table 624 can immovably be retained on the recovered reel storage station 576 when the recovered reel conveying table 624 moves to the reel receiving/delivering unit 144 side.

It should be noted that the structure of the reel feeding/discharging unit 146 as described above should not be limited only to the shown one but any other type of hitherto known structure may be employed for the reel feeding/discharging unit 146.

Next, a tape winding apparatus constructed in accordance with another embodiment of the present invention based on a second aspect of the latter will be described in detail below with reference to FIG. 27 to FIG. 38 wherein a tape-shaped package having a plurality of semiconductor chip components received therein is used for the tape winding apparatus. It should be noted that same structural components as those described above in the preceding embodiment are represented by same reference numerals.

Figure 27:
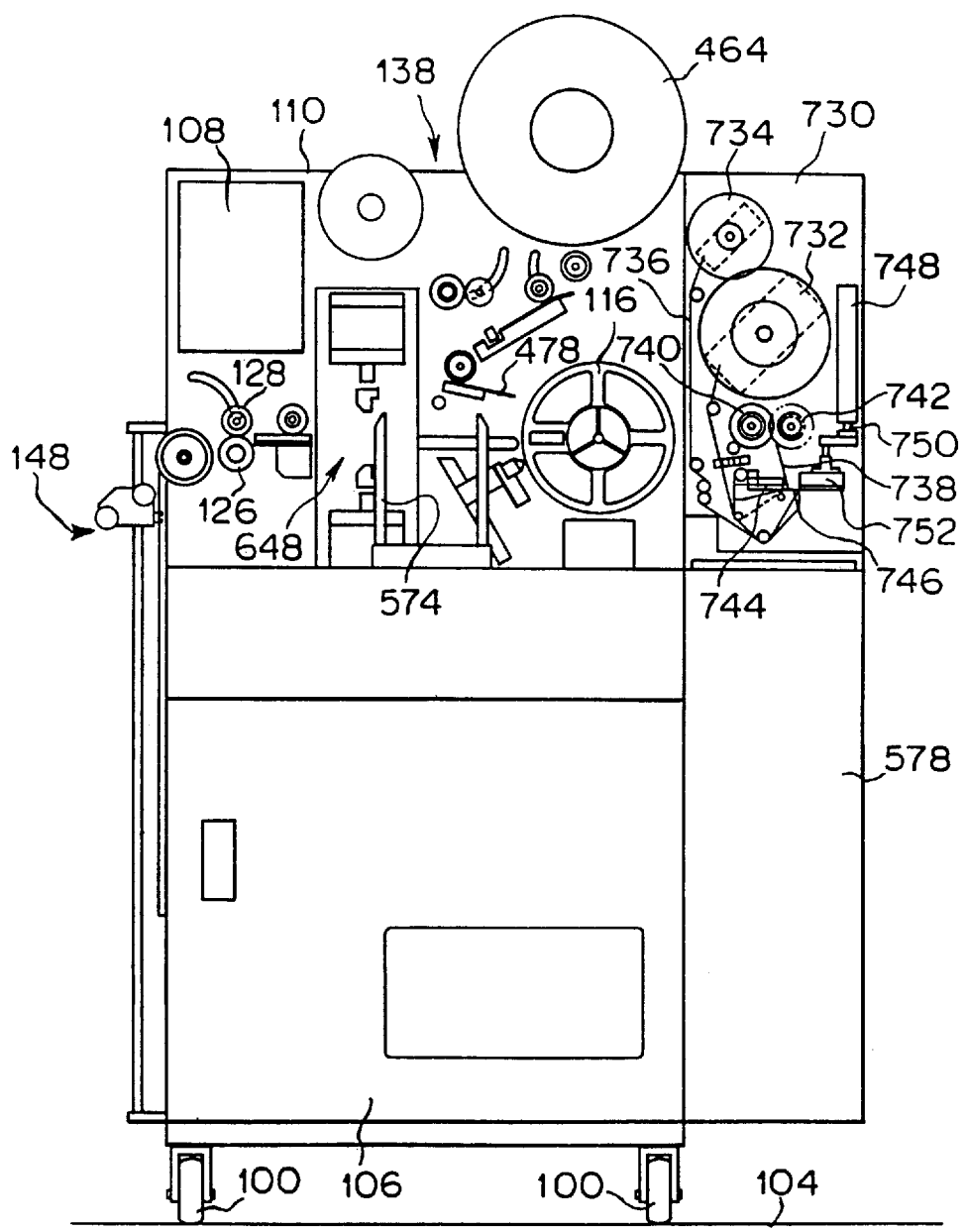
FIG. 27 is a front view of a tape winding apparatus constructed in accordance with another embodiment of the present invention based on a second aspect of the latter in association with a fourth aspect of the same.
Figure 28:
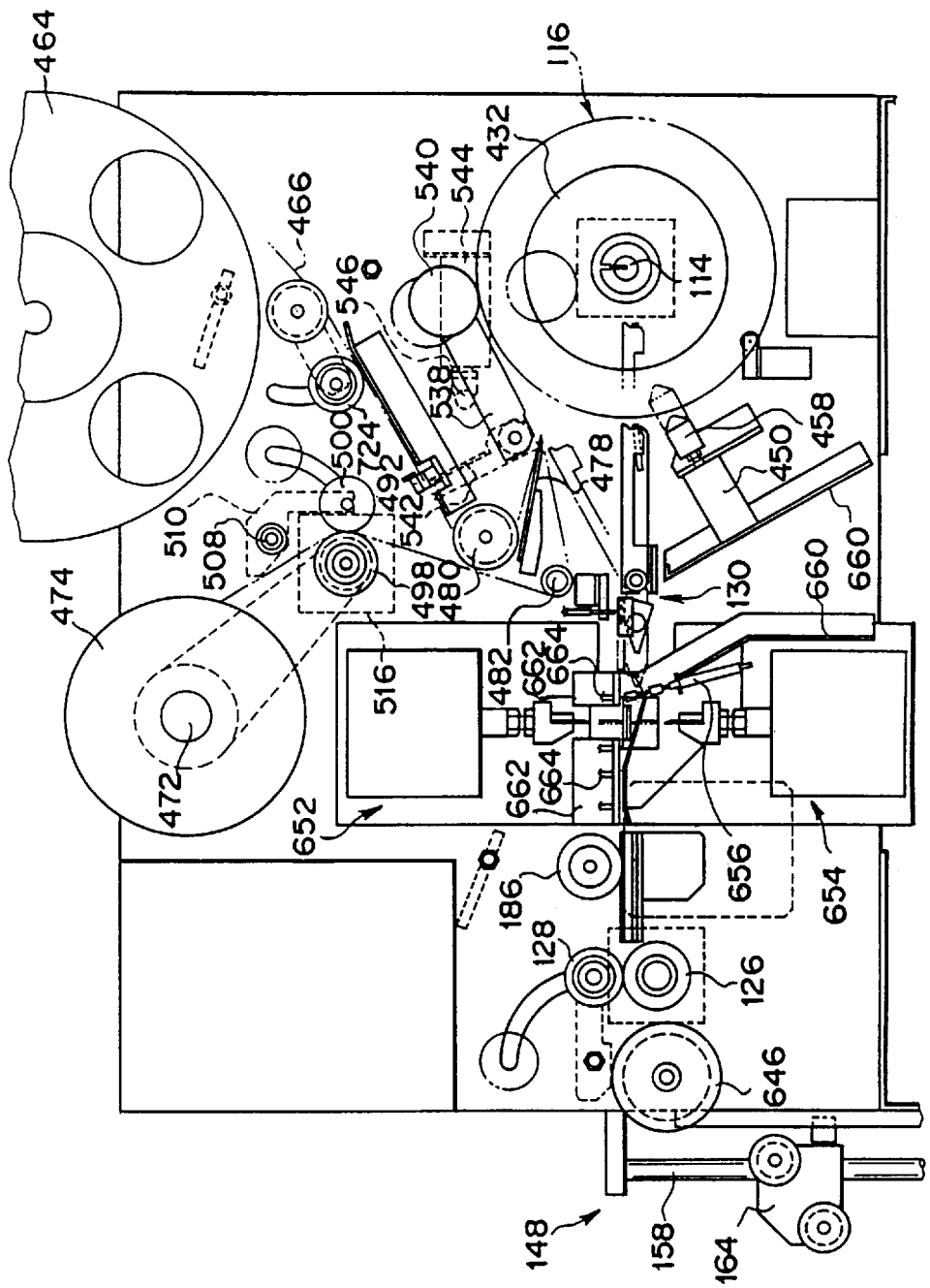
FIG. 28 is an enlarged front view of an upper casing of the tape winding apparatus shown in FIG. 27.

As shown in FIG. 27 that is a front view of the tape winding apparatus and FIG. 28 that is an enlarged front view of an upper casing of the tape winding apparatus, an upper casing 110 having a control panel 108 attached to the front surface thereof is arranged on a lower casing 106 which in turn is mounted on a floor surface 104 with the aid of a plurality of casters 100. A start switch, a stop switch, various kinds of alarm lamps, a display unit and a counter (each of which is not shown in the drawings) are arranged on the control panel 108 for properly operating the tape winding apparatus. With this construction, the tape winding apparatus can automatically be operated by actuating these switches with an operator's hand in order to assure that a tape-shaped package 112 (see FIG. 3) fed from a taping machine (not shown) is successively wound around an empty reel 116 fitted onto a reel driving shaft 114.

First, the empty reel 116 is fitted onto the reel driving shaft 114 and one of tape insert slots 120 formed through a hub core 118 (see FIG. 36) of the empty reel 116 is then indexed to a predetermined position. Subsequently, the foremost end of the tape-shaped package 112 is inserted into one of the tape insert slots 120 formed through the hub core 118 of the empty reel 116, and the tape-shaped package 112 is then wound around the reel 116 by a predetermined length by rotationally driving the reel driving shaft 114. On completion of the winding operation, a leader portion 122 (see FIG. 3) is formed at the terminal end of the tape-shaped package 112, and after an end seal 124 is adhesively connected to the terminal end of the leader portion 122, the reel 116 is detached from the reel driving shaft 14, and thereafter, a next winding operation is performed again from the beginning.

In this embodiment, to assure that a series of operations as mentioned above are automatically repeated, a pair of pinch rollers 126 and 128 for feeding the foremost end of the tape-shaped package 112 toward the reel driving shaft 114, a package fore end part guiding unit 130 for conducting the tape-shaped package 112 discharged from the pair of pinch rollers 126 and 128 to the empty reel 116 fitted onto the reel driving shaft 114 while seizing the foremost end of the tape-shaped package 112 therewith, a tape cutting unit 648 located between the pair of pinch rollers 126 and 128 and the tape-shaped package foremost end guiding unit 130 to cut only a carrier tape 134 so as to form a leader portion 122 or to cut a cover tape 154 together with a carrier tape 134, an end seal feeding unit 138 for connecting an end seal 124 to the terminal end of the leader portion 122, and a reel attaching/detaching unit 140 (see FIG. 35) are arranged in the upper casing 110. In addition, a reel receiving/delivering unit 144 (see FIG. 23) for feeding an empty reel 116 to the reel driving shaft 114 and receiving the reel 116 having a tape-shaped package 112 therearound from the reel driving shaft 114 and a reel receiving/discharging unit 146 (see FIG. 24) for feeding an empty reel 116 to the reel receiving/delivering unit 144 and receiving the reel 116 having a tape-shaped package 112 wound therearound from the reel receiving/delivering unit 144 are arranged in the lower casing 106. Additionally, to temporarily storably hold the fore end part of the tape-shaped package 11' continuously fed from the taping machine at the time when the reel 116 is attached to and detached from the reel driving shaft 114, a dancer unit 148 is displaceably arranged in such a manner as to be slidably displaced between the lower casing 106 and the upper casing 110.

In this embodiment, a label adhering unit for adhesively attaching a label 650 having various kinds of informations on a type of tape-shaped package 112, a content of each article received in the tape-shaped package 112 and other items printed thereon to one of flange portions 456 of the reel 116 having the tape-shaped package 112 wound therearound is disposed at the position located sideward of the tape winding apparatus.

With respect to a taping machine to be operatively associated with the tape winding apparatus for producing a tape-shaped package 112 as shown in FIG. 3, the taping machine as described above in the preceding embodiment can be used as it is.

In this embodiment, a dancer unit 148 includes a slider 164 adapted to be slidably displaced along a guide rod 158 in the upward/downward direction, and the tape-shaped package 112 is caused to extend through the slider 164 in such a manner as to enable a speed of winding of the tape-shaped package 12 around the reel 116 caused by rotation of the reel driving shaft 114 to be automatically changed corresponding to the position of the slider 164 on the guide rod 158.

Specifically, in the case that the slider 164 is slidably displaced to the lowermost end of the guide rod 158, the winding speed of the tape-shaped package 112 is increased to assume a preset highest speed, causing the position of the slider 164 to be quickly raised up. On the contrary, in the case that the slider 164 is slidably displaced to the uppermost end of the guide rod 158, the winding speed of the tape-shaped package 112 is reduced to assume a lowest speed, causing the position of the slider 164 to be quickly lowered. Thus, when it is required that the slider 164 is held at the intermediate position of the guide rod 158, the rotational speed of the reel driving shaft 114 is correspondingly adjusted.

A pair of pinch rollers 126 and 128 are disposed rightward of a tape-shaped package introduction pulley 646 rotatably mounted on the upper casing 110 at the left-hand end of the latter in order to convey the tape-shaped package 112 toward the reel driving shaft 114 side. The structure of the pair of pinch rollers 126 and 128 is entirely same to that shown in FIG. 11 that is a sectional view taken along line 11—11 in FIG. 10.

In addition, a pin roller 186 is disposed rightward of the pair of pinch rollers 126 and 128, and the sectional structure of the pin roller 186 is entirely same to that shown In FIG. 7 and FIG. 8 that is an enlarged sectional view of a section represented by an arrow-shaped mark of 8 in FIG. 7.

Figure 29:
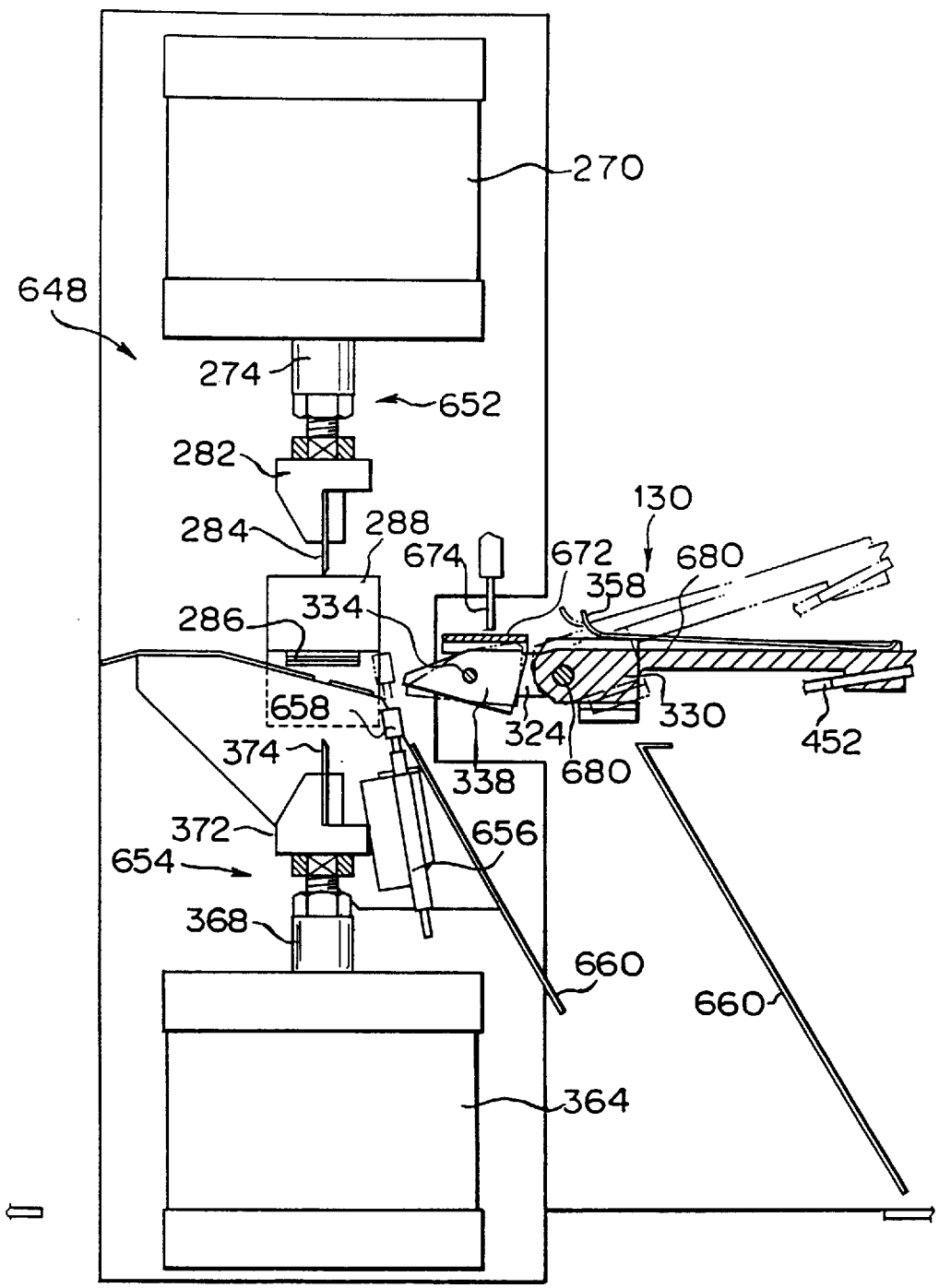
FIG. 29 is an enlarged front view of a tape cutting unit arranged for the tape winding apparatus.
Figure 30:
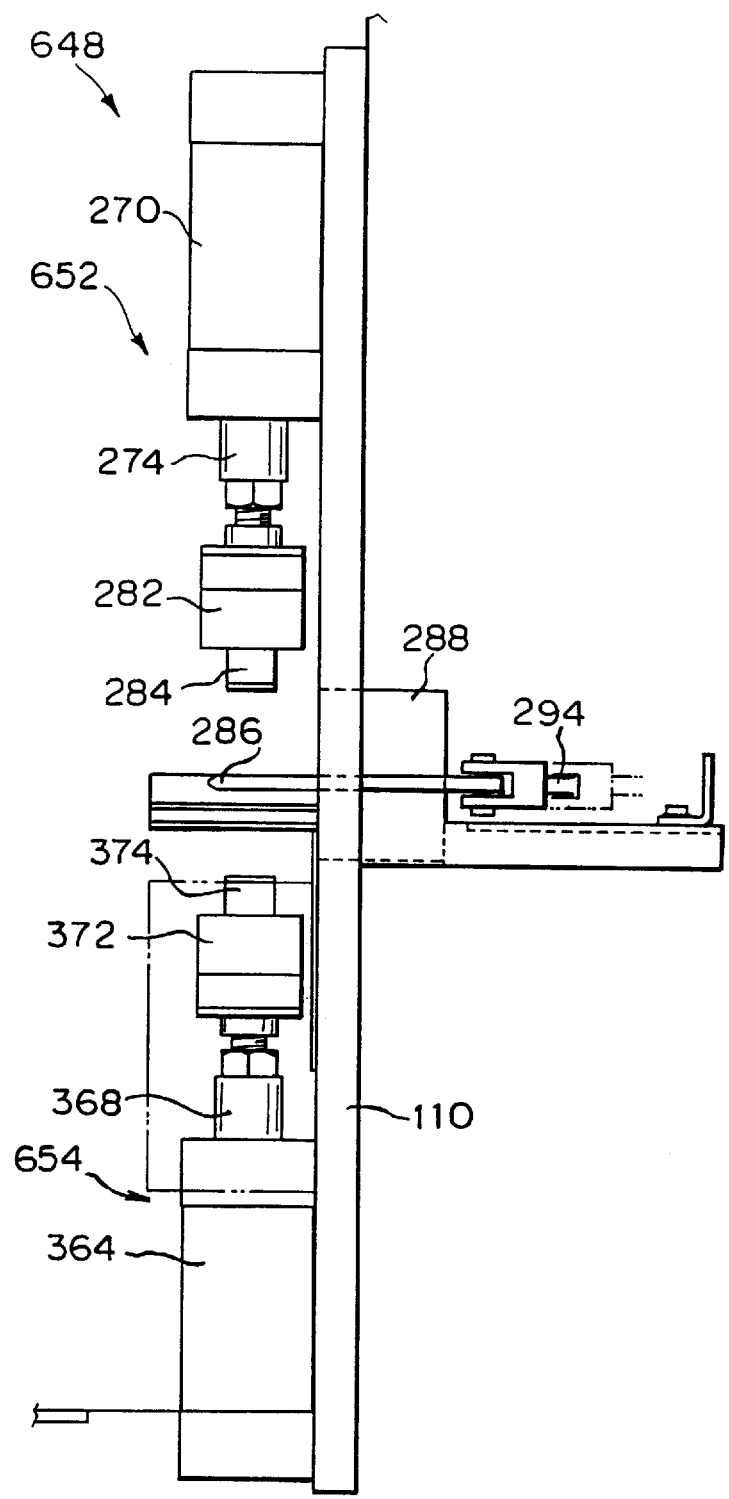
FIG. 30 is a side view of the tape cutting unit as seen from the right-hand side in FIG. 29.

FIG. 29 shows by way of sectional view the structure of a tape cutting unit 648 arranged rightward of the pin roller 186, and moreover, FIG. 30 shows by way of side view the structure of the tape cutting unit 648 as seen from the right-hand side of FIG. 29.

Specifically, a tape-shaped package cutter 652 and a carrier tape cutter 654 are disposed in the tape cutting unit 648 in the opposing relationship while a conveyance path for the tape-shaped package 112 is interposed therebetween. The tape-shaped package cutter 652 adapted to be actuated in the downward direction includes a knife driving air cylinder 270 of which piston rod 274 is firmly equipped with a cutter knife 284 via a cutter holder 282 so as to cut a cover tape 154 of the tape-shaped package 112 therewith. On the other hand, the carrier tape cutter 654 adapted to be actuated in the upward direction likewise includes a knife driving air cylinder 364 of which piston rod 368 is firmly equipped with a cutter knife 374 via a cutter holder 372 so as to cut a carrier tape 134 of the tape-shaped package 112 therewith.

As is best seen in FIG. 30, a plate-shaped knife receiver 286 adapted to be projected in the hollow space defined between both the cutter knives 284 and 374 from the rear side of the upper casing 110 is slidably held by a knife receiver holder 288 fixedly secured to the rear surface of the upper casing 110 so as to be slidably displaced in the horizontal direction (i.e., in the leftward/rightward direction as seen in FIG. 30) while it is operatively connected to a cutter receiver driving cylinder (not shown). Before the piston rod 274 of the knife driving air cylinder 270 is driven in the downward direction and the piston rod 368 of the knife driving air cylinder 364 is driven in the upward direction, a piston rod 294 of a knife receiver driving air cylinder (not shown) is linearly driven in the forward direction, causing the fore end part of the knife receiver 286 to be inserted into a gap formed between the carrier tape 134 and the cover tape 154 of the tape-shaped package 112 by way of steps to be described later, in order to receive the thrusting force of each of the cutter knives 284 and 374 therewith. Incidentally, the carrier tape 134 and the cover tape 154 are not still fused to each other at this time.

A tape projecting cylinder 656 adapted to be actuated in the upward direction is disposed rightward of the carrier tape cutter 654 so as to enable the knife receiver 286 to be projected directly below the carrier tape 134 by forcibly raising up the carrier tape 134 to the package cutter 652 side in excess of the knife receiver 286.

When the tape-shaped package cutter 652 and the carrier tape cutter 654 of the tape cutting unit 648 are actuated to cut the cover tape 154 and the carrier tape 134, the reel driving shaft 114 is temporarily immovably held together with the reel 116. Subsequently, after the carrier tape cutter 654 is actuated, the reel driving shaft 114 is rotationally driven again to wind the cover tape 154 around the reel 116 by a predetermined length so as to allow a part of the cover tape 154 to serve as a leader portion 122. Thereafter, the piston rod 294 of the cutter receiver driving cylinder is retracted in the rearward direction, causing the knife receiver 286 to be retracted inside of the upper casing 110. At this time, the carrier tape 134 held in the suspended state in the downward direction due to its own dead weight is raised up by expanding the piston rod 658 of the tape projecting cylinder 656 again, and subsequently, the knife receiver 286 is displaced in the forward direction to reach the position directly below the carrier tape 134. Thereafter, the tape-shaped package cutter 652 is actuated to cut the cover tape 154 and the carrier tape 134 at the same time.

When the tape-shaped package cutter 652 is actuated, a cut piece of the carrier tape 134 falls down away from the tape-shaped package 112. To discharge the foregoing cut piece of the carrier tape 134 to a predetermined location on the lower casing 106 side, a cut tape piece discharging chute 660 is disposed at the lower part of the upper casing 110 adjacent to the tape cutting unit 648. It should be noted that the structure of the tape cutting unit 648 should not be limited only to the aforementioned one but any other type of hitherto known structure may be employed for the tape cutting unit 648.

In contrast with the second aspect of the present invention as mentioned above, according to a third aspect of the present invention, the tape-shaped package cutter 652 serves as a cutter for cutting only the cover tape 154, and moreover, it can cut both the cover tape 154 and the carrier tape 134 without any necessity for actuating the tape projecting cylinder 656. Specifically, when the tape cutting unit 648 is actuated to cut both the cover tape 154 and the carrier tape 134, the knife receiver 286 is inserted between the cover tape 154 and the carrier tape 134, and while the foregoing state is maintained, the carrier tape cutter 654 is actuated to cut the carrier tape 134. Subsequently, after the reel driving shaft 114 is rotationally driven to wound the cover tape 154 around the reel 116 by a predetermined length so as to allow a part of the cover tape 154 to serve as a leader portion 122, the tape-shaped package cutter 652 and the carrier tape cutter 654 are successively actuated to cut the cover tape 154 with the tape-shaped package cutter 652, and moreover, cut the carrier tape 134 with the carrier tape cutter 654.

A pair of cover tape sucking blocks 662 are firmly secured to upper casing 110 while they are disposed along a conveyance path of the tape-shaped package 112 at the positions directly above the foregoing conveyance path in such a manner that one of them is located before the tape cutting unit 648 and the other one is located behind the same. A plurality of suction holes 664 are formed through each of the cover tape sucking blocks 662 in order to bring the tape-shaped package 112 in contact with close contact with the lower surface of each cover tape sucking block 662 by the air suction force induced by the suction of air through the suction holes 664 while the tape-shaped package 112 slidably moves along the lower surface of each cover tape sucking block 662, and the respective suction holes 664 are communicated with a suction pump (not shown). Thus, as the suction pump is driven, the cover tape 154 is brought in close contact with the lower surface of each cover tape sucking block 662, and the suction pump is continuously driven for a period of time that elapses from the time when the leader portion 122 is formed to the time when the cover tape 154 passes past a tape confirming sensor 666 to be described later.

In this embodiment, the cover tape sucking blocks 662, the suction holes 664 and the suction pump are used as cover tape sucking means. However, it of course is obvious that other type of structure applicable to these components rather than the aforementioned one may be employed for the same purpose, provided that the cover tape 154 of the tape-shaped package 112 can reliably be brought in the sucked state when the tape-shaped package cutter 652 is actuated.

Figure 31:
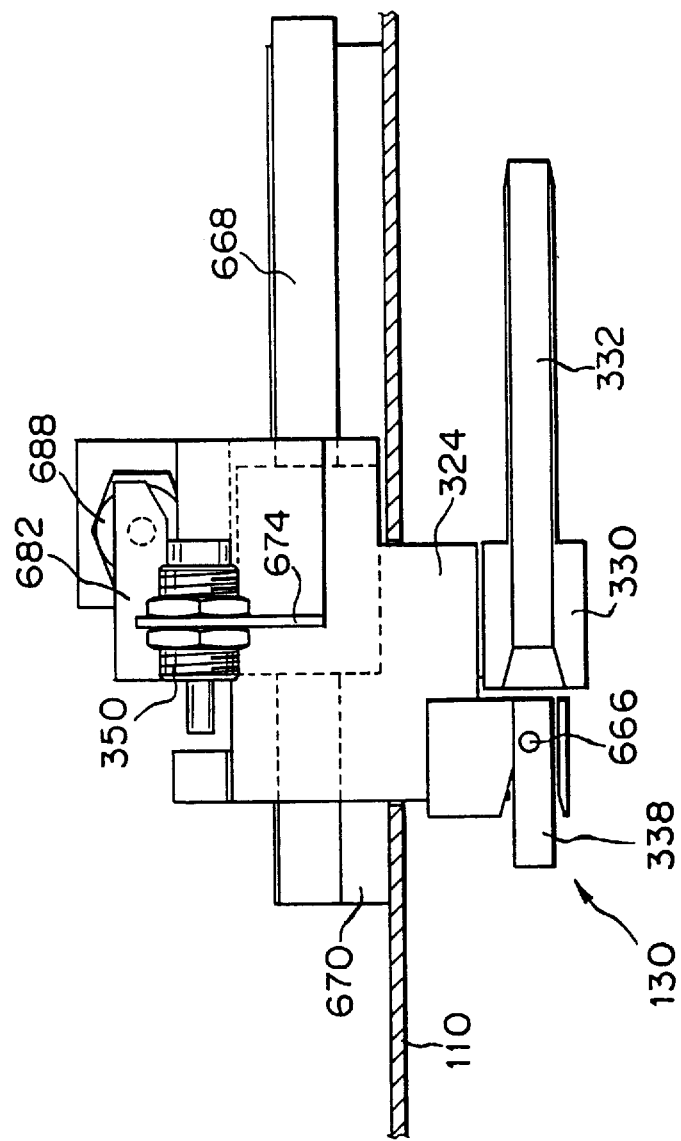
FIG. 31 is a plan view of a tape-shaped package foremost end guiding unit arranged for the tape winding apparatus.
Figure 32:
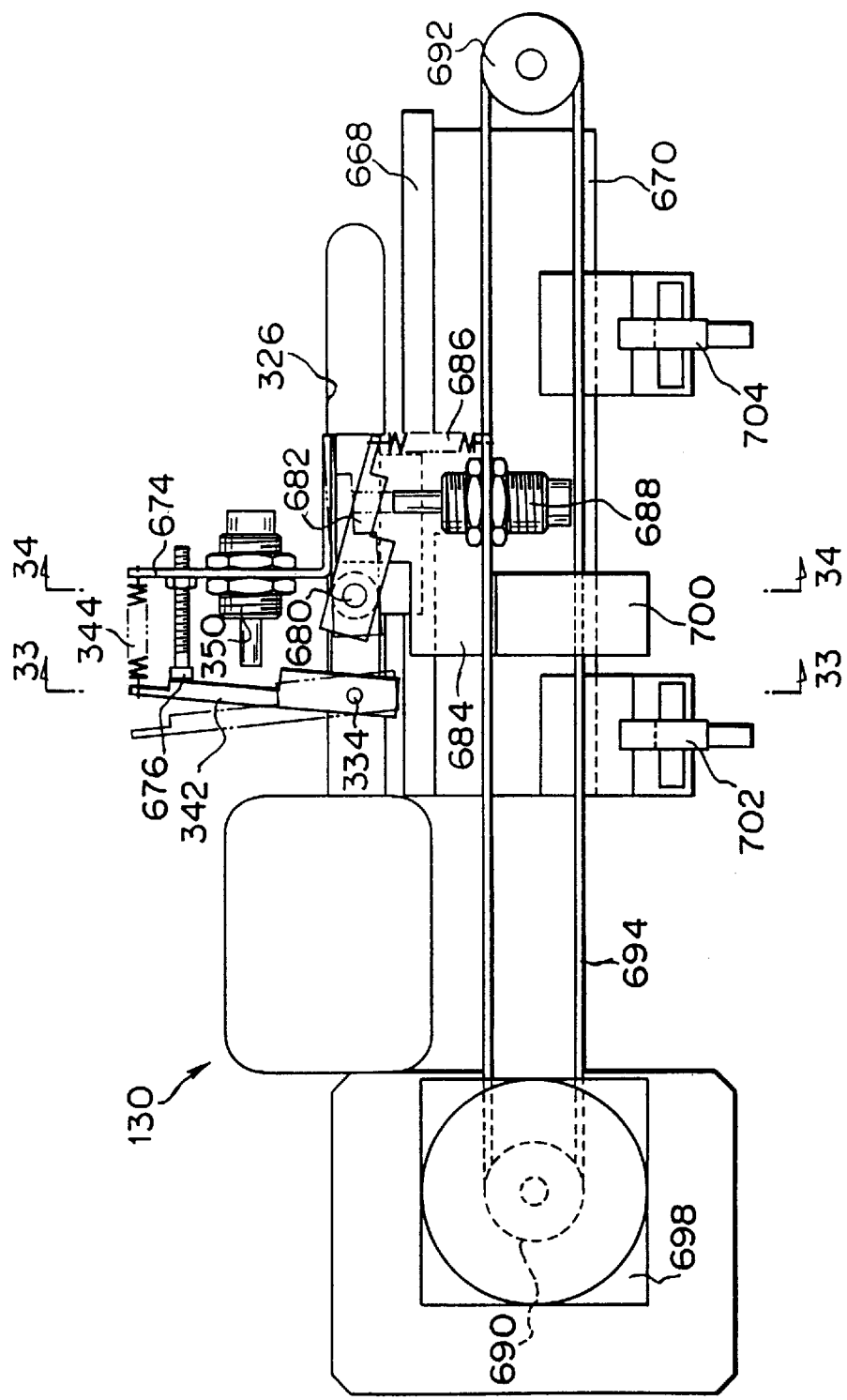
FIG. 32 is a front view of a driving mechanism for the tape-shaped package foremost end guiding unit shown in FIG. 31.
Figure 33:
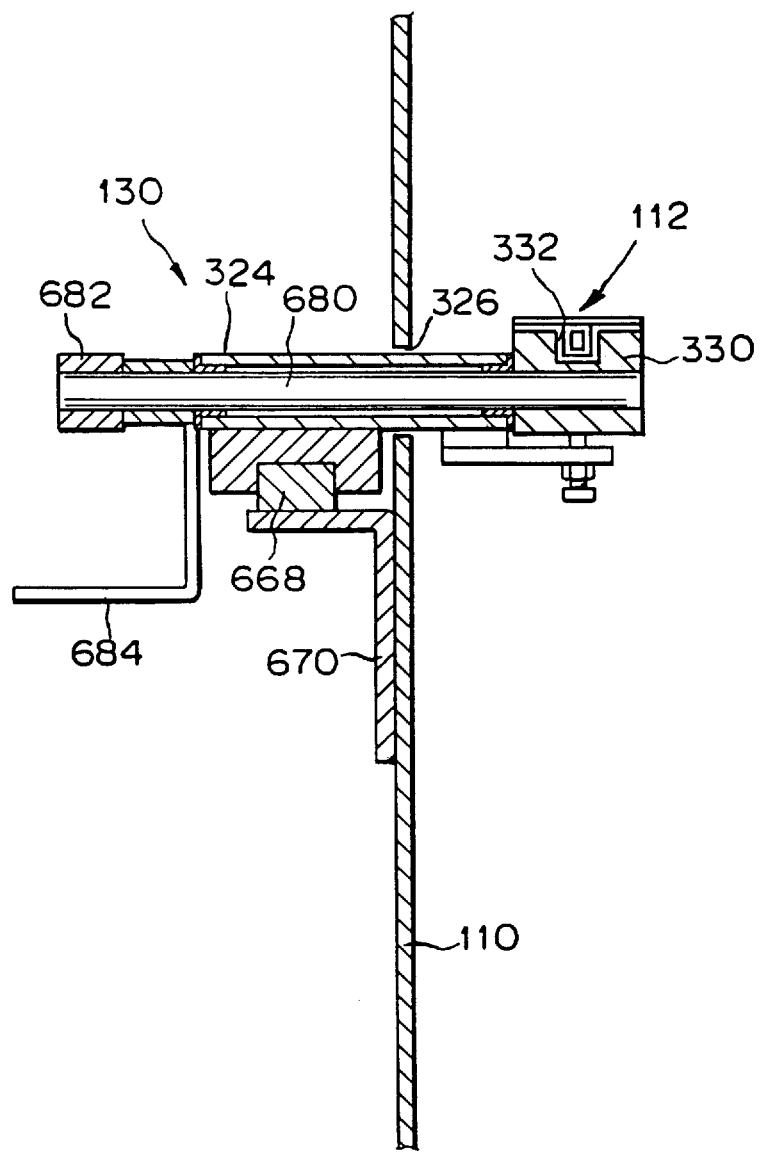
FIG. 33 is a sectional view of the driving mechanism taken along line 33—33 in FIG. 32.
Figure 34:
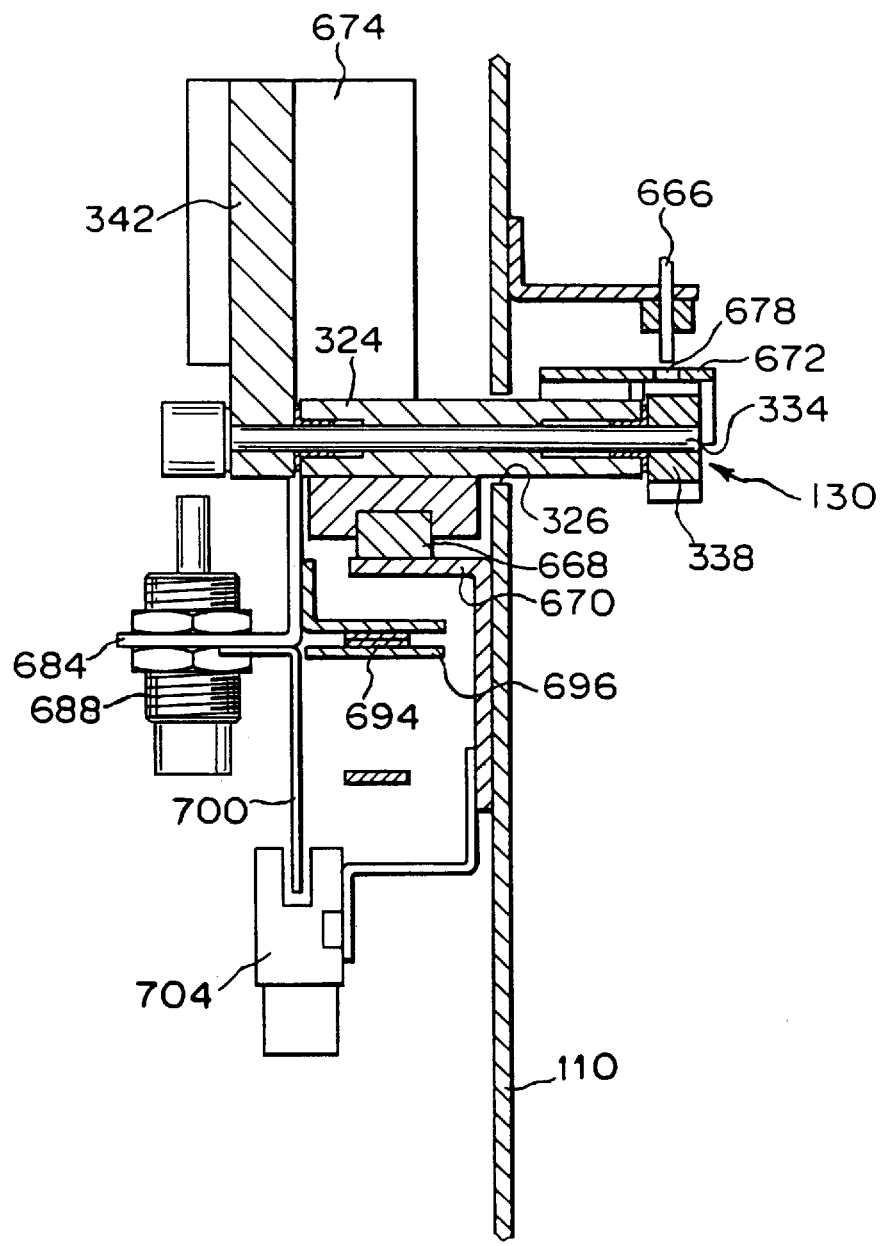
FIG. 34 is a sectional view of the driving mechanism taken along line 34—34 in FIG. 32.

FIG. 31 schematically shows by way of plan view the structure of a tape-shaped package foremost end guiding unit 130 for conducting the tape-shaped package 112 discharged from the pair of pinch rollers 126 and 128 to the empty reel 116 fitted onto the reel driving shaft 114 while seizing the foremost end of the tape-shaped package 112 therewith, FIG. 32 shows by way of front view the structure of a driving mechanism for driving the tape-shaped package foremost end guiding unit 130, FIG. 33 shows by way of sectional view the driving mechanism for driving the tape-shaped package foremost end guiding unit 130 taken along line 33—33 In FIG. 32, and FIG. 34 shows by way of sectional view the driving mechanism for driving the same taken along line 34—34 in FIG. 32.

Specifically, the opposite ends of a slider guide rail 668 extending in the direction in parallel with the line extending from the tape cutting unit 648 to the reel driving shaft 114 are held between the tape cutting unit 648 and the reel driving shaft 114 on the rear side of the upper casing 110 with the aid of a bracket 670. A slider 324 inserted through an opening portion 326 formed through the upper casing 110 in parallel with the slider guide rail 668 and having the fore end part thereof projected on the front side of the upper casing 110 is slidably engaged with the slider guide rail 668. A clamp block 338 and a tape-shaped package guide arm 330 are assembled with the slide 324 at the fore end part of the latter.

The clamp block 338 is firmly secured to one end of a clamp turn shaft 334 which rotatably extends through the slider 324 in the horizontal direction at a right angle relative to the conveying direction of the tape-shaped package 112, and a receiving plate portion 672 facing to the upper surface of the clamp block 338 with a gap held therebetween is formed integral with the slider 324. In addition, a clamp lever 342 is firmly connected to the other end of the clamp turn shaft 334, and a tension coil spring 344 is bridged between the foremost end of the clamp lever 342 and the foremost end of a bracket 674 disposed on the slider 324. With this construction, a gap is formed between the clamp block 338 and the receiving plate portion 672 by the resilient force of the tension coil spring 344 as represented by solid lines in FIG. 29 so that the tape-shaped package 112 passes through the gap formed between the clamp block 338 and the receiving plate portion 672.

To properly maintain the gap between the clamp block 338 and the receiving plate portion 674 in such a manner as to allow it to assume an adequate magnitude, a lever stopper 676 is threadably attached to the bracket 674. In addition, to assure that a magnitude of the gap between the clamp block 338 and the receiving plate portion 672 is reduced as represented by phantom lines in FIG. 29 by turning the clamp lever 342 in the anticlockwise direction against the resilient force of the tension coil spring 344 with an operator's hand to assume the state as represented by phantom lines in FIG. 32, an air cylinder 350 is firmly fitted to the bracket 674 to hold the fore end part of the tape-shaped package 112 between the clamp block 338 and the receiving plate portion 672 in the clamped state.

Additionally, to detect whether or not the tape-shaped package 112 is caused to pass through the gap between the clamp block 338 and the receiving plate portion 672, a tape confirming sensor 666 is disposed directly above the receiving plate portion 672. When the tape confirming sensor 666 detects the fore end part of the tape-shaped package 112, the air cylinder 350 is actuated, causing the fore end part of the tape-shaped package 112 to be firmly held between the clamp block 338 and the receiving plate portion 672 in the clamped state.

On the other hand, the tape-shaped package guide arm 330 having a tape-shaped package guide groove 332 formed thereon to slidably hold the tape-shaped package 112 on the upper surface thereof is firmly fitted onto an arm turn shaft 680 which rotatably extends through the slider 324 in the horizontal direction at a right angle relative to the direction of conveyance of the tape-shaped package 112. To retain the tape-shaped package 112 slidably moving along the tape-shaped package guide groove 332 so as not to allow the tape-shaped package 112 to be floated up from the tape-shaped package guide groove 332, the base end part of a leaf spring 358 is secured to the base end part of the tape-shaped package guide arm 330 by tightening screws. In addition, a turn lever 682 is firmly fitted onto the arm turn shaft 680, and a tension coil spring 686 is spanned between the foremost end of the turn lever 682 and a bracket 684 disposed on the slider 324. With this construction, the tape-shaped package guide arm 330 is horizontally oriented toward the reel driving shaft 114 by the resilient force of the tension coil spring 686 as represented by solid lines in FIG. 28, whereby the foremost end of the tape-shaped package 112 can correctly be conducted to one of tape insert slots 120 formed through a hub core 118 of the reel 116.

To detect one of the tape insert slots 120 formed through the hub core 118 of the reel 116, an insert slot detecting sensor 452 is disposed on the lower surface of the tape-shaped package guide arm 330 at the foremost end of the latter. To this end, first, while the tape-shaped package guide arm 330 is held at the package delivering position, the foremost end of the tape-shaped package guide arm 330 is located near to the hub core 118 of the reel 116 while facing to the same. Subsequently, the reel 116 is rotationally driven together with the reel driving shaft 114 at a low rotational speed. When the insert slot detecting sensor 452 detects one of the tape insert slots 120 formed through the hub core 118 of the reel 116 while the foregoing rotating state is maintained, a detection signal is outputted from the insert slot detecting sensor 452 to a controlling unit (not shown) for a reel driving stepping motor 430 to be described later. In response to the detection signal outputted from the insert slot detecting sensor 452, the controlling unit controls the rotation of the reel driving shaft 114 in such a manner that after the reel driving shaft 114 is rotated by a predetermined angle, the rotation of the reel driving shaft 114 is interrupted, causing the tape-shaped package guide groove 322 of the tape-shaped package guide arm 330 to be linearly aligned with one of the tape insert slots 120 formed through the hub core 118 of the reel 116.

To assure that the foremost end of the tape-shaped package 112 is properly received in the tape-shaped package guide groove 332 of the tape-shaped package guide arm 330, a tape insert guiding air cylinder 688 is disposed at the tape-shaped package receiving position so as to turnably tilt the tape-shaped package guide arm 330 as represented by phantom lines in FIG. 29. In addition, to assure that the tape-shaped package 12 is properly delivered between the upper surface of the clamp block 338 and the receiving plate portion 672 as the fore end part of the tape-shaped package 112 is fed in the forward direction, a tape projecting cylinder 656 is disposed at the position between the clamp block 338 located at the tape-shaped package receiving position and the knife receiver 286 of the tape cutting unit 648 so as to allow the fore end part of the tape-shaped package 112 to be temporarily raised up by a piston rod 658 of the tape projecting cylinder 656.

A pair of toothed pulleys 690 and 692 are rotatably disposed at the opposite ends of the slider guide rail 668 as seen in the longitudinal direction of movement of the slider 340 so that an endless toothed belt 694 is bridged between both the toothed pulleys 690 and 692 while extending around them. The slider 324 is operatively connected to the endless toothed belt 694 via a connecting member 696, and a guide unit driving stepping motor 698 mounted on the upper casing 110 is operatively connected to one of the toothed pulleys 690 and 692, i.e., the toothed pulley 690.

Thus, the slider 324 can be displaced along the slider guide rail 668 in the rightward/leftward direction as seen in FIG. 32 via the endless toothed belt 694 by rotationally driving the guide unit driving stepping motor 698. To assure that the slider 324 is stopped not only at the tape-shaped package receiving position but also at the tape-shaped package delivering position, a receiving switch 702 and a delivering switch 704 are disposed at predetermined positions as seen in the longitudinal direction of movement of the slider 324 for the purpose of interrupting the rotation of the guiding unit driving stepping motor 698 by detecting a plate-shaped dog 700 projected downward of the slider 324. Specifically, when the dog 700 is detected by the receiving switch 702, the rotation of the guiding unit driving stepping motor 698 is interrupted, whereby the slider 324 is located at the tape-shaped package receiving position in the vicinity of the tape cutting unit 648. In addition, when the dog 700 is detected by the delivering switch 704, the rotation of the guiding unit driving stepping motor 698 is interrupted, whereby the foremost end of the tape-shaped package guide arm 330 is received in the hollow space defined by the flange portions 456 of the reel 116 so that it is located at the tape-shaped package delivering position facing to the outer periphery of the hub core 118 of the reel 116.

As the tape-shaped package 116 is increasingly wound around the reel 116, the guiding unit driving motor 698 is gradually displaced from the tape-shaped package delivering position toward the package receiving position in the rearward direction so that the distance between the foremost end of the tape-shaped package guide arm 330 and the outer periphery of the tape-shaped package 112 wound around the reel 116 is kept substantially constant. To prevent any occurrence of a malfunction that the foremost end of the tape-shaped package guide arm 330 collides against the flange portions 465 of the reel 116 during the displacement of the tape-shaped package guide arm 330 from the tape-shaped package receiving position to the tape-shaped package delivering position, a flange widening air cylinder 450 including a flange widening member 458 (see FIG. 8) is arranged in the upper casing 110 at the position below the tape-shaped package foremost end guiding unit 130 so as to resiliently enlarge a distance between both the flange portions 456 of the reel 116.

Specifically, when a rotational phase of the reel 116 fitted onto the reel driving shaft 114 is correctly indexed in order to assign the foremost end of the tape-shaped package 112 to one of the tape insert slots 120 formed through the hub core 114 of the reel 116, the flange widening air cylinder 450 is actuated so as to allow the flange widening member 458 to be projected toward the reel 116 side, causing a distance between both the flange portions 456 to be enlarged by the wedge-shaped foremost end part of the flange widening member 458. Subsequently, when the guide unit driving stepping motor 698 is rotationally driven while the foregoing state is maintained, the fore end part of the tape-shaped package guide arm 330 is brought in the hollow space of the reel 116, and thereafter, the flange widening member 458 is retracted away from the reel 116 by actuating the flange widening air cylinder 450 again. While this state is maintained, a next rotational phase of the reel 115 can be indexed.

Figure 35:
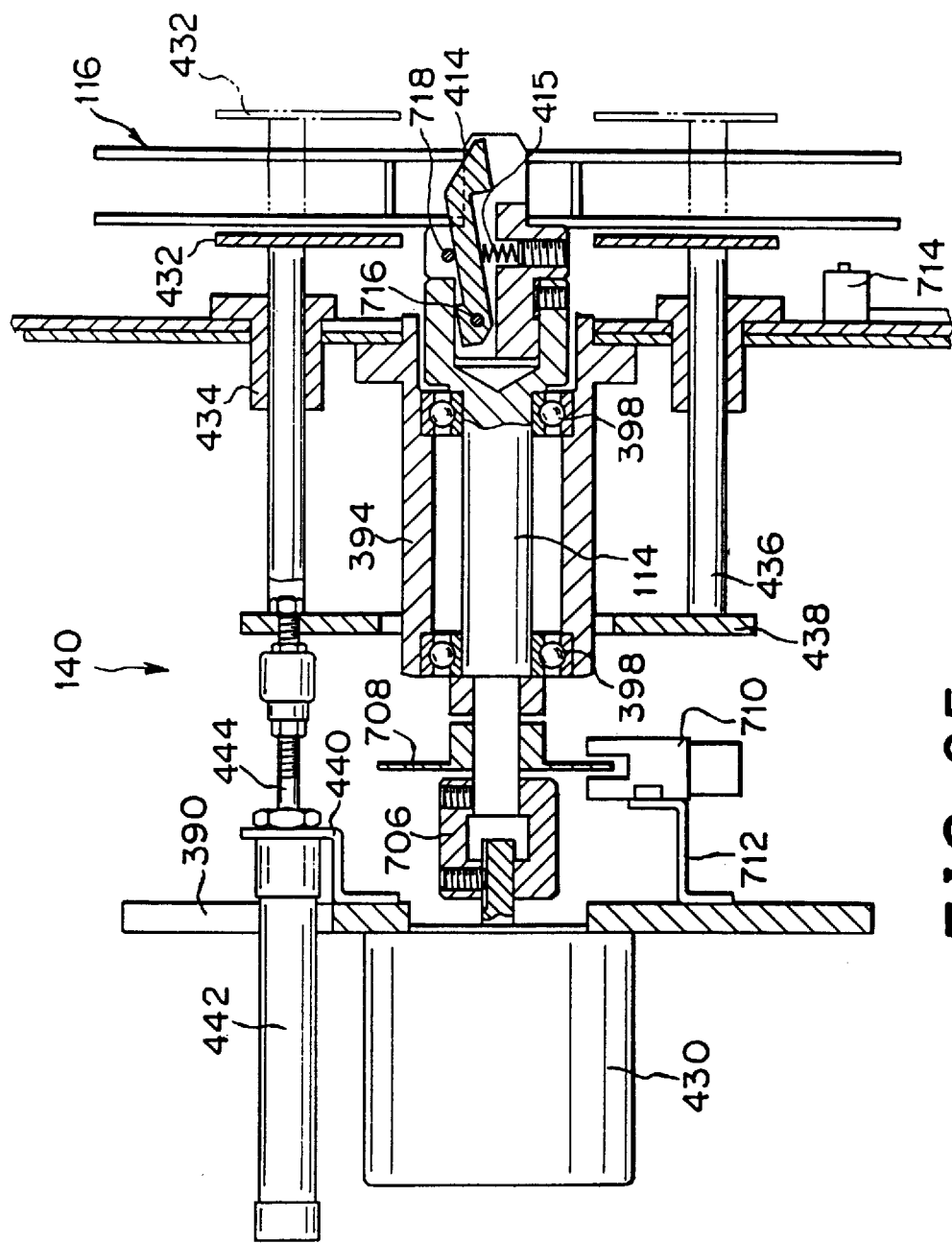
FIG. 35 is an enlarged sectional view of a reel driving shaft section arranged for the tape winding apparatus.

FIG. 35 shows by way of sectional view the structure of a reel attaching/detaching unit 140 for the tape winding apparatus constructed in accordance with this embodiment of the present invention.

Specifically, a subframe 390 having a heavy thickness is immovably arranged inside of the upper casing 110 while extending in parallel with the upper casing 110. The righthand end of a cylindrical driving shaft holder 394 is firmly fastened to the upper casing 110 while the cylindrical driving shaft holder 394 is located between the upper casing 110 and the subframe 390, and the reel driving shaft 114 is rotatably supported by a pair of bearings 398 while extending through the driving shaft holder 394. A reel driving stepping motor 430 is operatively connected to the left-hand end of the reel driving shaft 114 via a joint 706. As the reel driving motor 430 is rotationally driven, the reel 116 fitted onto the reel driving shaft 114 is rotated. In addition, a disc 708 having a number of radially extending cutouts formed along the outer periphery thereof is firmly fitted onto the left-hand end part of the reel driving shaft 114, and a reel rotational position indexing sensor 710 is fastened to the subframe 390 via a bracket 712 in order to index the rotational phase of the reel 116 relative to the reel driving shaft 114 to a predetermined position by detecting a quantity of rotation of the disc 708.

In response to a detection signal outputted from the encoder 188, the insert slot detecting sensor 452, the receiving switch 702, the delivering switch 704, the reel rotational position indexing sensor 710 or a cutout detecting sensor 714 to be described later, the controlling unit (not shown) can arbitrarily change the present rotational speed of the reel driving shaft 114 to another one in conformity with a command issued therefrom. Basically, the controlling unit controls the rotation of the reel driving shaft 114 in such a manner that the reel driving shaft 114 is rotated at a low rotational speed at the time of winding of the tape-shaped package 112 around the reel 116 as well as directly before completion of the winding operation, it is rotated at a high rotational speed for a period of time other than the aforementioned one, and the rotation of the reel driving shaft 114 is interrupted when the reel 116 is exchanged with another one.

An engagement pawl 414 adapted to be engaged with one of engagement grooves 412 formed along the reel hole 408 at the central part of the reel 116 is turnably disposed at the right-hand end part of the reel driving shaft 114 to turn about a pin 716 in the radial direction (i.e., in the upward/downward direction as seen in FIG. 35), and the fore end part of the engagement pawl 414 is normally biased in the radial direction (i.e., in the upward direction as seen in FIG. 35) by the resilient force of a compression coil spring 415 received in the right-hand end of the reel driving shaft 114. However, a largest quantity of turning movement of the engagement pawl 414 in the upward direction is restrictively limited by a stopper 718. With this construction, when the engagement pawl 414 is not correctly aligned with the engagement groove 412, the fore end part of the engagement pawl 414 is forcibly retracted inside of the outer peripheral surface of the reel driving shaft 114 but when the engagement pawl 414 is correctly aligned with the engagement groove 412, the fore end part of the engagement pawl is turnably projected outside of the outer peripheral surface of the reel driving shaft 114 to come in engagement with the engagement groove 412, whereby the reel 116 is followably rotated by the reel driving shaft 114.

To detach the reel 116 having a tape-shaped package 112 wound therearound away from the reel driving shaft 114, an annular thrusting plate 432 is disposed in the concentrical relationship relative to the reel driving shaft 114 in such a manner as to surround the latter therewith, and a plurality of guide rods 436 are firmly secured to the rear surface of the reel thrusting plate 432 while slidably extending through a plurality of guide bushes 434 fitted to the upper casing 110. The left-hand ends of the guide rods 436 are fixed to an annular connecting plate 438 disposed in such a manner as to surround the driving shaft holder 394 with the annular connecting plate 438, and a piston rod 444 of a reel discharging air cylinder 442 fastened to the subframe 390 via a bracket 440 is operatively connected to the annular connecting plate 438.

With this construction, when the reel discharging air cylinder 442 is actuated so as to allow the piston rod 444 to be expanded, the reel thrusting plate 432 located at the retracted position as shown in FIG. 35 is displaced in the forward direction to reach a position represented by phantom lines in the drawing, whereby the reel 116 fitted onto the reel driving shaft 114 is thrusted to a reel receiving/delivering shaft 416 as the above-mentioned first embodiment which is located opposite to the reel driving shaft 114.

Figure 36:
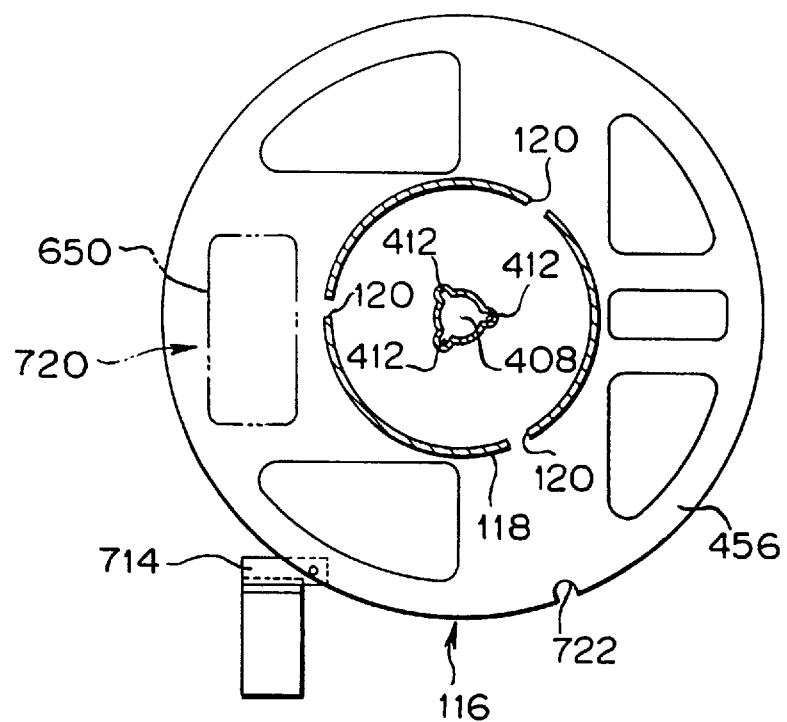
FIG. 36 is an exploded front view of a reel fitted onto the reel driving shaft, showing the inner structure of the reel.

In this embodiment, as shown in FIG. 35 and FIG. 36 which shows by way of front view the appearance of the reel 116, because of a necessity for adhering a label 650 to a label adhering portion 720 formed on one of the flange portions 456 of the reel 116 with the aid of a label adhering unit to be described later, a cutout portion detecting sensor 714 is secured to the upper casing 110 for the purpose of detecting a cutout portion 722 formed on the outer periphery of one of the flange portions 456 of the reel 116. When the cutout portion detecting sensor 714 detects the cutout portion 722 formed on the flange portion 456 of the reel 116, a detecting signal is inputted into the controlling unit (not shown) for the reel driving stepping motor 430. In response to the detecting signal outputted from the cutout portion detecting sensor 714, the controlling unit serves to rotate the reel driving shaft 114 by a predetermined angle, and thereafter, interrupt the rotation of the reel driving shaft 114. Thus, when the reel 116 is conveyed to the label adhering unit with the aid of the reel receiving/delivering unit 144 while the foregoing state is maintained, a desired label adhering position on the flange portion 456 of the reel 116 can exactly be indexed for a label 650 to adhere thereto.

It should be noted that the structure of the reel attaching/detaching unit 140 should not be limited only to the aforementioned one constructed in accordance with this embodiment buy any other type of hitherto known structure may be employed for the reel attaching/detaching unit 140.

As shown in FIG. 28, an end seal feeding reel 464 is rotatably and detachably disposed at the upper end of the upper casing 110 for an end seal feeding unit 138 which serves to adhesively connect an end seal 124 to the terminal end of a leader portion 122, and a release liner 466 having a plurality of ribbon-shaped end seals 124 adhesively attached thereto in the equally spaced relationship is wound around the end seal feeding reel 464. A release liner winding shaft 472 is rotatably fitted to the upper casing 110 at the position leftward of the end seal feeding reel 464 so that the used release liner 466 is wound around the release liner winding shaft 472.

To peel an end seal 124 away from the release liner 466 at the foremost end of the end seal 124, a wedge-shaped peeling plate 478 is firmly secured to the upper casing 110 at the position located above the tape-shaped package guide arm 330 disposed at the tape-shaped package receiving position of the tape-shaped package foremost end guiding unit 130, and a pair of retaining rollers 480 and 482 are rotatably disposed on the upper casing 110 in such a manner that the first retaining roller 480 is located above the wedge-shaped peeling plate 478 and the second retaining roller 482 is located below the same. With such construction, as the release liner 466 is unwound from the end seal feeding reel 464, it is delivered to the release liner winding shaft 472 via the first retaining roller 480, the wedge-shaped peeling plate 478 and the second retaining roller 482. At this time, since the direction of conveyance of the release liner 466 is sharply changed at the foremost end of the wedge-shaped peeling plate 478, each end seal 124 is reliably peeled away from the release liner 466, causing it to be projected forward of the foremost end of the wedge-shaped peeling plate 478.

A tape retaining roller 724 for depressively retaining the release liner 466 and an end seal detecting sensor 492 located downstream of the tape retaining roller 724 for detecting whether an end seal 124 is adhesively attached to the release liner 466 or not are arranged between the end seal feeding reel 464 and the first retaining roller 480, and the tape retaining roller 724 is rotatably supported on the upper casing 110. In addition, a pair of pinch rollers 498 and 500 are arranged between the second retaining roller 482 and the release liner winding shaft 472 for holding the release liner 466 in the clamped state therebetween. One of the pair of pinch rollers 498 and 500, i.e., the driving pinch roller 498 is operatively connected to a release liner driving motor 516 adapted to be intermittently rotationally driven, and the idling pinch roller 500 is rotatably supported at the foremost end of a turn lever 510 adapted to turn about a pivotal shaft 508 firmly fitted to the upper casing 110. To normally bias the idling pinch roller 500 toward the driving pinch roller 498, spring means (not shown) is disposed on the pivotal shaft 508 for the purpose of applying a certain intensity of resilient force to the turn lever 510.

The release liner driving motor 516 is intermittently rotationally driven every time a leader portion 122 is formed by actuating the tape-shaped package cutter 652 of the tape cutting unit 648. Specifically, the release liner driving motor 516 starts to be rotated at a Low rotational speed in synchronization with the rotation of the reel driving stepping motor 430 immediately after the cover tape 154 is cut by the tape-shaped package cutter 652, causing the release liner 466 to be conveyed at the speed corresponding to the speed of conveyance of the leader portion 122. When the foremost end of the end seal 124 is adhesively connected to the rearmost end of the leader portion by the adhering power of the end seal 124, and subsequently, the used release liner 466 is wound around a release liner winding reel 474 by a predetermined length, the rotation of the release liner driving motor 516 is interrupted.

Figure 37:
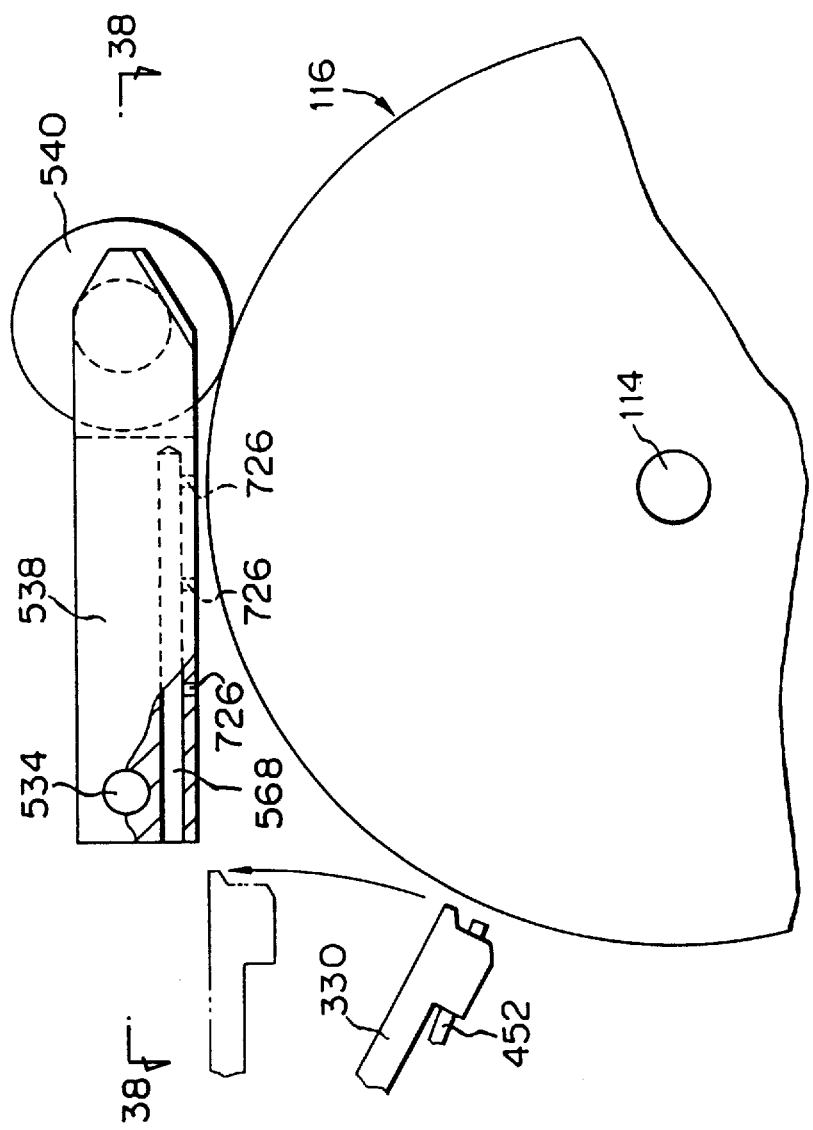
FIG. 37 is an enlarged front view of a tape retaining roller section arranged for the tape winding apparatus.
Figure 38:
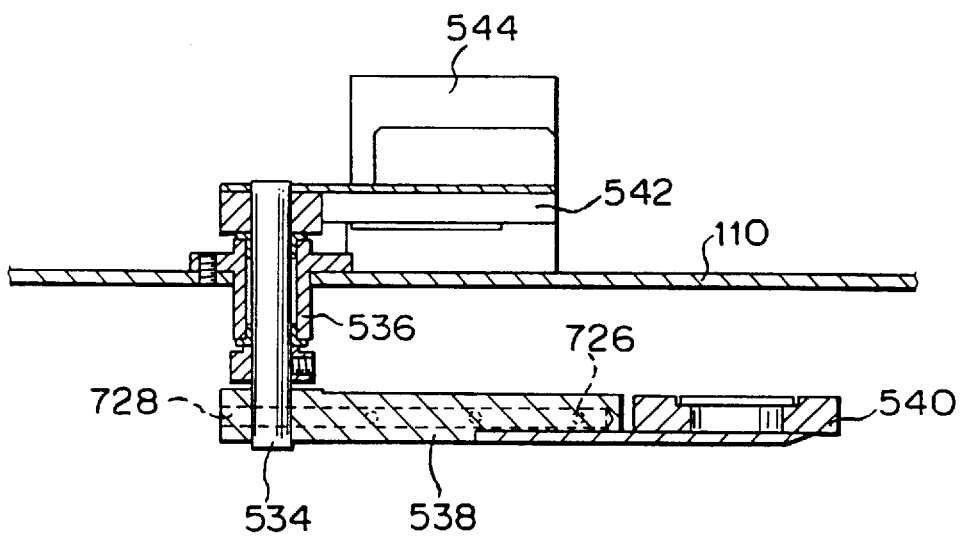
FIG. 38 is a sectional view of the tape retaining roller section taken along line 38—38 in FIG. 37.

As shown in FIG. 28, FIG. 37 and FIG. 38 that is a sectional view taken along line 38—38 in FIG. 37, a bearing bush 536 for rotatably supporting a tape retaining shaft 534 is fastened to the upper casing 110 at the position above the reel driving shaft 114 by tightening screws, and a tape retaining roller 540 adapted to be brought in the hollow space between both the flanges 456 of the reel 16 is rotatably held at the foremost end of a turn lever 538 fitted onto the tape retaining shaft 534 which extends through the upper casing 110 and the bearing bush 536. The tape retainer roller 540 is caused to turn about the tape retaining shaft 534 in the clockwise direction as seen in FIG. 37 by its own dead weight, and as the tape-shaped package 112 is wound around the reel 116, the tape retaining roller 540 serves to thrust the tape-shaped package 112 toward the outer periphery of the hub core 118 in order to prevent each end seal 124 from incorrectly adhering to the tape-shaped package 112. A plurality of suction holes 726 are formed on the surface of the turn lever 538 facing to the reel 116, i.e., the lower surface of the turn lever 538 for bringing the leader portion 122 and the end seal 124 in close contact with the suction holes 726 by the air suction force so as to prevent them from being vibratively displaced toward and away from the tape-shaped package 112 wound around the reel 116, and a suction pump (not shown) is communicated with the respective suction holes 726 via a communication path 728. With this construction, when the suction pump is driven, the leader portion 122 and the end seal 124 are wound around the reel 116 by allowing them to slidably move along the lower surface of the turn lever 538 while they are brought in close contact with the lower surface of the turn lever 538.

A retaining roller escape cylinder 544 is fastened to the inner wall surface of the upper casing 110 by tightening screws while facing to an escape lever 542 firmly fitted onto the inner end of the tape retaining shaft 534. As a piston rod 546 of the retaining roller escape cylinder 544 is expanded, the foremost end of the piston rod 546 collides against the escape lever 542. As a result, the turn lever 538 is turnably displaced away from the reel 116 together with the tape retaining roller 540 via the escape lever 542 in the anticlockwise direction as seen in FIG. 28 with the tape retaining shaft 534 as a center. Now, the reel 116 is ready to be attached to and detached from the reel driving shaft 114.

It should be noted that the structure of the end seal feeding unit 138 should not be limited only to that described above in connection with this embodiment but any other type of hitherto known structure may be employed for the end seal feeding unit 138.

The sectional structure of the reel receiving/delivering unit 144 for feeding an empty reel 116 to the reel driving shaft 114 and receiving the reel 116 having a tape-shaped package 112 wound therearound from the reel driving shaft 114 is entirely same to that as described above with respect to the preceding embodiment with reference to FIG. 23.

The label adhering unit as mentioned above is mounted on the upper end of the stocker housing 578. A label feeding reel 732 and a release liner winding reel 734 are rotatably fitted to the front surface of a casing 730 for the label adhering unit located substantially above the recovered reel storage station 576. A release liner 736 having a plurality of substantially rectangular labels 650 adhesively attached thereto in the equally spaced relationship as seen in the longitudinal direction of the release liner 736 is wound around the label feeding reel 732. In addition, a ribbon feeding reel 740 having an ink ribbon 738 wound therearound and a ribbon winding reel 742 for winding a used ink ribbon 738 therearound are rotatably arranged directly below the label feeding reel 732, and moreover, a printing head 744 for printing informations such as bar codes or the like on each label 650 is disposed below the ribbon feeding reel 740 and the ribbon winding reel 742.

A wedge-shaped peeling plate 746 for peeling each label 650 away from the release liner 736 is disposed directly below the printing head 744 with a substantially horizontal attitude, and as the release liner 736 is unwound from the label feeding reel 732, it is delivered to the release liner winding reel 734 via the printing head 744 and the peeling plate 746. Since the direction of conveyance of the release liner 736 is sharply changed at the peeling pate 746, each label 650 is reliably peeled away from the release liner 736, and thereafter, it is projected from the foremost end of the peeling plate 746 in the forward direction. During the conveyance of the release liner 736 in that way, necessary informations are printed on each label 650 by activating the printing head 744.

A printing operation driving motor (not shown) adapted to be intermittently driven is disposed in the casing 730 for the label adhering unit, and the release liner winding reel 734 and the ribbon winding reel 742 are operatively connected to the printing operation driving motor. The printing operation driving motor is intermittently driven every time the reel 116 having a tape-shaped package 112 wound therearound is delivered to the recovered reel storage station 576, whereby the label 650 having predetermined necessary informations printed thereon is projected from the foremost end of the peeling plate 746 in the forward direction.

A label adhering air cylinder 748 is disposed on the casing 730 of the label adhering unit in such a manner that it is located opposite to the label adhering portion 720 on the reel 116 on the recovered reel conveyance table 624 arranged at the recovered reel storage station 576, and a label suction pad 752 for holding the label 650 projected from the foremost end of the peeling plate 746 by the air suction force is attached to the foremost end of a piston rod 750 of the label adhering air cylinder 748. The piston rod 750 of the label adhering air cylinder 748 is reciprocably displaced between the peeling plate 746 and the label adhering portion 720 on the reel 116 placed on the recovered reel conveying table 624 of the recovered reel storage station 576 in the upward/downward direction so that each label 650 having predetermined desired informations printed thereon is caused to adhere to the label adhering portion 720 on the reel 116.

While the tape-shaped package 112 is wound around the reel 116 by actuating the tape winding unit, the label suction pad 752 is held in the standby position sideward of the peeling plate 746. Before the reel 116 on the recovered reel conveying table 624 is conveyed to the recovered reel storage station 576 by actuating the rodless cylinder 628, the printing operation driving motor is intermittently driven, and after necessary bar code informations are printed on a predetermined location on one of the labels 650 adhesively attached to the release liner 736 in the equally spaced relationship by activating the printing head 744, the printing operation driving motor is intermittently driven so as to allow the label 650 having bar code informations printed thereon to be peeled away from the peeling plate 746.

The label 650 peeled away from the release liner 736 is sucked to the label suction pad 752 held in the standby position. When the reel 116 is conveyed to the recovered reel storage station 576, the piston rod 750 of the label adhering air cylinder 748 is expanded from the standby position in the downward direction, causing the label 650 to be thrusted against the label adhering portion 720 formed on one of the flange portions 456 of the reel 116 placed on the recovered reel conveyance table 624. Subsequently, when a suction operation performed by the label suction pad 752 is stopped and the piston rod 750 of the label adhering air cylinder 748 is then restored to the original standby position, the adhesion of each label 650 to the label adhering portion 720 on the reel 116 is completed.

Thereafter, the reel retainer 640 is projected between the standby position of the reel receiving/delivering unit 144 and the recovered reel storage station 576, and subsequently, the recovered reel conveyance table 624 is returned to the reel receiving/delivering unit 144.

While the present invention has been described above with respect to two preferred embodiments thereof, it should of course be understood that the present invention should not be limited only to these embodiments but various change or modification may be made without any departure away from the scope of the present invention as defined by the appended claims.

What is claimed is:

1. A tape winding apparatus for winding a tape-shaped package around a reel, said tape-shaped package including carrier tape having a plurality of pocket portions capable of receiving objects therein, the pocket portions being equally spaced in a longitudinal direction of said tape-shaped package, and cover tape covering said pocket portions, said tape winding apparatus comprising:

a reel driving shaft for driving said reel to wind said tape-shaped package on said reel;

a pair of pinch rollers to deliver said tape-shaped package toward said reel;

means, disposed between said pair of pinch rollers and said reel driving shaft, for guiding said cover tape, said guiding means including means for applying suction to said cover tape;

a carrier tape cutter disposed downstream from said guiding means to separate said cover tape from said carrier tape, said carrier tape cutter being reciprocably movable toward and away from said tape-shaped package;

a tape-shaped package cutter disposed opposite to said carrier tape cutter to allow passage of said tape-shaped package in a space therebetween, said tape-shaped package cutter being reciprocably movable toward and away from said tape-shaped package;

a movable guide disposed adjacent to said carrier tape cutter, said movable guide directing said carrier tape toward said tape-shaped package cutter;

a movably mounted cutter receiver movable into or out of said space between said carrier tape cutter and said tape-shaped package cutter; and means for causing, said cutter receiver to be inserted between said carrier tape and said cover tape when said carrier tape cutter cuts said carrier tape, and for causing said cutter receiver to receive said tape-shaped package cutter and said tape shaped package when said tape-shaped package cutter cuts said tape-shaped package.

2. The tape winding apparatus of claim 1, wherein the cutter receiver is movable from a first position to a second position between said carrier tape cutter and said tape-shaped package cutter.

3. A tape winding apparatus for winding a tape-shaped package around a reel, said tape-shaped package including carrier tape having a plurality of pocket portions capable of receiving objects therein, the pocket portions being equally spaced in a longitudinal direction of said tape-shaped package, and cover tape covering said pocket portions, said tape winding apparatus comprising:

a reel driving shaft for driving said reel to wind said tape-shaped package on said reel;

a pair of pinch rollers to deliver said tape-shaped package toward said reel;

means, disposed between said pair of pinch rollers and said reel driving shaft, for guiding said cover tape, said guiding means including means for applying suction to said cover tape;

a carrier tape cutter disposed downstream from said guiding means to separate the cover tape from the carrier tape, said carrier tape cutter being reciprocably movable toward and away from said tape-shaped package;

a cover tape cutter disposed opposite to said carrier tape cutter to allow passage of said tape-shaped package in a space therebetween, said cover tape cutter being reciprocably movable toward and away from said tape-shaped package;

a movably mounted cutter receiver movable into or out of said space between said carrier tape cutter and said cover tape cutter; and means for causing said cutter receiver to be inserted between said carrier tape and said cover tape when said carrier tape cutter cuts said carrier tape or when said cover tape cutter cuts said cover tape.

4. The tape winding apparatus of claim 3, wherein the cutter receiver is movable from a first position to a second position between said carrier tape cutter and said cover tape cutter.

5. A tape winding apparatus for winding tape having first and second layers onto a take-up reel, comprising:

a tape guide;

a take-up reel drive shaft;

a first cutter between the tape guide and the take-up reel drive shaft, the first cutter being reciprocably movable to cut at least the first layer of the tape;

a second cutter disposed opposite to the first cutter to allow passage of the tape in a space therebetween, the second cutter being reciprocably movable to cut at least the second layer of the tape;

a movably mounted cutter receiver movable into or out of space between the first and second cutters, and means for causing the cutter receiver to be inserted between the first and second layers of the tape when the first cutter cuts the first layer of the tape or when the second cutter cuts the second layer of the tape.

6. The tape winding apparatus of claim 5, further comprising means, disposed between said tape guide and said take-up reel drive shaft, for guiding passage of the second layer of the tape to the take-up reel, said guiding means including means for applying suction to the second layer of the tape.

7. The tape winding apparatus of claim 5, further comprising a movable guide adjacent to the first cutter, the movable guide directing at least the first layer of the tape toward the second cutter.

8. The tape winding apparatus of claim 5, wherein the cutter receiver is movable from a first position to a second position between said first cutter and said second cutter.

* * * * *